(12) United States Patent
Ryu et al.

(10) Patent No.: US 10,714,478 B2
(45) Date of Patent: *Jul. 14, 2020

(54) SEMICONDUCTOR DEVICES WITH PERIPHERAL GATE STRUCTURES

(71) Applicant: SAMSUNG ELECTRONICS CO., LTD., Suwon-si, Gyeonggi-do (KR)

(72) Inventors: Ho-In Ryu, Suwon-si (KR); Taiheui Cho, Suwon-si (KR); Keunnam Kim, Suwon-si (KR); Kyehee Yeom, Suwon-si (KR); Junghwan Park, Seoul (KR); Hyeon-Woo Jang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/532,857

(22) Filed: Aug. 6, 2019

(65) Prior Publication Data

US 2019/0363088 A1 Nov. 28, 2019

Related U.S. Application Data

(60) Continuation of application No. 14/932,245, filed on Nov. 4, 2015, now abandoned, which is a division of (Continued)

(30) Foreign Application Priority Data

Nov. 13, 2012 (KR) .......................... 10-2012-0128224

(51) Int. Cl.
*H01L 27/105* (2006.01)
*H01L 27/108* (2006.01)
(Continued)

(52) U.S. Cl.
CPC .... *H01L 27/1052* (2013.01); *H01L 27/10876* (2013.01); *H01L 27/10894* (2013.01); *H01L 29/42336* (2013.01); *H01L 21/76829* (2013.01)

(58) Field of Classification Search
CPC ................................................. H01L 27/1052
See application file for complete search history.

(56) References Cited

U.S. PATENT DOCUMENTS

| 7,034,408 B1 | 4/2006 | Schloesser |
| 7,928,504 B2 | 4/2011 | Choi |
| (Continued) | | |

FOREIGN PATENT DOCUMENTS

| CN | 101393917 A | 3/2009 |
| KR | 10-2011-0003039 A | 1/2011 |
| (Continued) | | |

*Primary Examiner* — Lex H Malsawma
*Assistant Examiner* — Laura M Dykes
(74) *Attorney, Agent, or Firm* — Lee IP Law, P.C.

(57) ABSTRACT

A semiconductor device includes a substrate including a cell region and a peripheral region, a cell gate electrode buried in a groove crossing a cell active portion of the cell region, a cell line pattern crossing over the cell gate electrode, the cell line pattern being connected to a first source/drain region in the cell active portion at a side of the cell gate electrode, a peripheral gate pattern crossing over a peripheral active portion of the peripheral region, a planarized interlayer insulating layer on the substrate around the peripheral gate pattern, and a capping insulating layer on the planarized interlayer insulating layer and a top surface of the peripheral gate pattern, the capping insulating layer including an insulating material having an etch selectivity with respect to the planarized interlayer insulating layer.

26 Claims, 41 Drawing Sheets

Related U.S. Application Data application No. 14/072,925, filed on Nov. 6, 2013, now Pat. No. 9,184,168.

(51) Int. Cl.
*H01L 29/423* (2006.01)
*H01L 21/768* (2006.01)

(56) References Cited

U.S. PATENT DOCUMENTS

| | | | |
|---|---|---|---|
| 8,298,893 B2 | 10/2012 | Kim | |
| 2002/0079596 A1* | 6/2002 | Terauchi | H01L 21/76819 257/640 |
| 2004/0121548 A1 | 6/2004 | Fishburn et al. | |
| 2004/0183199 A1* | 9/2004 | Qiao | H01L 21/31116 257/758 |
| 2004/0211981 A1* | 10/2004 | Terauchi | H01L 27/115 257/202 |
| 2004/0253811 A1 | 12/2004 | Lee et al. | |
| 2008/0044989 A1 | 2/2008 | Oh et al. | |
| 2008/0102578 A1 | 5/2008 | Schloesser | |
| 2008/0197393 A1* | 8/2008 | Kim | H01L 27/0207 257/298 |
| 2008/0284029 A1* | 11/2008 | Kim | H01L 21/76829 257/758 |
| 2009/0072289 A1 | 3/2009 | Kim et al. | |
| 2010/0193880 A1 | 8/2010 | Yoshida et al. | |
| 2010/0264519 A1 | 10/2010 | Davis et al. | |
| 2011/0175229 A1 | 7/2011 | Kim et al. | |
| 2012/0001272 A1 | 1/2012 | Jang et al. | |
| 2012/0012911 A1 | 1/2012 | Jeong | |
| 2013/0049123 A1 | 2/2013 | Baars et al. | |

FOREIGN PATENT DOCUMENTS

| | | |
|---|---|---|
| KR | 10-2011-0101923 A | 9/2011 |
| KR | 10-2012-0012222 A | 2/2012 |
| KR | 10-1156060 B1 | 6/2012 |

* cited by examiner

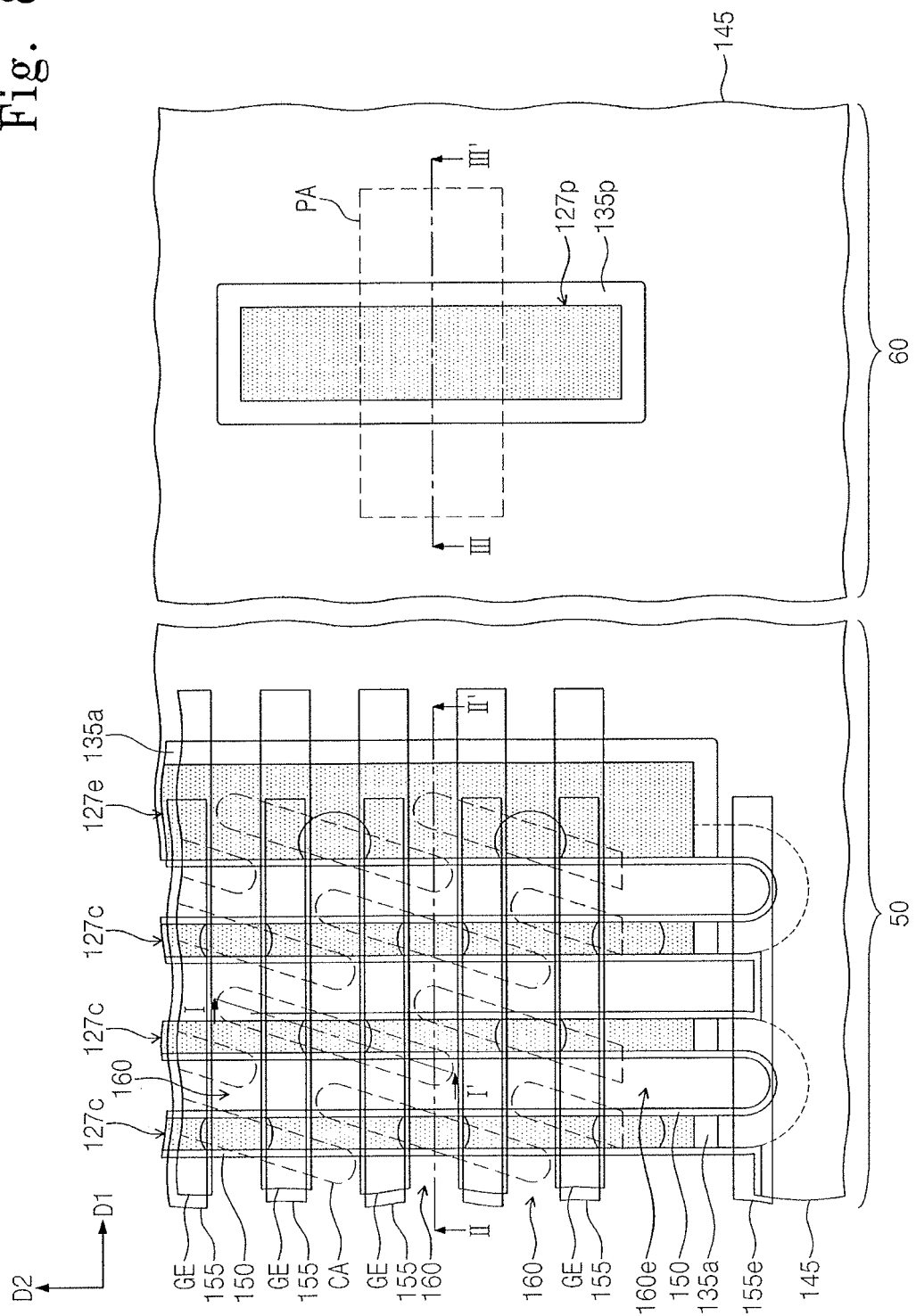

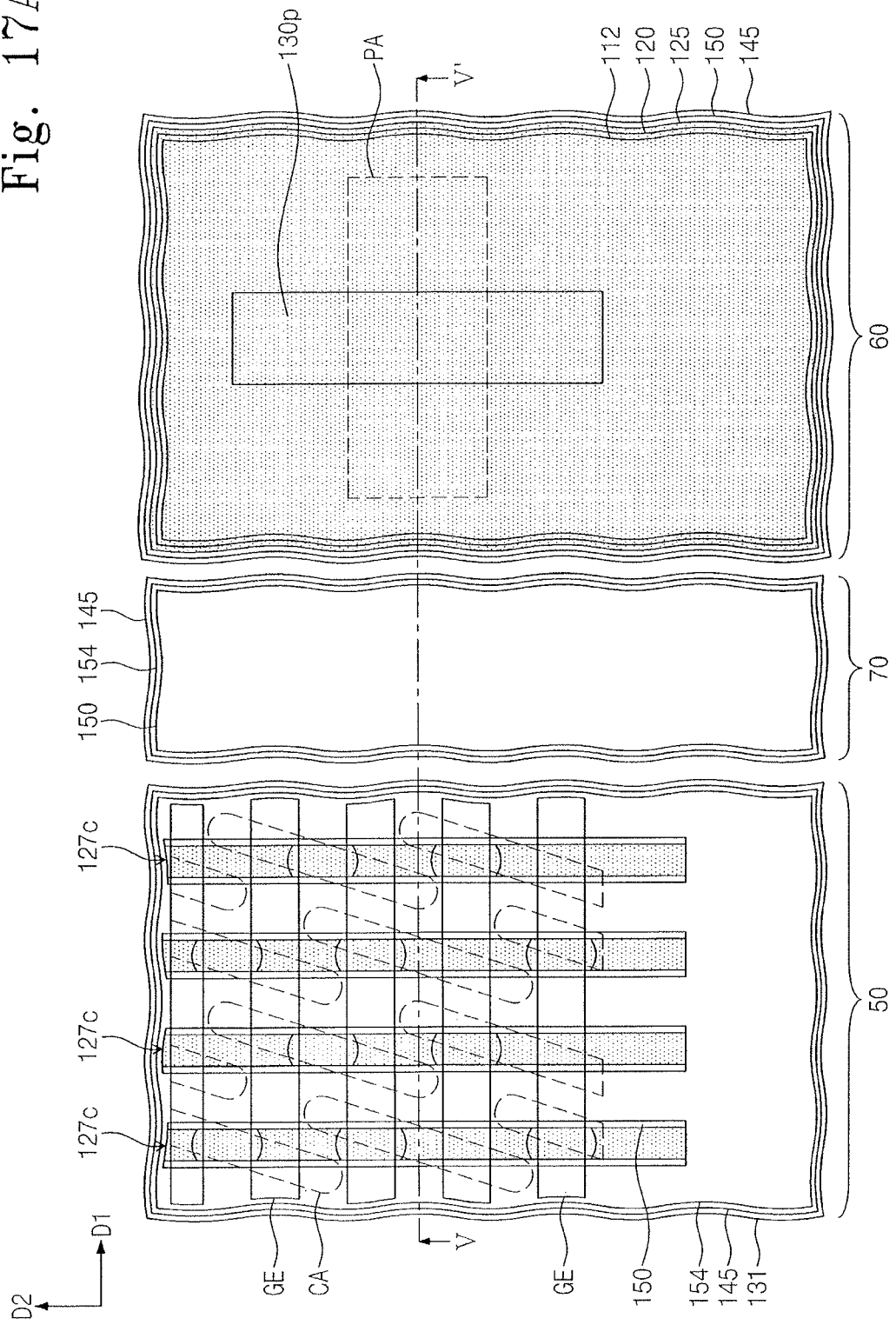

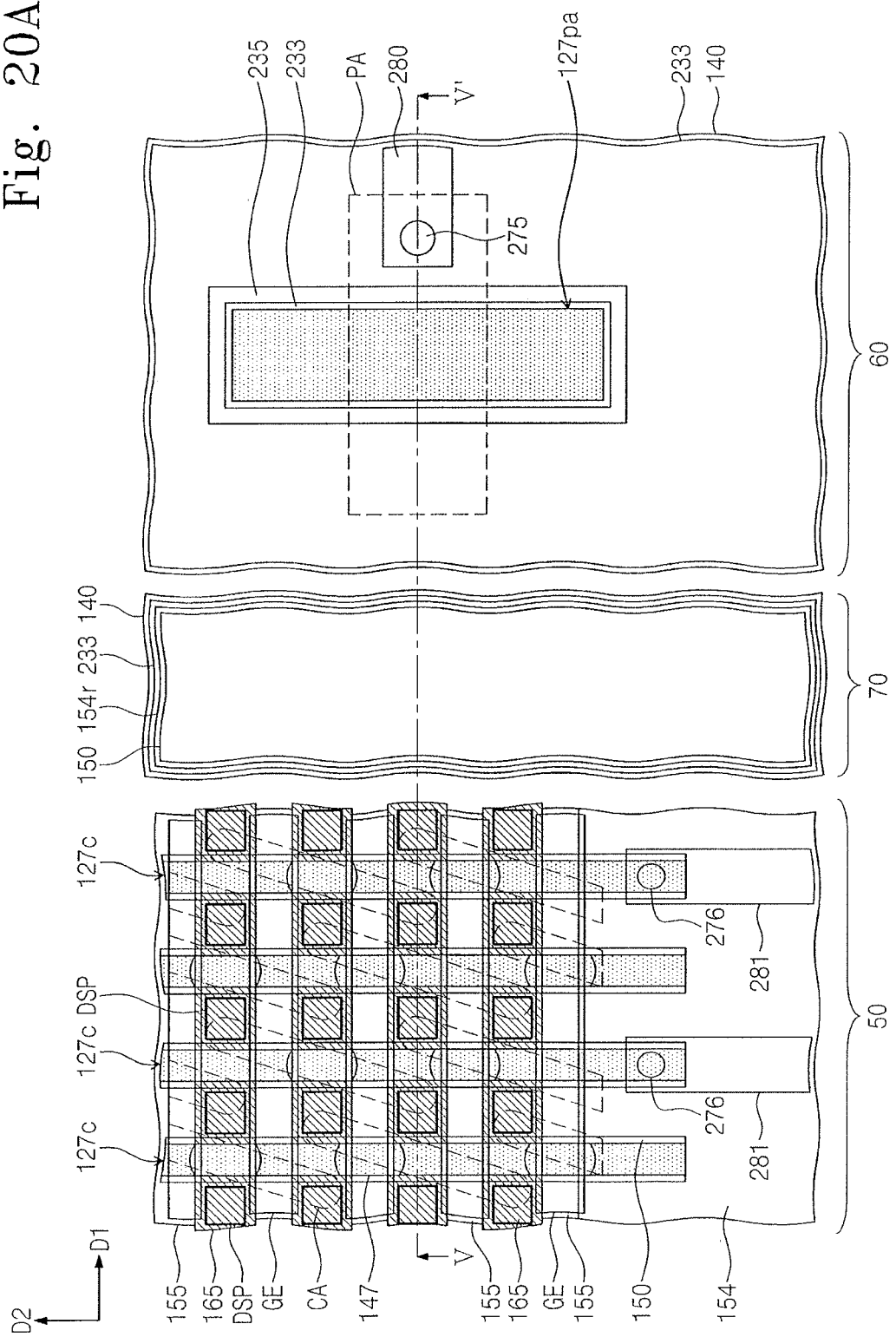

SEMICONDUCTOR DEVICES WITH PERIPHERAL GATE STRUCTURES

CROSS-REFERENCE TO RELATED APPLICATIONS

This is a continuation application based on application Ser. No. 14/932,245, filed Nov. 4, 2015, which in turn is a divisional application based on application Ser. No. 14/072,925, filed Nov. 6, 2013, now U.S. Pat. No. 9,184,168, issued Nov. 10, 2015, the entire contents of both being hereby incorporated by reference.

The present application claims priority under 35 U.S.C. § 119 to Korean Patent Application No. 10-2012-0128224, filed on Nov. 13, 2012, in the Korean Intellectual Property Office, and entitled: "Semiconductor Devices and Methods of Manufacturing the Same," which is incorporated by reference herein in its entirety.

BACKGROUND

1. Field

Example embodiments relate to semiconductor devices and methods of manufacturing the same.

2. Description of the Related Art

Semiconductor devices are attractive in the electronic industry because of their small size, multi-function, and/or low manufacturing costs. The semiconductor devices may be categorized as any one of a semiconductor memory device storing logic data, a semiconductor logic device processing operations of the logical data, and a system-on-chip (SoC) having both the function of the semiconductor memory devices and the function of the semiconductor logic devices. The semiconductor devices have been highly integrated with the development of the electronic industry.

SUMMARY

Embodiments provide semiconductor devices having excellent reliability and methods of manufacturing the same.

Embodiments also provide semiconductor devices capable of simplifying a manufacturing process and methods of manufacturing the same.

In one aspect, a semiconductor device may include a substrate including a cell region and a peripheral region, a cell gate electrode buried in a groove crossing a cell active portion of the cell region, a cell line pattern crossing over the cell gate electrode, the cell line pattern connected to a first source/drain region formed in the cell active portion at a side of the cell gate electrode, a peripheral gate pattern crossing over a peripheral active portion of the peripheral region, a planarized interlayer insulating layer disposed on the substrate around the peripheral gate pattern, and a capping insulating layer disposed on the planarized interlayer insulating layer and a top surface of the peripheral gate pattern, the capping insulating layer including an insulating material having an etch selectivity with respect to the planarized interlayer insulating layer.

In an embodiment, the semiconductor device may further include: a capping line pattern disposed on a top surface of the cell line pattern. A width of a bottom surface of the capping line pattern may be substantially equal to a width of the top surface of the cell line pattern, and the capping line pattern may be formed of the same material as the capping insulating layer of the peripheral region.

In an embodiment, the bottom surface of the capping line pattern may be disposed at substantially the same level as or a higher level than a bottom surface of the capping insulating layer in the peripheral region.

In an embodiment, the planarized interlayer insulating layer may not cover the top surface of the peripheral gate pattern, and the capping insulating layer may be in contact with the planarized interlayer insulating layer.

In an embodiment, the semiconductor device may further include: a peripheral gate spacer disposed between a sidewall of the peripheral gate pattern and the planarized interlayer insulating layer, an outermost cell line pattern disposed on the substrate at a side of the cell line pattern, the outermost cell line pattern including an inner sidewall and an outer sidewall opposite to each other, and a spacer disposed on the outer sidewall of the outermost cell line pattern, the spacer formed of the same material as the peripheral gate spacer.

In an embodiment, the planarized interlayer insulating layer may laterally extend to be adjacent to the spacer, the capping insulating layer may laterally extend to cover a top surface of the outermost cell line pattern, and the extending portion of the capping insulating layer may have a sidewall aligned with the inner sidewall of the outermost cell line pattern.

In an embodiment, the cell line pattern may include a cell conductive line and a cell hard mask line which are sequentially stacked, and the peripheral gate pattern may include a peripheral gate electrode and a peripheral hard mask pattern which are sequentially stacked. The cell conductive line may include the same conductive material as the peripheral gate electrode, the cell hard mask line may include the same insulating material as the peripheral hard mask pattern, and a top surface of the cell conductive line may be disposed at substantially the same level as a top surface of the peripheral gate electrode.

In an embodiment, the cell conductive line may include: lower conductive patterns arranged in a longitudinal direction of the cell line pattern, a contact part disposed between the lower conductive patterns and connected to the first source/drain region, and an upper conductive pattern disposed on the lower conductive patterns and the contact part and extending in the longitudinal direction of the cell line pattern, and the peripheral gate electrode may include a lower gate and an upper gate which are sequentially stacked. The lower conductive patterns may be formed of the same material as the lower gate, and the upper conductive pattern may be formed of the same material as the upper gate.

In an embodiment, the semiconductor device may further include: a cell insulation liner disposed on both sidewalls of the cell line pattern which extend in a longitudinal direction of the cell line pattern. The cell insulation liner may not be formed on an end-sidewall of the cell line pattern which extends in a direction different from the longitudinal direction of the cell line pattern.

In an embodiment, the semiconductor device may further include: insulating fences crossing the cell line pattern in parallel to each other, a cell contact pillar disposed between the insulating fences and at a side of the cell line pattern, the cell contact pillar connected to a second source/drain region formed in the cell active portion at another side of the cell gate electrode, and a data storage part electrically connected to the cell contact pillar. The cell insulation liner may be disposed between the cell contact pillar and the cell line pattern.

In an embodiment, the semiconductor device may further include: an outermost insulating fence disposed at a side of the insulating fences and extending in parallel to the insulating fences, an interconnection-plug electrically connected to an end portion of the cell line pattern disposed between the outermost insulating fence and the insulating fence adjacent to the outermost insulating fence in plan view, and an interconnection connected to the interconnection-plug.

In another aspect, a semiconductor device may include: a substrate including a cell region, a peripheral region, and a boundary region disposed between the cell and peripheral regions, a cell line pattern disposed on the substrate of the cell region, a cell insulation liner covering both sidewalls of the cell line pattern and extending onto the substrate of the boundary region, a peripheral gate pattern crossing over a peripheral active portion of the peripheral region, a peripheral insulation liner covering a sidewall of the peripheral gate pattern and extending onto the extending portion of the cell insulation liner on the substrate in the boundary region, and a residual insulating layer disposed between the extending portion of the cell insulation liner and the extending portion of the peripheral insulation liner in the boundary region. Each of the cell and peripheral insulation liners may be formed of an insulating material having an etch selectivity with respect to the residual insulating layer.

In still another aspect, a method of manufacturing a semiconductor device may include: preparing a substrate including a cell region and a peripheral region, defining cell active portions in the cell region and a peripheral active portion in the peripheral region, forming cell gate electrodes respectively buried in grooves crossing the cell active portions, forming an insulating layer on the cell active portions and the peripheral active portion, forming a conductive layer on an entire surface of the substrate having the insulating layer, forming a hard mask layer on the conductive layer, forming cell line patterns by performing a cell patterning process on the hard mask layer and the conductive layer in the cell region, and forming a peripheral gate pattern by performing a peripheral patterning process on the hard mask layer and the conductive layer in the peripheral region. After one of the cell and peripheral patterning processes is performed, the other of the cell and peripheral patterning processes may be performed.

In an embodiment, forming the conductive layer may include: forming a lower conductive layer on the entire surface of the substrate having the insulating layer, forming a contact plug successively penetrating the lower conductive layer and the insulating layer in the cell region, the contact plug connected to a first source/drain region formed in each of the cell active portions at a side of the cell gate electrode, and forming an upper conductive layer on the contact plugs and the lower conductive layer.

In an embodiment, the cell patterning process may be performed after the peripheral patterning process is performed.

In an embodiment, before performing the cell patterning process, the method may further include: forming an interlayer insulating layer an entire surface of the substrate having the peripheral gate pattern, and planarizing the interlayer insulating layer to remove the interlayer insulating layer on the hard mask layer in the cell region and to leave the planarized interlayer insulating layer in the peripheral region.

In an embodiment, before performing the cell patterning process, the method may further include: forming a capping insulating layer on the entire surface of the substrate having the planarized interlayer insulating layer.

In an embodiment, performing the cell patterning process may include: successively patterning the capping insulating layer, the hard mask layer, and the conductive layer in the cell region to form the cell line patterns and capping line patterns. The capping line patterns may be disposed on top surfaces of the cell line patterns, respectively, and the capping insulating layer in the peripheral region may remain after the cell patterning process is performed.

In an embodiment, the hard mask layer and the conductive layer in the cell region may be successively patterned to form a plate pattern covering all of the cell active portions when the peripheral patterning process is performed, and the cell patterning process may be performed on the hard mask layer and the conductive layer which are included in the plate pattern.

In an embodiment, the peripheral pattern process may be performed after the cell patterning process is performed.

In yet another aspect, a method of manufacturing a semiconductor device may include: sequentially forming a conductive layer and a hard mask layer on a substrate including a first region and a second region, patterning the hard mask layer and the conductive layer in the first region to form a first pattern, forming a first insulating layer covering the first pattern on an entire surface of the substrate, planarizing the first insulating layer to leave the planarized first insulating layer around the first pattern and to remove the first insulating layer on the hard mask layer in the second region, and after planarizing the first insulating layer, patterning the hard mask layer and the conductive layer in the second region to form a second pattern.

In another aspect, a method of manufacturing a semiconductor device may include defining cell active portions in a cell region of a substrate and a peripheral active portion in a peripheral region of the substrate, forming cell gate electrodes in grooves intersecting the cell active portions, forming an insulating layer on the cell active portions and the peripheral active portion, forming a conductive layer on the insulating layer, forming a hard mask layer on the conductive layer, patterning the hard mask layer and the conductive layer in the cell region, such that cell line patterns are formed in the cell region, and patterning the hard mask layer and the conductive layer in the peripheral region, such that a peripheral gate pattern is formed in the peripheral region, wherein process conditions during patterning in the cell region are independent of process conditions during patterning in the peripheral region.

Patterning of the cell region and patterning of the peripheral region may be not simultaneous.

Patterning of one of the cell region and the peripheral region may begin only after patterning of the other one of the cell region and the peripheral region is completed.

Patterning of the cell and peripheral regions may include patterning the hard mask layer and the conductive layer, a combined profile of the hard mask layer and the conductive layer in each of the cell and peripheral regions being different from each other.

Patterning of the cell region may not overlap in time with patterning of the peripheral region.

BRIEF DESCRIPTION OF THE DRAWINGS

Features will become apparent to those of ordinary skill in the art by describing in detail exemplary embodiments with reference to the attached drawings, in which:

FIGS. 1A to 9A illustrate plan views of a method of manufacturing a semiconductor device according to some embodiments;

FIGS. 1B to 9B illustrate cross-sectional views taken along lines I-I', II-II', and III-III' of FIGS. 1A to 9A, respectively;

FIGS. 14A to 19A illustrate plan views of a method of manufacturing a semiconductor device according to other embodiments;

FIGS. 14B to 19B illustrate cross-sectional views taken along lines V-V' of FIGS. 14A to 19A, respectively;

FIG. 20A illustrates plan view of a semiconductor device according to other embodiments;

DETAILED DESCRIPTION

Figure 1A:
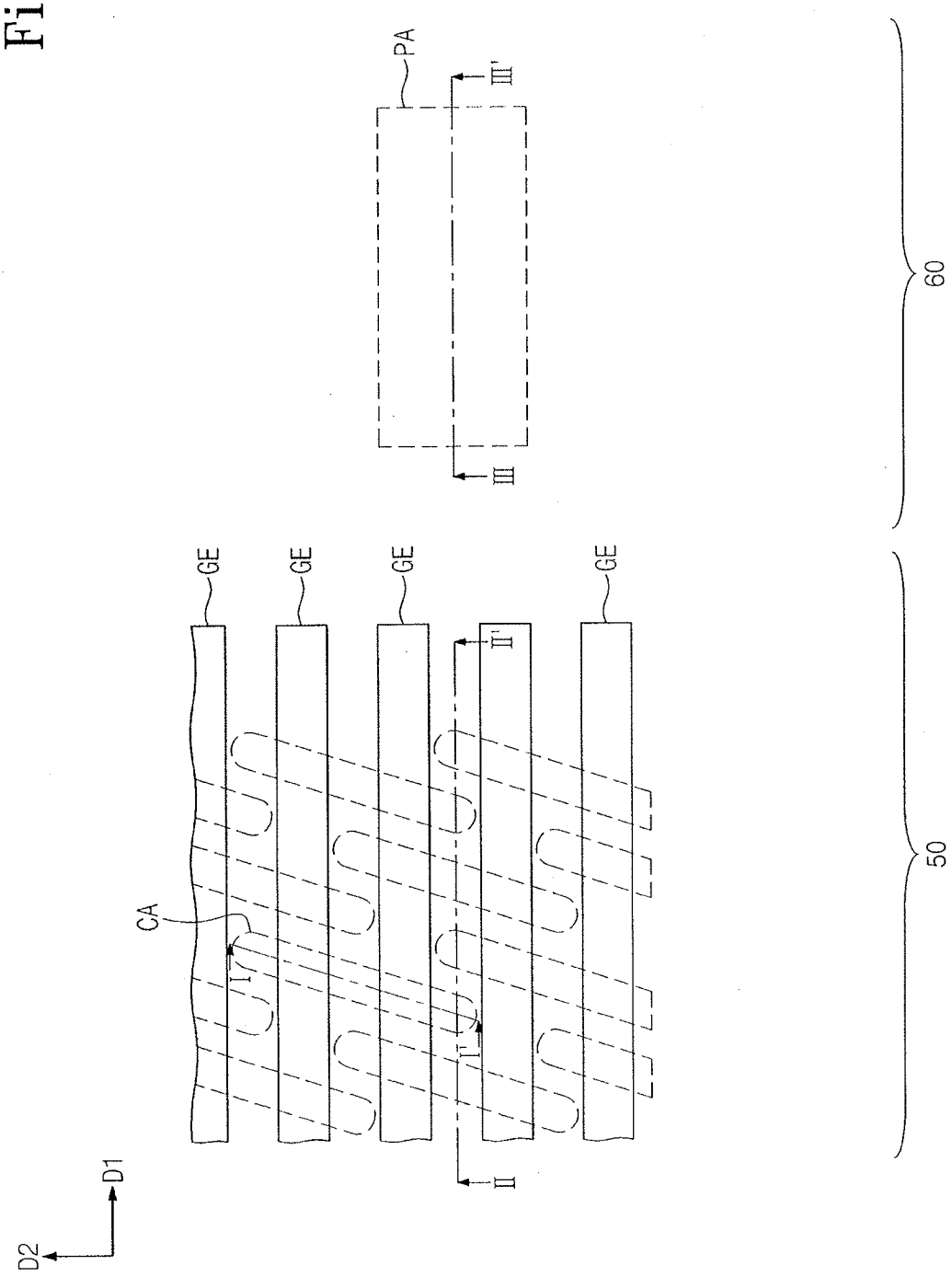

Example embodiments will now be described more fully hereinafter with reference to the accompanying drawings, in which exemplary embodiments are shown. The advantages and features of the example embodiments and methods of achieving them will be apparent from the following exemplary embodiments that will be described in more detail with reference to the accompanying drawings. It should be noted, however, that embodiments are not limited to the following exemplary embodiments, and may be implemented in various forms. Accordingly, the exemplary embodiments are provided only to let those skilled in the art know the category of thereof. In the drawings, embodiments are not limited to the specific examples provided herein and may be exaggerated for clarity.

The terminology used herein is for the purpose of describing particular embodiments only and is not intended to limit. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the example embodiments. Exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

FIGS. 1A to 9A illustrate plan views illustrating a method of manufacturing a semiconductor device according to some embodiments, and FIGS. 1B to 9B are cross-sectional views taken along lines I-I', II-II', and III-III' of FIGS. 1A to 9A, respectively.

Figure 1B:
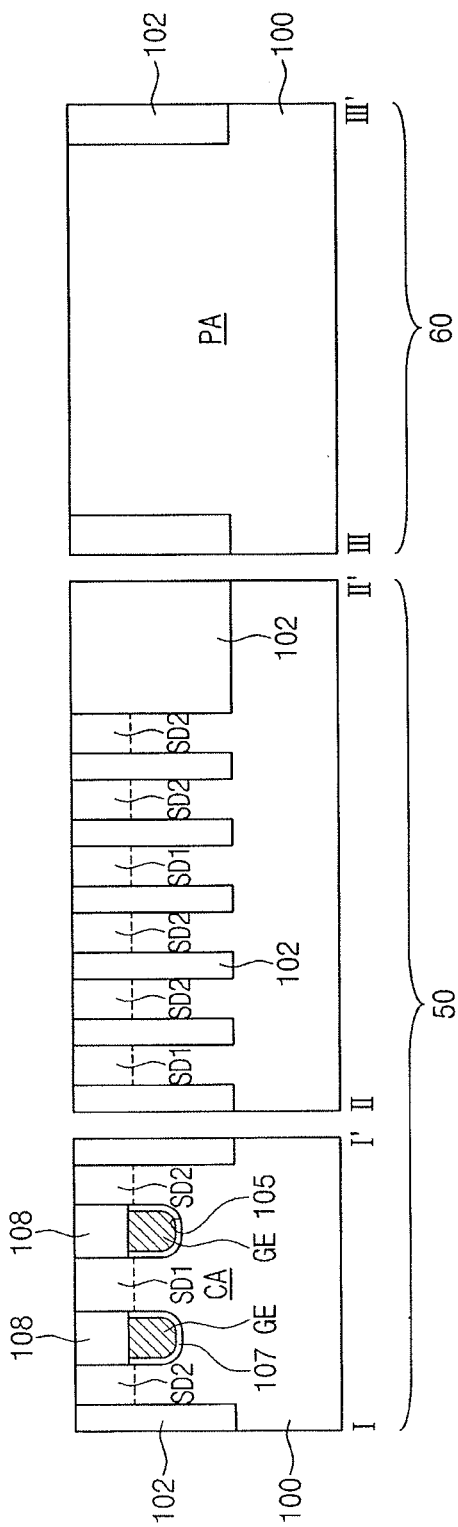

Referring to FIGS. 1A and 1B, a semiconductor substrate 100 (hereinafter, referred to as 'a substrate') is prepared. The substrate 100 may include a cell region 50 and a peripheral region 60. A plurality of semiconductor memory cells may be formed in the cell region 50, and a peripheral transistor constituting a peripheral circuit may be formed in the peripheral region 60. The substrate 100 may be, e.g., a silicon substrate, a germanium substrate, or a silicon-germanium substrate.

A device isolation pattern 102 may be formed on or in the substrate 100 to define cell active portions CA in the cell region 50 and to define a peripheral active portion PA in the peripheral region 60. Each of the cell active portions CA may have an island shape in plan view. Each of the cell active portions CA may correspond to a portion of the substrate 100 which is surrounded by the device isolation pattern 102 in plan view. The device isolation pattern 102 may be formed by a trench isolation technique. The device isolation pattern 102 may include, e.g., an oxide (e.g., silicon oxide), a nitride (e.g., silicon nitride), and/or an oxynitride (e.g., silicon oxynitride).

In an embodiment, the cell active portions CA may be arranged along rows and columns in plan view. The rows may be parallel to a first direction D1 of FIG. 1A. The columns may be parallel to a second direction D2 of FIG. 1B. In an embodiment, the rows may include first, second, and third rows adjacent to each other. Portions of the cell active portions CA in the first row may be disposed between the cell active portions CA in the second row, respectively. Portion of the cell active portions CA in the third row may be disposed between the cell active portions CA in the second row, respectively. The cell active portions CA constituting the first, second, and third rows may be spaced apart from each other. In plan view, each of the cell active portions CA may have a rectangular shape extending in one direction. A long axis of the cell active portion CA may be non-perpendicular and non-parallel to the first direction D1 in plan view.

The cell active portions CA may be doped with dopants of a first conductivity type. The peripheral active portion PA may be doped with dopants of the first conductivity type or dopants of a second conductivity type different from the first conductivity type. One of the first and second conductivity types may be an N-type and the other may be a P-type.

Figure 11A:
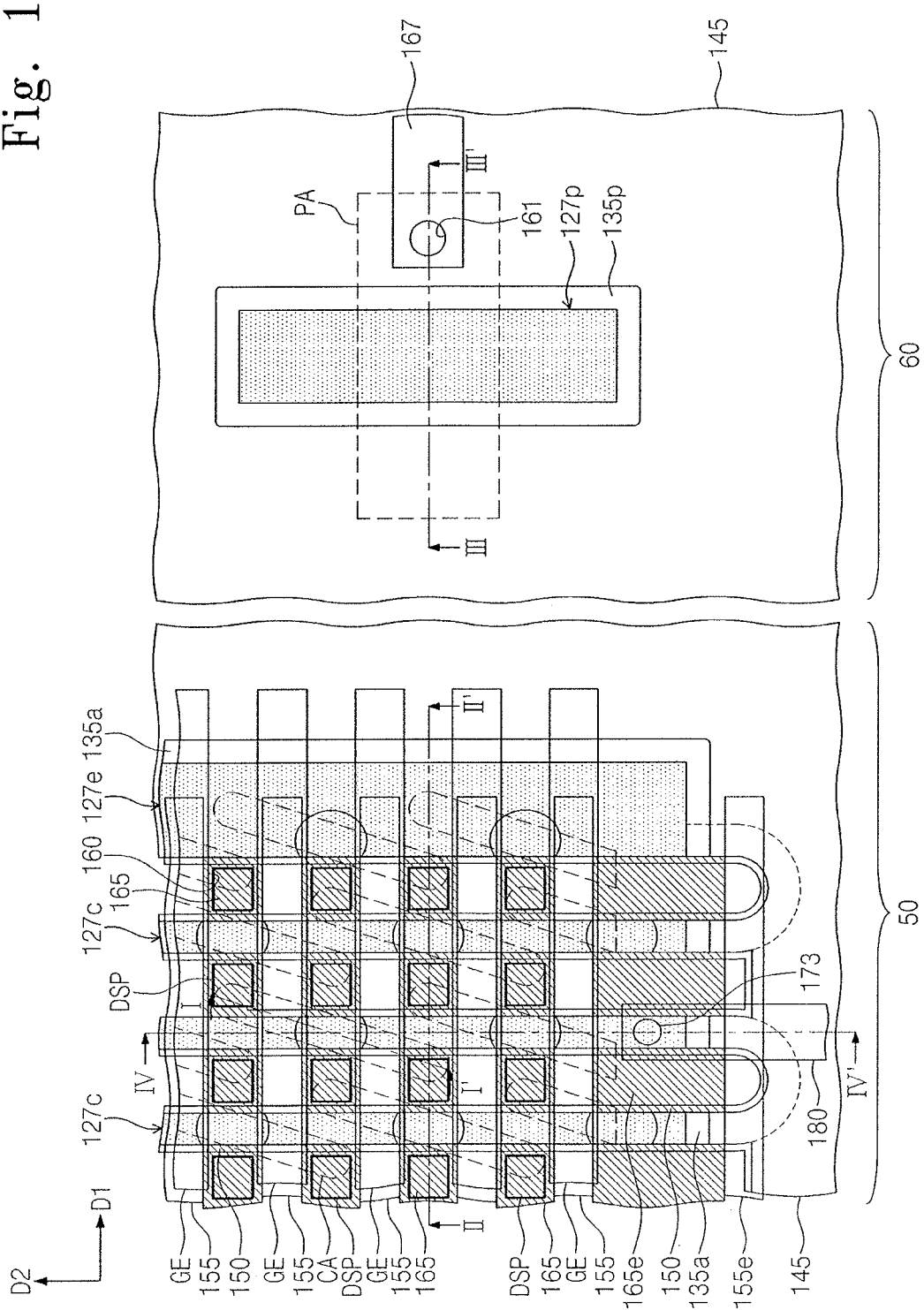
FIG. 11A illustrates plan view of a semiconductor device according to some embodiments.
Figure 11B:
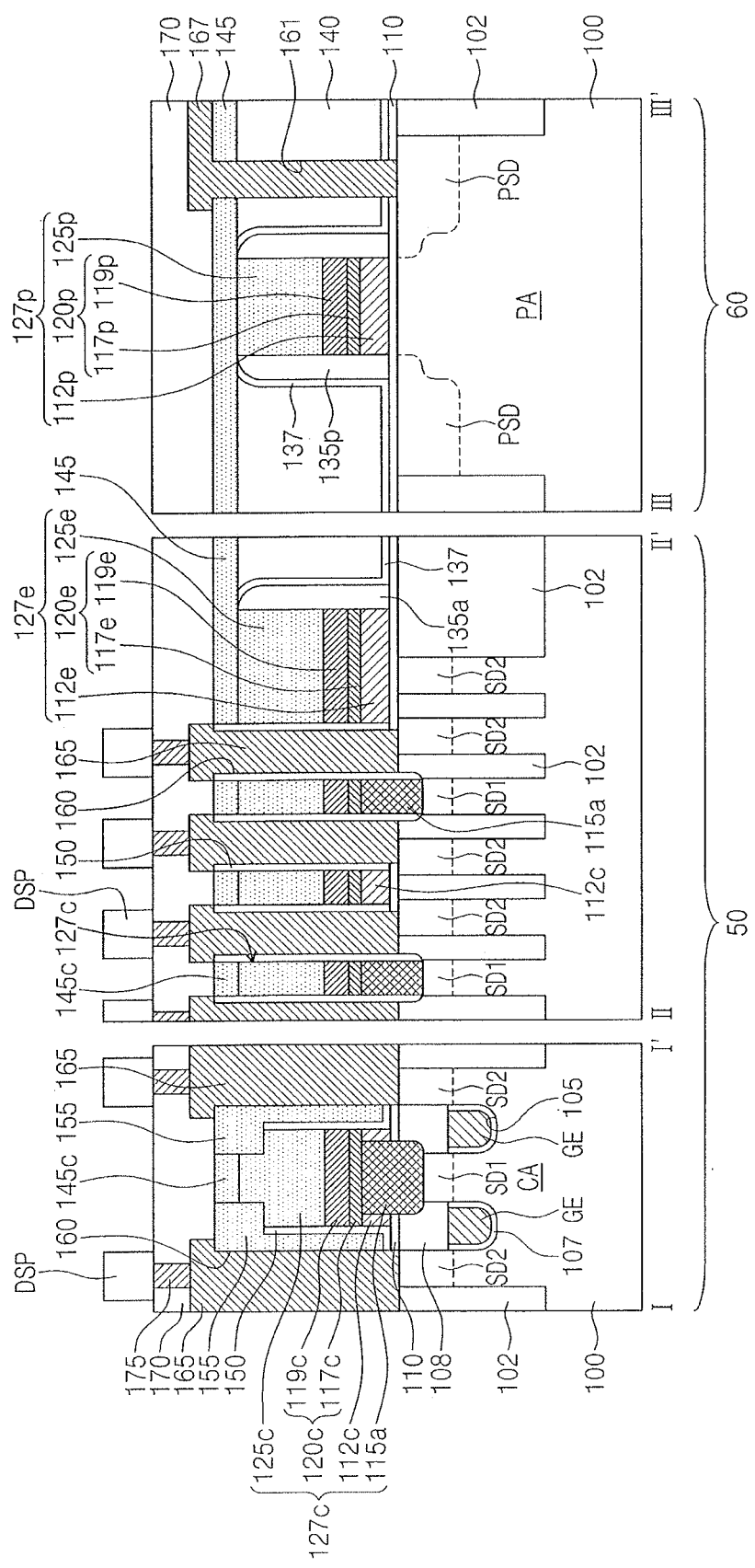
FIG. 11B illustrates a cross-sectional view taken along lines I-I', II-II', and III-III' of FIG. 11A.
Figure 11C:
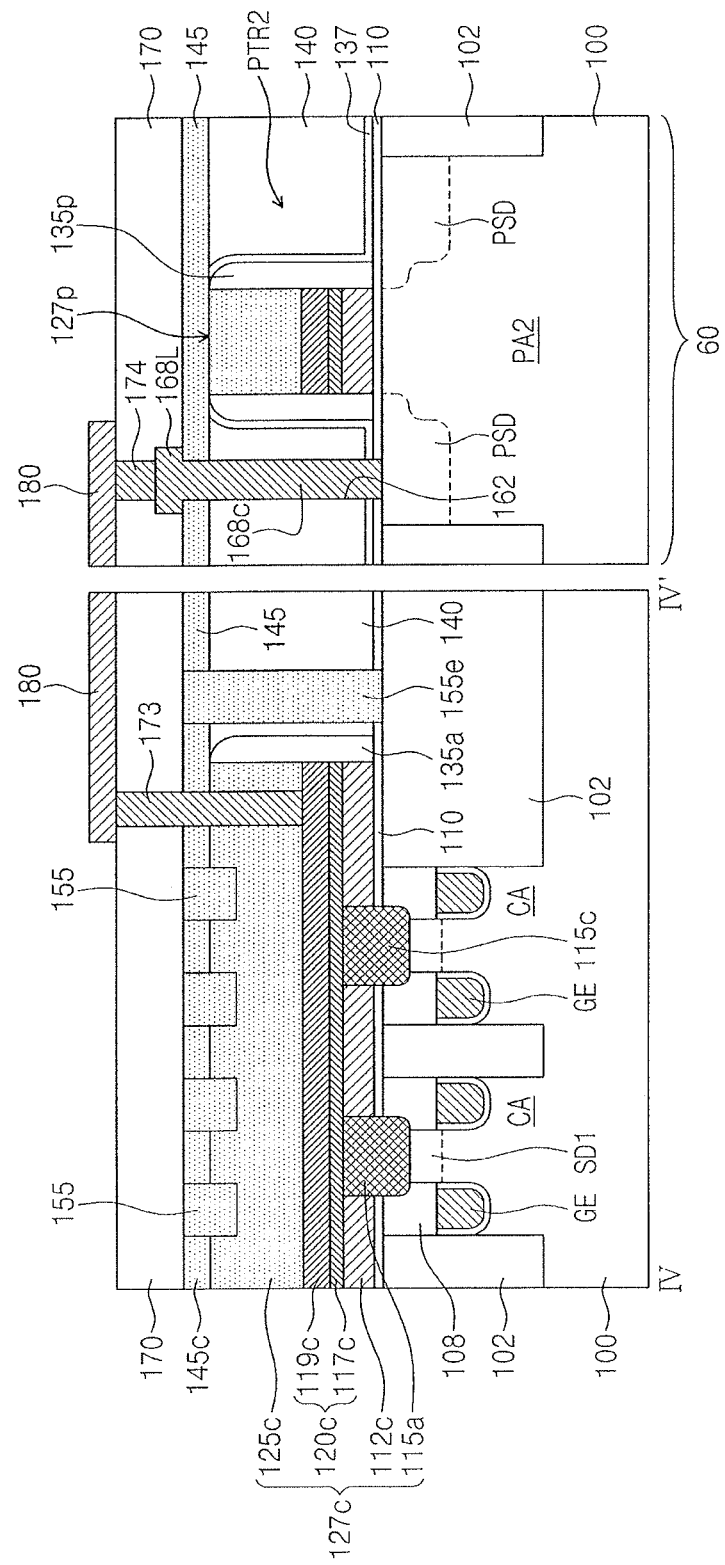
FIG. 11C illustrates a merged view of a cross-sectional view taken along a line IV-IV' of FIG. 11A and a cross-sectional view of a second peripheral transistor electrically connected to a cell conductive line.

Meanwhile, when the peripheral active portion PA is defined, a second peripheral active portion PA2 may be defined in the peripheral region 60 as illustrated in FIG. 11C. The second peripheral active portion PA2 may be laterally spaced apart from the peripheral active portion PA. One of the peripheral transistors constituting the peripheral circuits may be formed on the peripheral active portion PA, and a second peripheral transistor PTR2 electrically connected to a cell conductive line described later may be formed on the second peripheral active portion PA2. For the purpose of ease and convenience in explanation, the second peripheral active portion PA2 is not illustrated in FIG. 1A.

Cell gate electrodes GE may be formed to intersect, e.g., cross, the cell active portions CA in the cell region 50. In an embodiment, grooves 105 may be formed to cross the device isolation pattern 102 and the cell active portions CA in the cell region 50, and the cell gate electrodes GE may be formed to be buried in the grooves 105, respectively. In more detail, after the grooves 105 are formed, a cell gate insulating layer 107 may be formed on inner surfaces of the grooves 105. The cell gate insulating layer 107 may include at least one of, e.g., a thermal oxide layer, a silicon nitride layer, a silicon oxynitride layer, and a high-k dielectric layer. A cell gate conductive layer may be formed on the cell gate insulating layer 107, so as to fill the grooves 105. The cell gate conductive layer may be planarized to form the cell gate electrodes GE in the grooves 105, respectively. Top surfaces of the cell gate electrodes GE may be recessed to be lower than top surfaces of the cell active portions CA at both sides of the grooves 105.

A pair of the grooves 105 may intersect, e.g., cross, each of the cell active portions CA. Thus, a pair of the cell gate electrodes GE may intersect, e.g., cross, each of the cell active portions CA. The cell gate electrodes GE may extend in parallel to each other along the first direction D1. Thus, the long axis of each of the active portions CA may be non-perpendicular and non-parallel to a longitudinal direction of the cell gate electrode GE in plan view. The cell gate electrodes GE may be formed of a conductive material. For example, the cell gate electrodes GE may include at least one of a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide).

A gate-capping layer may be formed to fill the grooves 105 on the cell gate electrodes GE and then the gate-capping layer may be planarized to form cell gate-capping patterns 108 on the cell gate electrodes GE, respectively. The cell gate-capping pattern 108 may be formed in the groove 105. A top surface of the cell gate-capping pattern 108 may be substantially coplanar with the top surface of the cell active portion CA at both sides of the groove 105. The cell gate-capping pattern 108 may be formed of an insulating material (e.g., silicon oxide, silicon nitride, and/or silicon oxynitride).

Dopants of the second conductivity type may be provided using the cell gate-capping patterns 108 as masks into the cell active portions CA. Thus, first and second source/drain regions SD1 and SD2 may be formed in the cell active portions CA. The first source/drain region SD1 may be formed in each of the cell active portions CA between the pair of the cell gate electrodes GE. A pair of the second source/drain regions SD2 may be formed in both edge regions of each of the cell active portions CA, respectively. In plan view, the pair of the cell gate electrodes GE may be disposed between the pair of second source/drain regions SD2.

Each of the cell gate electrodes GE and the first and second source/drain regions SD1 and SD2 adjacent thereto may constitute a cell selection element. In other words, the cell selection element may be a field effect transistor. Thus, a pair of the cell selection elements may be formed in each of the cell active portions CA. Here, the pair of the cell selection elements may share the first source/drain region SD1 in each of the cell active portions CA. Since the cell gate electrode GE is buried in the groove 105, a channel region under the cell gate electrode GE may have a three-dimensional structure. Thus, a channel length of the channel region may increase in a limited planar area. As a result, a short-channel effect may be reduced or minimized.

Figure 2A:
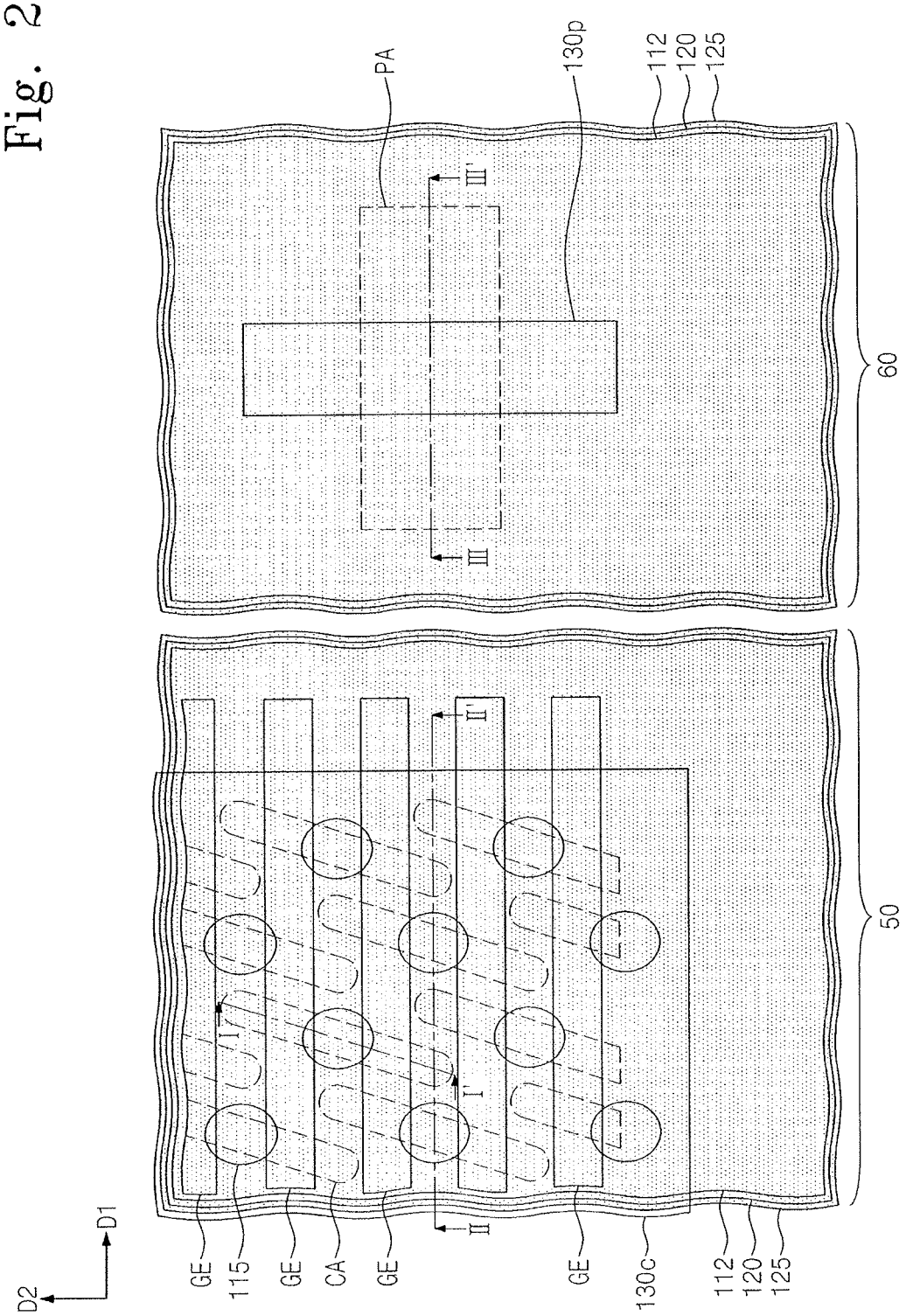
Figure 2B:
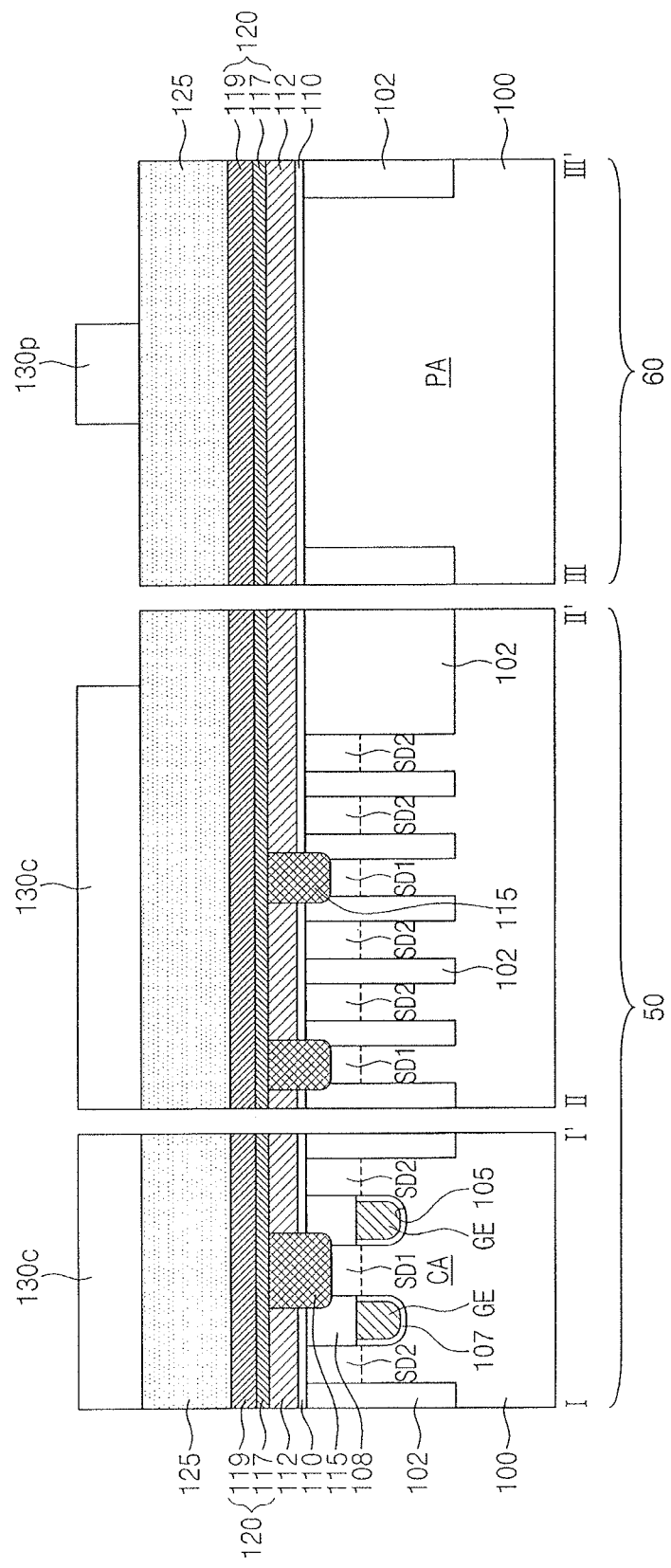

Referring to FIGS. 2A and 2B, an insulating layer 110 may be formed on the cell active portions CA and the peripheral active portion PA. The insulating layer 110 on the peripheral active portion PA may function as a gate insulating layer of the peripheral transistor formed on the peripheral active portion PA. The insulating layer 110 may include, e.g., silicon oxide, silicon nitride, silicon oxynitride, and/or a high-k dielectric (an insulating metal oxide such as hafnium oxide and/or aluminum oxide). The insulating layer 110 may be formed, e.g., by an oxidation process, a nitridation process, and/or a deposition process.

A conductive layer may be formed on the substrate 100 having the insulating layer 110. In an embodiment, portions of the conductive layer in the cell region 50 may penetrate the insulating layer 110 so as to be connected to the first source/drain regions SD1, respectively. The conductive layer may include a lower conductive layer 112, contact plugs 115, and an upper conductive layer 120.

In more detail, the lower conductive layer 112 may be formed on an entire surface of the substrate 100 having the insulating layer 110. For example, the lower conductive layer 112 may be formed of a semiconductor material doped with dopants (e.g., doped silicon). The lower conductive layer 112 in the peripheral region 60 may have a work function of a gate electrode of the peripheral transistor. In an embodiment, the lower conductive layer 112 in the cell region 50 may be doped with dopants of the same conductivity type as the lower conductive layer 112 in the peripheral region 60. In another embodiment, by a selective dopant injection process, the lower conductive layer 112 in the cell region 50 may be doped with dopants of a conductivity type different from that of the dopants in the lower conductive layer 112 in the peripheral region 60. However, embodiments are not limited thereto. In still another embodiment, the lower conductive layer 112 may be formed of another conductive material (e.g., a metal containing material).

The lower conductive layer 112 and the insulating layer 110 in the cell region 50 may be successively patterned to form contact holes exposing the first source/drain regions SD1, respectively. Subsequently, a contact conductive layer may be formed to fill the contact holes and then the conductive layer may be planarized to form the contact plugs 115. The contact plugs 115 are connected to the first source/drain regions SD1, respectively. A sidewall of the contact plug 115 may be in contact with the lower conductive layer 112 constituting a sidewall of the contact hole.

When the contact holes are formed, the first source/drain regions SD1 under the contact holes may be recessed. Thus, bottom surfaces of the contact plugs 115 may be lower than a bottom surface of the insulating layer 110, as illustrated in FIG. 2B. In other words, a height of the contact plug 115 may be greater than a thickness of the lower conductive layer 112.

In an embodiment, the contact conductive layer may be planarized until the lower conductive layer 112 is exposed. Thus, a top surface of the contact plug 115 may be substantially coplanar with a top surface of the lower conductive layer 112. For example, the contact plug 115 may be formed of a semiconductor material doped with dopants (e.g., doped silicon). Alternatively, the contact plug 115 may include a metal containing material.

Subsequently, the upper conductive layer 120 may be formed on the lower conductive layer 112 and the contact plugs 115. The upper conductive layer 120 is connected to the lower conductive layer 112 and the contact plugs 115. The upper conductive layer 120 may include a conductive material having a resistivity lower than that of the lower conductive layer 112. For example, the upper conductive layer 120 may include a metal layer 119 having a low resistivity. For example, the metal layer 119 may include tungsten and/or aluminum. Additionally, the upper conductive layer 120 may further include a conductive barrier layer 117 disposed between the metal layer 119 and the lower conductive layer 112 and between the metal layer 119 and the contact plugs 115. The conductive barrier layer 117 may include a conductive metal nitride (e.g., titanium nitride, tantalum nitride, and/or tungsten nitride). Additionally, the conductive barrier layer 117 may further include a transition metal (e.g., titanium or tantalum).

A hard mask layer 125 may be formed on the conductive layer (i.e., the upper conductive layer 120). The hard mask layer 125 may include an insulating material having an etch selectivity with respect to the conductive layer (i.e., the upper conductive layer 120, the lower conductive layer 112, and the contact plug 115). For example, the hard mask layer 125 may include silicon nitride and/or silicon oxynitride.

A peripheral gate mask pattern 130p defining a peripheral gate pattern may be formed on the hard mask layer 125 in the peripheral region 60. The peripheral gate mask pattern 130p may cross over the peripheral active portion PA. The peripheral gate mask pattern 130p may be formed by a photolithography process. The peripheral gate mask pattern 130p may be formed of a photoresist. When the peripheral gate mask pattern 130p is formed, a plate mask pattern 130c may be formed on the hard mask layer 125 in the cell region 50. The plate mask pattern 130c may cover all of the cell active portions CA in the cell region 50. At this time, the hard mask layer 125 in an edge region of the cell region 50 may be exposed. In an embodiment, the plate mask pattern 130c may not cover end portions of the gate electrodes GE, as illustrated in FIG. 2A. Alternatively, when the peripheral gate mask pattern 130p is formed, a mask pattern may be formed to cover an entire surface of the hard mask layer 125 disposed in the cell region 50. Hereinafter, the plate mask pattern 130c of FIG. 2A will be described as an example. The plate mask pattern 130c may be formed of the same material (e.g., a photoresist) as the peripheral gate mask pattern 130p.

Meanwhile, when peripheral gate mask pattern 130p is formed, a second peripheral gate mask pattern may be further formed to define a gate pattern of the second peripheral transistor PTR2 of FIG. 11C.

Figure 3A:
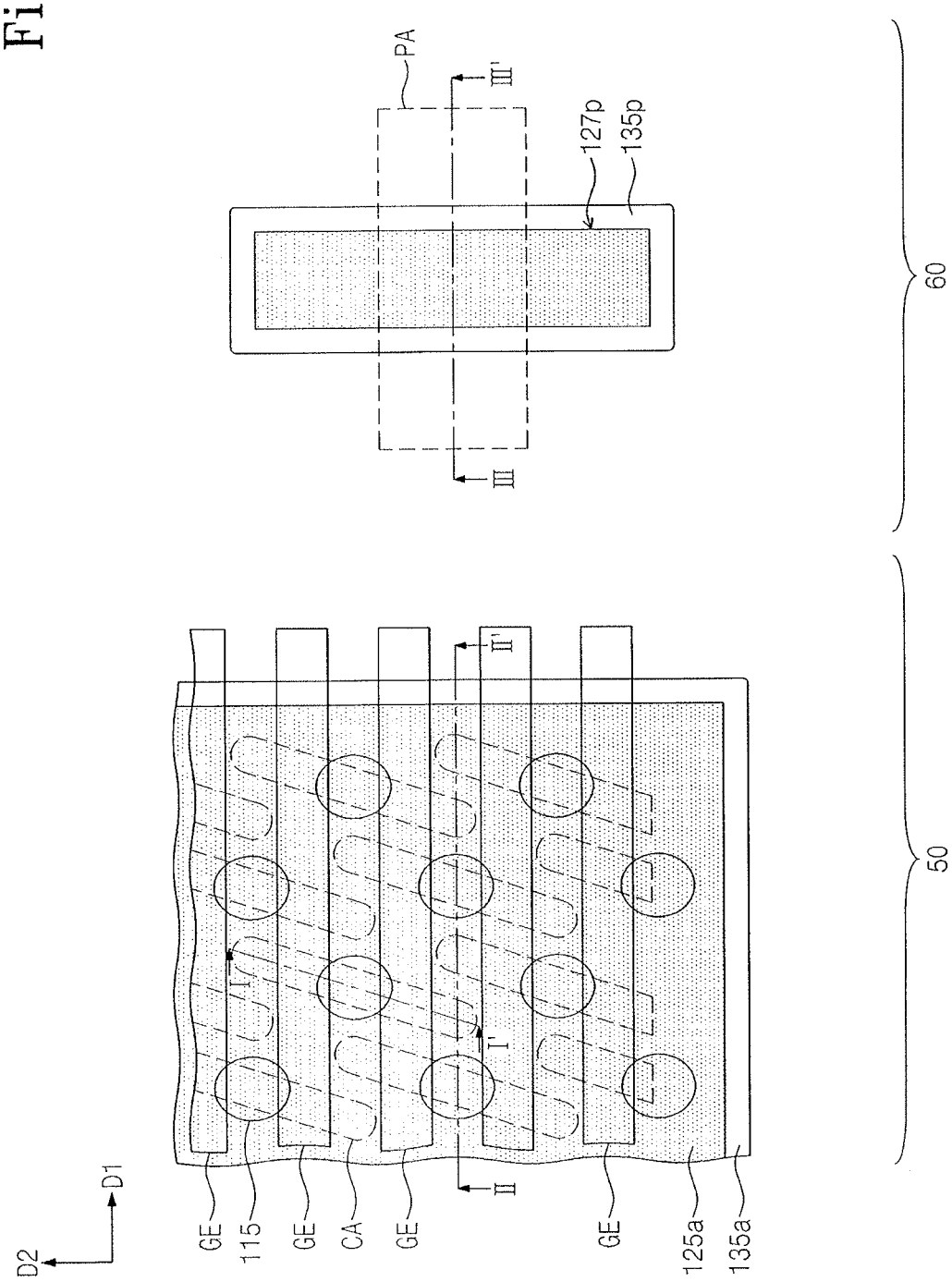
Figure 3B:
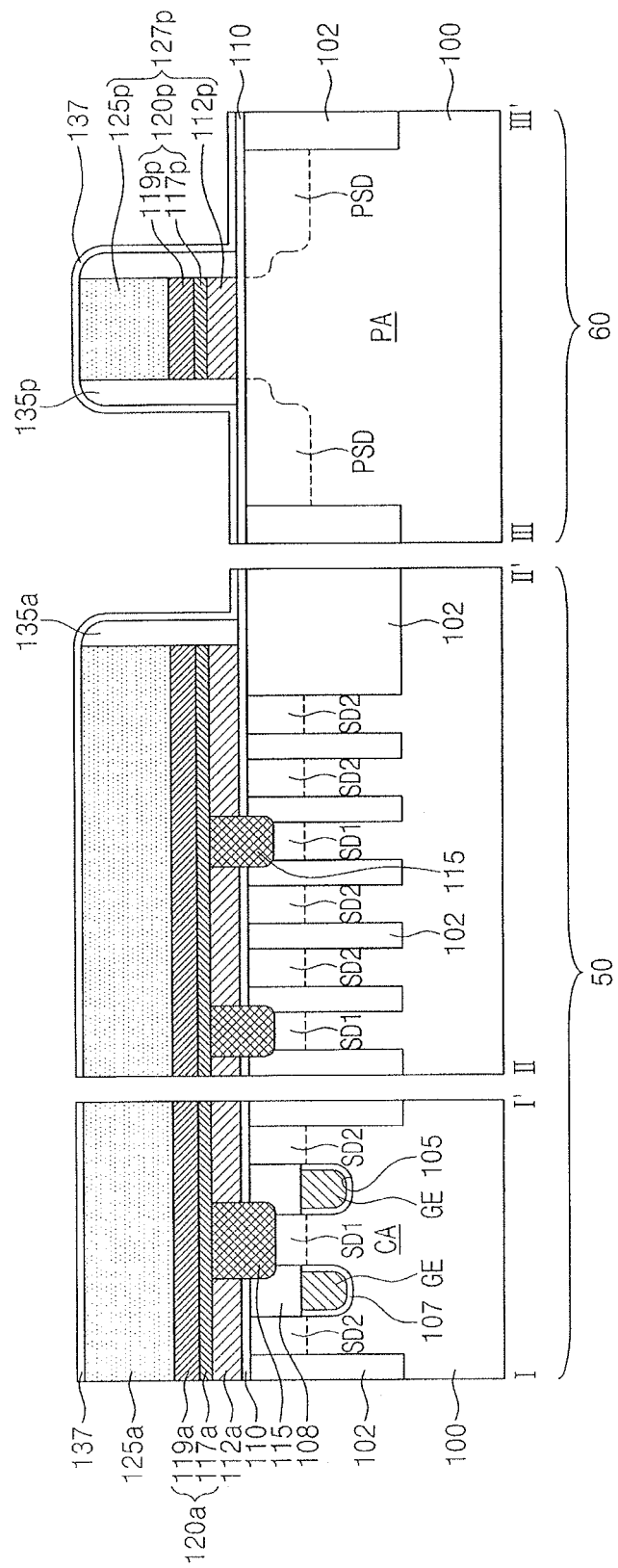

Referring to FIGS. 3A and 3B, a peripheral patterning process using the peripheral gate mask pattern 130p may be performed on the hard mask layer 125 and the conductive layer. Thus, a peripheral gate pattern 127p may be formed in the peripheral region 60. The peripheral gate pattern 127p may include a peripheral gate electrode and a peripheral hard mask pattern 125p that are sequentially stacked. The peripheral gate electrode may include a lower gate 112p and an upper gate 120p that are sequentially stacked. The upper gate 120p may include a peripheral barrier pattern 117p and a peripheral metal pattern 119p that are sequentially stacked. When the peripheral gate pattern 127p is formed on the peripheral active portion PA, a peripheral gate pattern 127p of the second peripheral transistor PTR2 in FIG. 11C may be formed. The peripheral gate pattern 127p of the second peripheral transistor PTR2 may be disposed on the insulating layer 110 on the second peripheral active portion PA2. A stack structure of the peripheral gate pattern 127p of the second peripheral transistor PTR2 may be the same as that of the peripheral gate pattern 127p disposed on the peripheral active portion PA.

When the peripheral patterning process is performed, a plate pattern may be formed in the cell region 50 due to the plate mask pattern 130c. The plate pattern may include a conductive plate pattern and a hard mask plate pattern 125a that are sequentially stacked. The conductive plate pattern may include a lower conductive plate pattern 112a, the contact plugs 115, and an upper conductive plate pattern 120a. The upper conductive plate pattern 120a may include a conductive barrier plate pattern 117a and a metal plate pattern 119a that are sequentially stacked.

The peripheral patterning process will be described in more detail hereinafter. The hard mask layer 125 may be etched using the peripheral gate mask pattern 130p and the plate mask pattern 130c as etch masks, thereby forming the peripheral hard mask pattern 125p and the hard mask plate pattern 125a. The conductive layers 120 and 112 may be etched using the peripheral hard mask pattern 125p and the hard mask plate pattern 125a as etch masks, thereby forming the peripheral gate electrodes 112p and 120p and the conductive plate pattern 112a, 120a, and 115. In an embodiment, before the conductive layers 120 and 112 are etched, the mask patterns 130p and 130c may be removed. In this case, when the conductive layers 120 and 112 are etched, a top end portion of the peripheral hard mask pattern 125p and a top end portion of the hard mask plate pattern 125a may be recessed.

In another embodiment, when the conductive layers 120 and 112 are etched, the mask patterns 130p and 130c may partially remain. In this case, an ashing process may be performed after the conductive layers 120 and 112 are etched.

After the formation of the peripheral gate pattern 127p, dopants may be injected into the peripheral active portion PA at both sides of the peripheral gate pattern 127p to form peripheral source/drain regions PSD. Peripheral source/drain regions PSD of the second peripheral transistor PTR2 of FIG. 11C may be formed simultaneously with the peripheral source/drain regions PSD in the peripheral active portion PA.

A peripheral gate spacer layer may be conformally formed on the substrate 100, and then an etch-back process may be performed on the peripheral gate spacer layer to form a peripheral gate spacer 135p on a sidewall of the peripheral gate pattern 127p. At this time, a spacer 135a may also be formed on a sidewall of the plate pattern in the cell region 50. The spacer 135a in the cell region 50 may be formed of the same material as the peripheral gate spacer 135p. The spacer 135a and the peripheral gate spacer 135p may be formed at the same time. The peripheral gate spacer 135p may include, e.g., silicon oxide, silicon nitride, and/or silicon oxynitride.

As illustrated in FIG. 3B, the peripheral source/drain region PSD may be formed to have a lightly doped drain (LDD) structure or an extension structure by using the peripheral gate spacer 135p.

A peripheral insulation liner 137 may be conformally formed on the substrate 100. The peripheral insulation liner 137 may be formed of an insulating material having an etch selectivity with respect to a planarized interlayer insulating layer 140 formed in a subsequent process. The peripheral insulation liner 137 in the peripheral region 60 will be used as an etch stop layer in a subsequent process for formation of a peripheral contact hole. As illustrated in FIG. 3B, the peripheral insulation liner 137 may be formed after the formation of the peripheral gate spacer 135p. Alternatively, the peripheral insulation liner 137 may be formed before the formation of the peripheral gate spacer 135p.

Figure 4A:
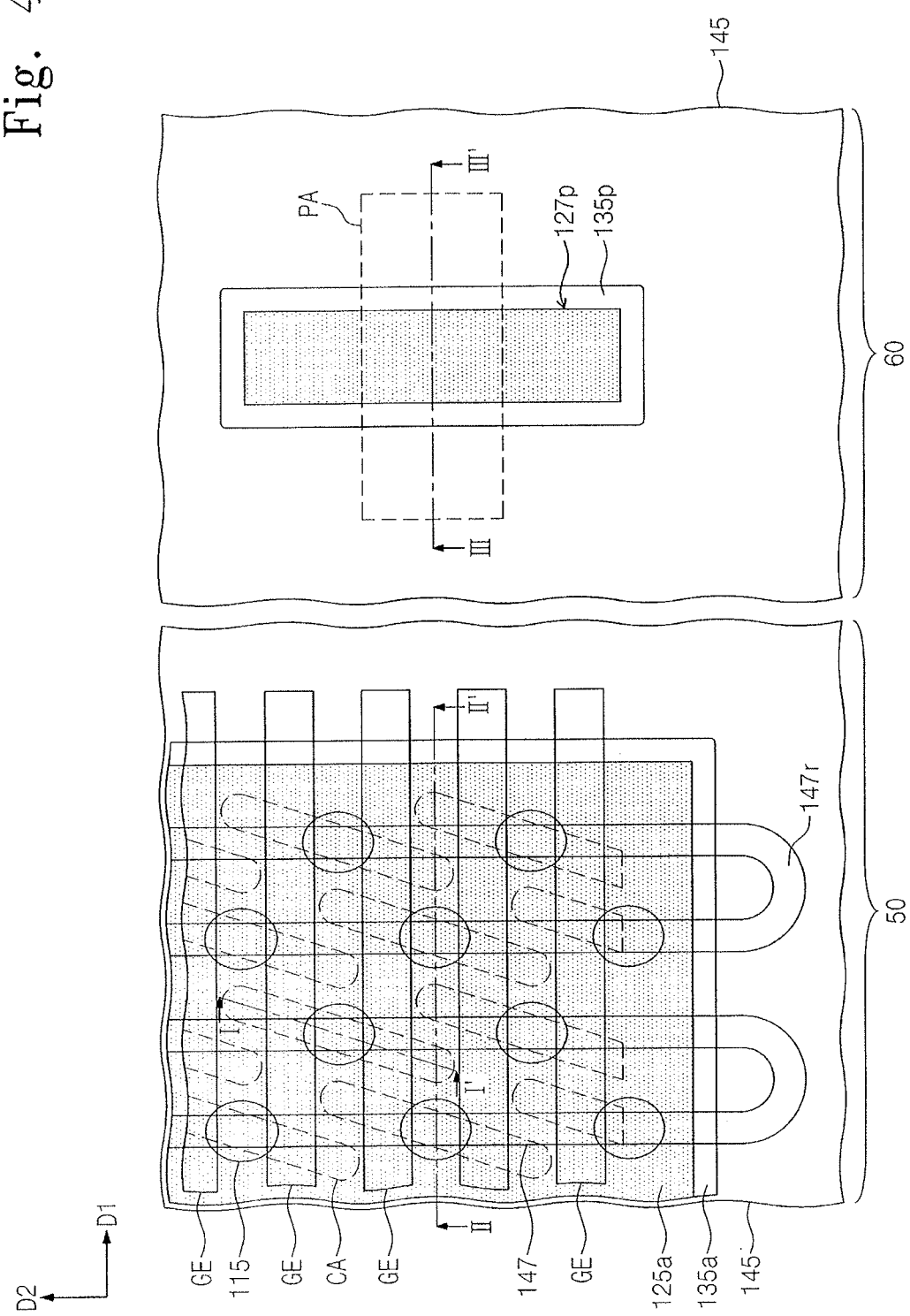
Figure 4B:
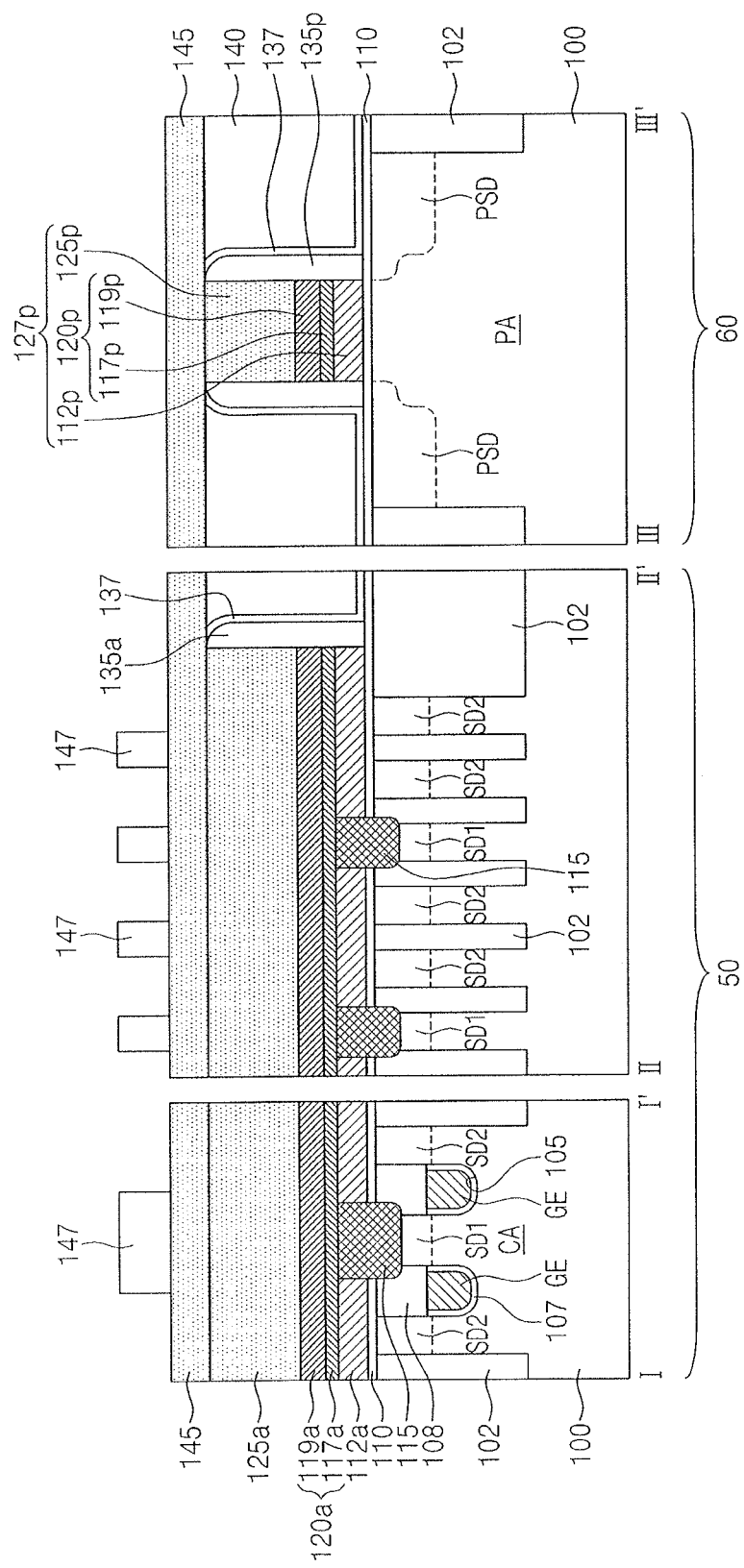

Referring to FIGS. 4A and 4B, subsequently, an interlayer insulating layer may be formed on an entire surface of the substrate 100, and then the interlayer insulating layer may be planarized to form a planarized insulating layer 140. The planarized insulating layer 140 does not cover the top surface of the peripheral gate pattern 127p and the top surface of the hard mask plate pattern 125a. The planarized interlayer insulating layer 140 may be disposed on the substrate 100 around the peripheral gate pattern 127p in the peripheral region 60. Additionally, the planarized interlayer insulating layer 140 may also be disposed on the substrate 100 in the edge region of the cell region 50, so as to be adjacent to the sidewall of the plate pattern.

In detail, as illustrated in FIG. 4B, the interlayer insulating layer may be planarized until the top surface of the peripheral gate pattern 127p is exposed. At this time, the top surface of the hard mask plate pattern 125a may be exposed in the cell region 50. Alternatively, the interlayer insulating layer may be planarized until the peripheral insulation liner 137 disposed on the top surface of the peripheral gate pattern 127p is exposed. If the interlayer insulating layer includes silicon oxide, the peripheral insulation liner 137 may include silicon nitride and/or silicon oxynitride.

Subsequently, a capping insulating layer 145 may be formed on the substrate 100. The capping insulating layer 145 may be formed of an insulating material having an etch selectivity with respect to the planarized interlayer insulating layer 140. For example, the capping insulating layer 145 may include silicon nitride and/or silicon oxynitride.

Cell line mask patterns 147 may be formed on the capping insulating layer 145 in the cell region 50. As illustrated in FIG. 4A, the cell line mask patterns 147 may extend in parallel to each other in the second direction D2, so as to cross over the plate pattern. In an embodiment, the cell line mask patterns 147 may be formed by a double patterning technique.

The double patterning technique will be described in more detail hereinafter. Sacrificial mask patterns (not shown) may be formed in parallel to each other over the plate pattern in the cell region 50. The sacrificial mask patterns may extend in the second direction D2 and may be spaced apart from each other. The sacrificial mask patterns are formed using a photolithography process. End portions of the sacrificial mask patterns may be disposed beyond the top surface of the hard mask plate pattern 125a in the cell region 50 in plan view, so as to be disposed over the planarized interlayer insulating layer 140 adjacent to the hard mask plate pattern 125a. In other words, a length of each of the sacrificial mask patterns may be greater than a width of the plate pattern in the second direction D2 to extend beyond the plate pattern in the second direction D2. The end portion of the sacrificial mask pattern refers to an end portion of the sacrificial pattern in a longitudinal direction of the sacrificial mask pattern.

Subsequently, a cell line mask layer may be conformally formed on the substrate 100. The cell line mask layer may be formed of a material having an etch selectivity with respect to the sacrificial mask pattern. Additionally, the cell line mask layer may be formed of a material having an etch selectivity with respect to the capping insulating layer 145 and the hard mask plate pattern 125a. For example, the sacrificial mask pattern may be formed of poly-silicon or a photoresist, and the cell line mask layer may be formed of an amorphous carbon layer. The cell line mask layer may be anisotropically etched until the sacrificial mask patterns are exposed. Thus, the cell line mask patterns 147 may be formed on sidewalls extending in the second direction D2 of the sacrificial mask patterns. At this time, a connection part 147r may also be formed to surround a sidewall of the end portion of each of the sacrificial mask patterns in plan view. The connection part 147r is a portion of the cell line mask layer. As illustrated in FIG. 4A, both ends of the connection part 147r are connected to end portions of a pair of the cell line mask patterns 147 formed on both sidewalls of each of the sacrificial mask patterns, respectively. Here, the end portion of the cell line mask pattern 147 refers to an end portion of the cell line mask pattern 147 in a longitudinal direction (i.e., the second direction D2) of the cell line mask pattern 147. After the formation of the cell line mask patterns 147 and the connection parts 147r, the exposed sacrificial mask patterns are removed.

As illustrated in FIG. 4A, each of the cell line mask patterns 147 may run over the contact plugs 115 that are arranged in the second direction D2 to constitute a column. In plan view, the connection part 147r may be formed, e.g., only, at edges of the connection part 147r, i.e., outside the top surface of the hard mask plate pattern 125a. In other words, the connection part 147r may be disposed over the planarized interlayer insulating layer 140 adjacent to the hard mask plate pattern 125a in the cell region 50, e.g., so the connection part 147r may not overlap the hard mask plate pattern 125a.

Figure 5A:
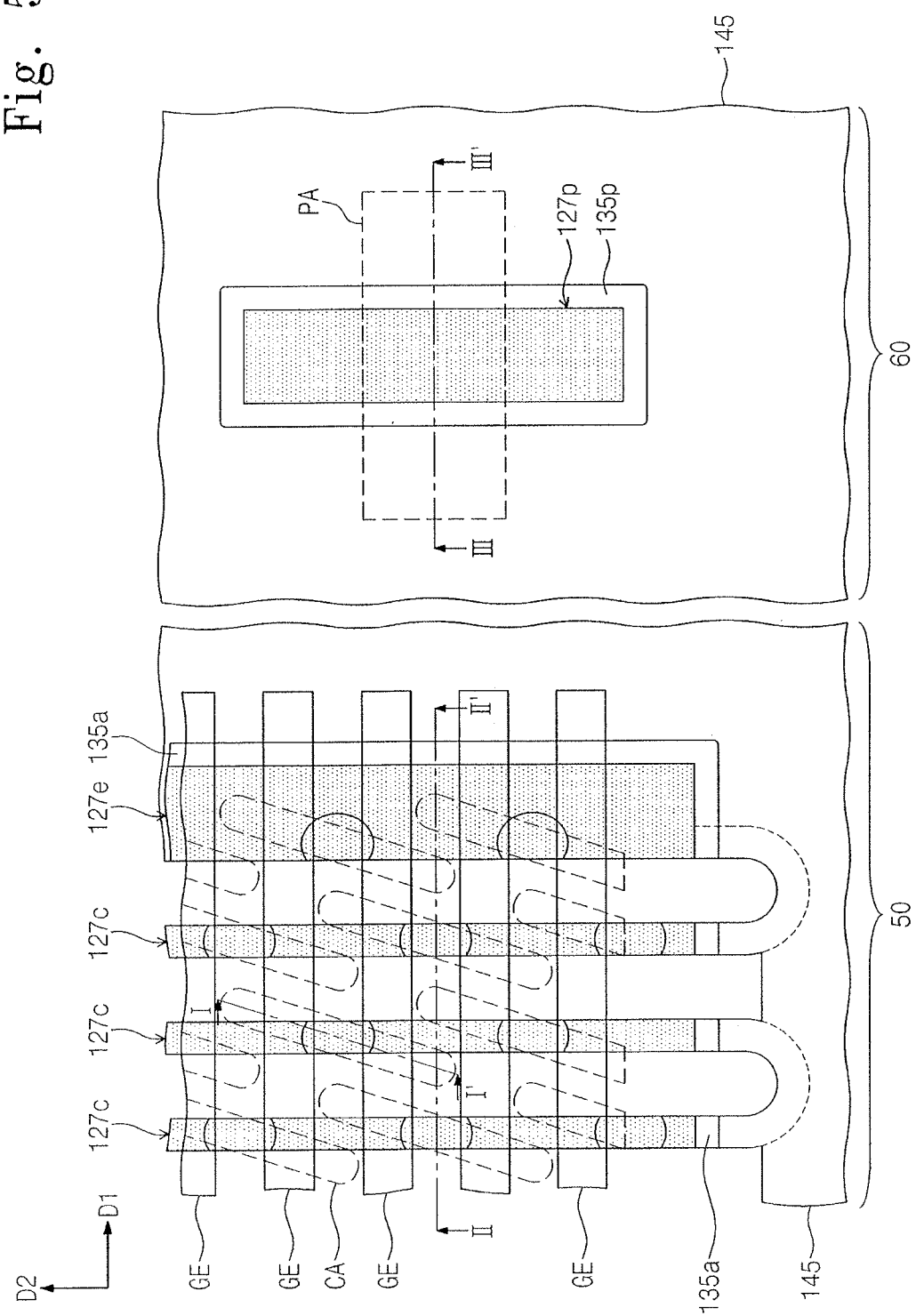
Figure 5B:
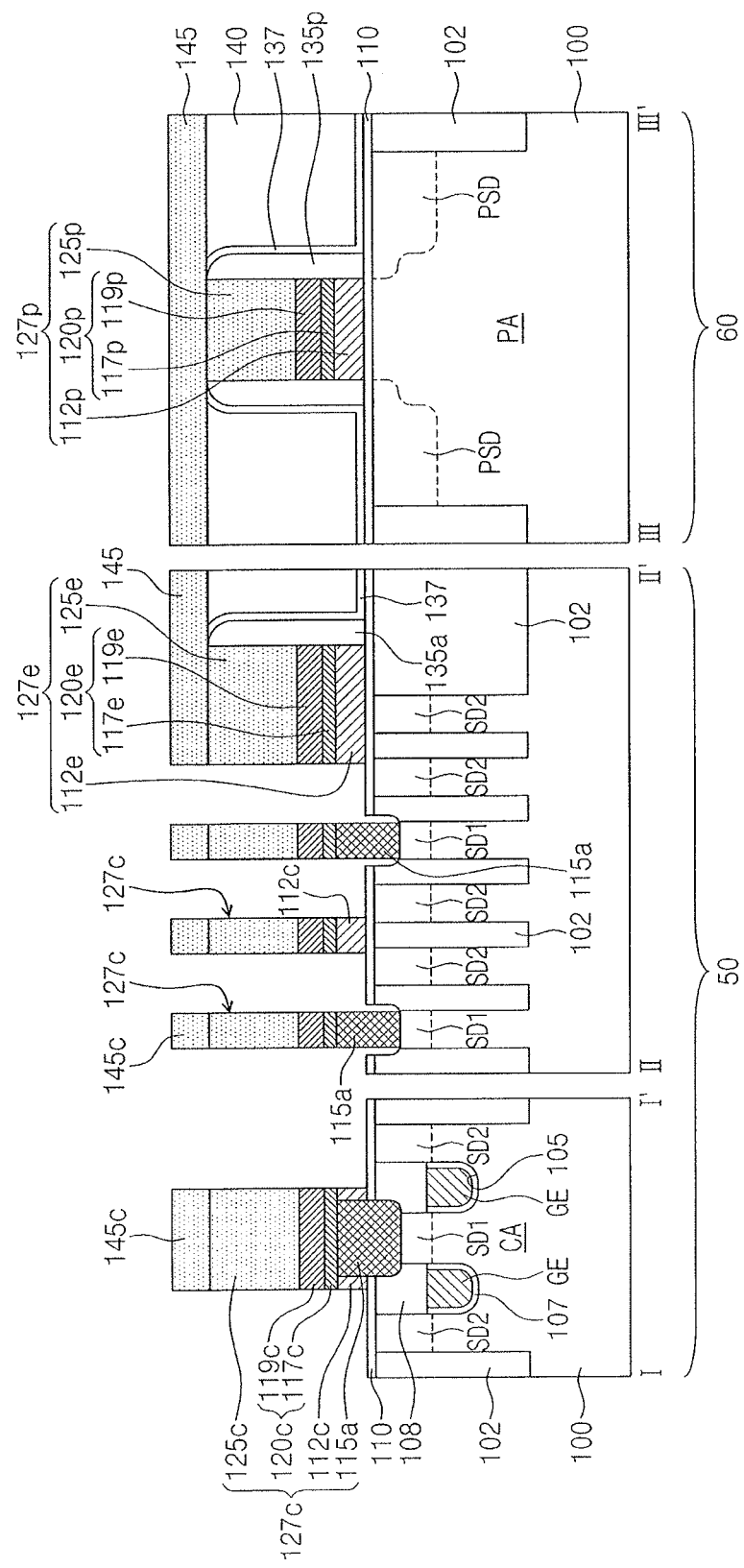

Referring to FIGS. 5A and 5B, a cell patterning process using the cell line mask patterns 147 may be performed on the capping insulating layer 145 and the plate pattern in the cell region 50 to form cell line patterns 127c and 127e. An outermost cell line pattern 127e of the cell line patterns 127c and 127e may correspond to a dummy line pattern. Capping line patterns 145c may be formed on the cell line patterns 127c except the outermost cell line pattern 127e, respectively. After the cell patterning process is performed, the capping insulating layer 145 in the peripheral region 60 may remain. Additionally, the capping insulating layer 145 may also remain on the outermost cell line pattern 127e and the planarized interlayer insulating layer 140 adjacent thereto.

The cell patterning process will be described in more detail hereinafter. The capping insulating layer 145 and the hard mask plate pattern 125a in the cell region 50 may be successively etched using the cell line mask patterns 147 as etch masks to form a cell hard mask line 125c and the capping line pattern 145c that are sequentially stacked. At this time, an etch rate of an etching recipe may be varied depending on an etching area. In other words, the etch rate of the capping insulating layer 145 having a large area may be smaller than the etch rate of the capping insulating layer 145 having a small area. Thus, the capping insulating layer 145 having the small area between the cell line mask patterns 147 may be successively etched and then the hard mask plate pattern 125a thereunder may be etched. On the contrary, the capping insulating layer 145 having the large area in the peripheral region 60 may remain. Additionally, the capping insulating layer 145 in the edge region of the cell region 50, where the cell line mask pattern 147 is not formed, may also remain. At this time, an outermost cell hard mask line 125e may be formed under an outermost one of the cell line mask patterns 147 and the remaining capping insulating layer 145 adjacent thereto.

The conductive plate pattern 120a, 112a and 115 may be etched using the remaining capping insulating layer 145, the capping line patterns 145c, and the cell hard mask lines 125c and 125e as etch masks. Thus, a cell conductive line may be formed under each of the cell hard mask lines 125c, and an outermost cell conductive line may be formed under the outermost cell hard mask line 125e. In an embodiment, the cell line mask patterns 147 and the connection parts 147r may be removed after the formation of the cell hard mask lines 125c and 125e and before etching of the conductive plate pattern 120a, 112a and 115.

The cell conductive line includes lower conductive patterns 112c arranged in the second direction D2 and contact parts 115a respectively between the lower conductive patterns 112c. In other words, the lower conductive patterns 112c and the contact parts 115a in the cell conductive line may be alternately and repeatedly arranged in the second direction D2. The lower conductive pattern 112c may correspond to a portion of the lower conductive layer 112, and the contact part 115a may correspond to a portion of the contact plug 115. The contact part 115a may be connected to the first source/drain region SD1, and the insulating layer 110 may be disposed between the lower conductive pattern 112c and the substrate 100. The cell conductive line further includes an upper conductive pattern 120c that is disposed on the lower conductive patterns 112c and the contact parts 115a. The upper conductive pattern 120c extends in the second direction D2. The upper conductive pattern 120c may include a cell barrier pattern 117c and a cell metal pattern 119c that are sequentially stacked.

The outermost cell conductive line may include an outermost lower conductive pattern 112e and an outermost upper conductive pattern 120e that are sequentially stacked. Additionally, the outermost cell conductive line may further include portions of the contact plugs 115. The outermost upper conductive pattern 120e may include an outermost cell barrier pattern 117e and an outermost cell metal pattern 119e that are sequentially stacked.

The cell line pattern 127c includes the cell conductive line and the cell hard mask line 125c that are sequentially stacked. The outermost cell line pattern 127e includes the outermost cell conductive line and the outermost hard mask line 125e. In an embodiment, a width of the outermost cell line pattern 127e may be greater than a width of the cell line pattern 127c.

The outermost cell line pattern 127e has an inner sidewall and an outer sidewall that extend in the second direction D2. The outer sidewall of the outermost cell line pattern 127e corresponds to one sidewall of the plate pattern, and the inner sidewall of the outmost cell line pattern 127e is adjacent to the cell line pattern 127c. The capping insulating layer 145 remaining on the outermost cell line pattern 127e has a sidewall aligned with the inner sidewall of the outermost cell line pattern 127e. The spacer 135a remains on the outer sidewall of the outermost cell line pattern 127e due to the remaining capping insulating layer 145.

As illustrated in FIG. 4A, the connection parts 147r of the cell line mask patterns 147 are disposed beyond the top surface of the hard mask plate pattern 125a in plan view. Thus, the cell line patterns 127c and 127e are separated from each other by the cell patterning process. In more detail, the cell line patterns 127c and 127e may be completely separated from each other by one cell patterning process using the cell line mask patterns 147. The spacer 135a on an end-sidewall of the cell line pattern 127c may remain. The end-sidewall of the cell line pattern 127c may be substantially perpendicular to both sidewalls extending in the second direction D2 of the cell line pattern 127c. In an embodiment, since the connection part 147r is located beyond the top surface of the hard mask plate pattern 125a, the capping insulating layer 145 and the spacer 135a between end portions of the cell line mask patterns 147 may also be etched.

Figure 10:
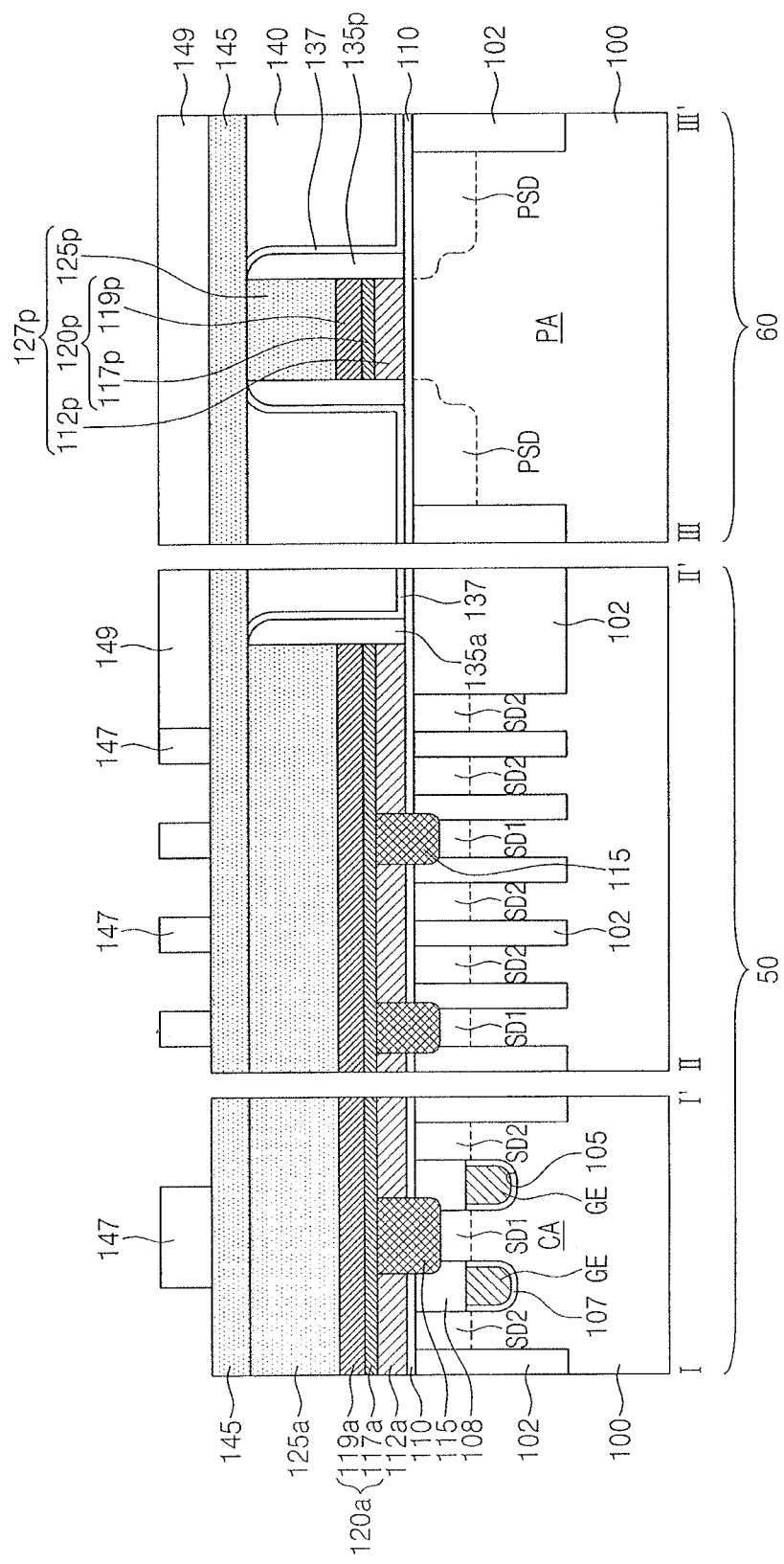
FIG. 10 illustrates a cross-sectional view of a modified example of a method of manufacturing a semiconductor device according to some embodiments.

The cell patterning process described above may use the etch recipe having the etch rate varied depending on the etch area. Alternatively, the cell patterning process may further use an additional mask pattern. For example, as illustrated in FIG. 10, an additional mask pattern 149 may be formed after the cell line mask patterns 147 are formed. The additional mask pattern 149 may cover the capping insulating layer 145 disposed in the peripheral region 60. Additionally, the additional mask pattern 149 may also cover the capping insulating layer 145 disposed in the edge region of the cell region 50. The additional mask pattern 149 may be formed of a material having an etch selectivity with respect to the capping insulating layer 145 and the hard mask plate pattern 125a. For example, the additional mask pattern 149 may include a photoresist. Subsequently, the capping insulating layer 145 and the plate pattern may be successively etched using the cell line mask pattern 147 and the additional mask pattern 149 as etch masks, thereby forming the structure illustrated in FIGS. 5A and 5B. When the cell patterning process uses the cell line and additional mask patterns 147 and 149, the etching process of the cell patterning process may use an etch recipe regardless of an etch area.

Figure 6A:
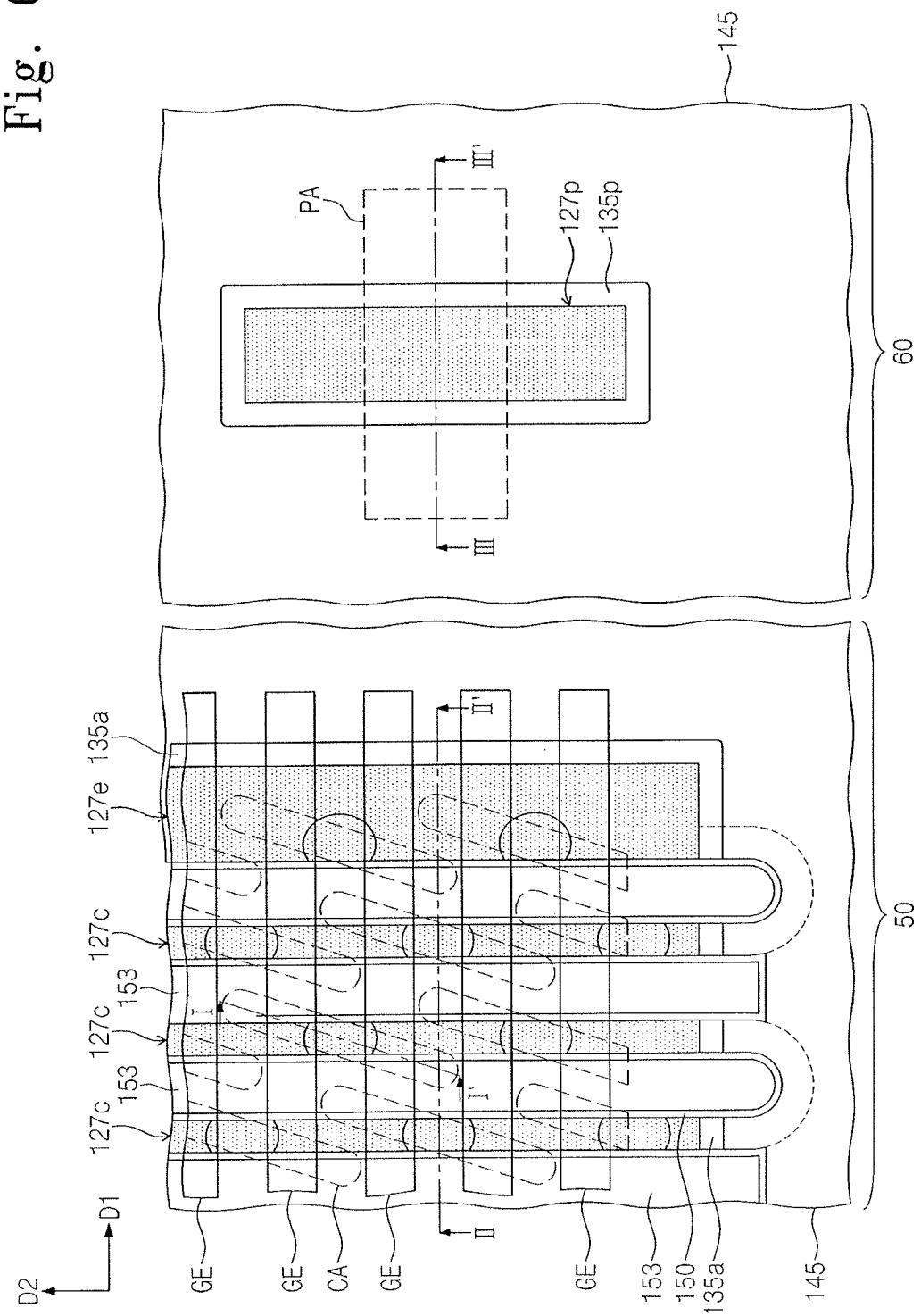
Figure 6B:
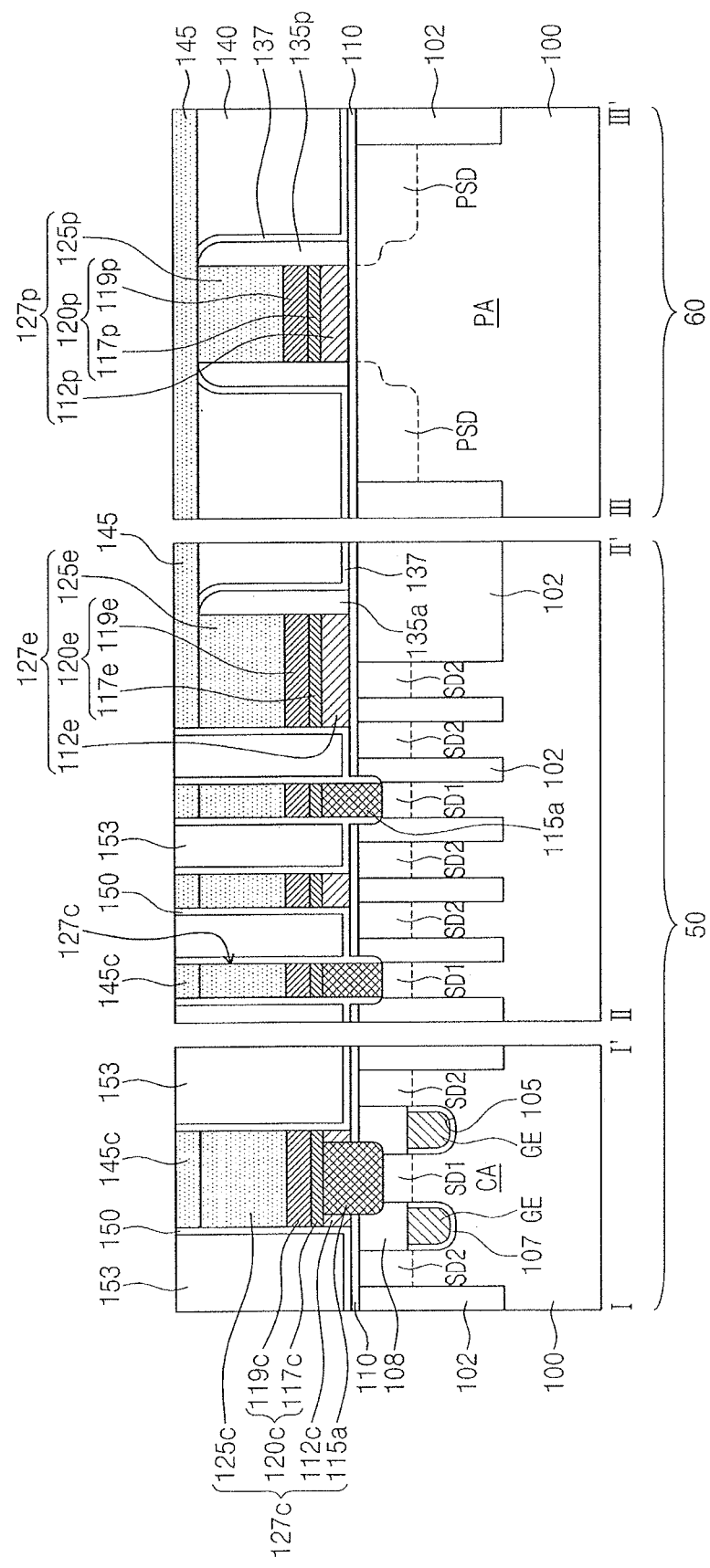

Referring to FIGS. 6A and 6B, next, a cell insulation liner 150 may be conformally formed on the entire surface of the substrate 100. A filling insulation layer may be formed on the entire surface of the substrate 100 having the cell insulation liner 150. The filling insulation layer may fill spaces between the cell line patterns 127c and 127e. The filling insulation layer may be planarized to form filling insulation patterns 153. At this time, the filling insulation layer in the peripheral region 60 is removed. The filling insulation patterns 153 may fill the spaces between the cell line patterns 127c and 127e, respectively. The filling insulation patterns 153 may extend in parallel to each other in the second direction D2, as illustrated in FIG. 6A.

The cell insulation liner 150 is formed of an insulating material having an etch selectivity with respect to the filling insulation patterns 153. For example, the cell insulation liner 150 may be formed of silicon nitride and/or silicon oxynitride, and the filling insulation patterns 153 may be formed of silicon oxide.

As illustrated in FIG. 6B, the filling insulation layer may be planarized until the capping insulating layer 145 and the capping line patterns 145c are exposed. Alternatively, the filling insulation layer may be planarized until the cell insulation liner 150 on top surfaces of the capping insulating layer 145 and the capping line patterns 145c is exposed. Thus, the cell insulation liner 150 may remain on the top surfaces of the capping insulating layer 145 and the capping line patterns 145c.

Figure 7A:
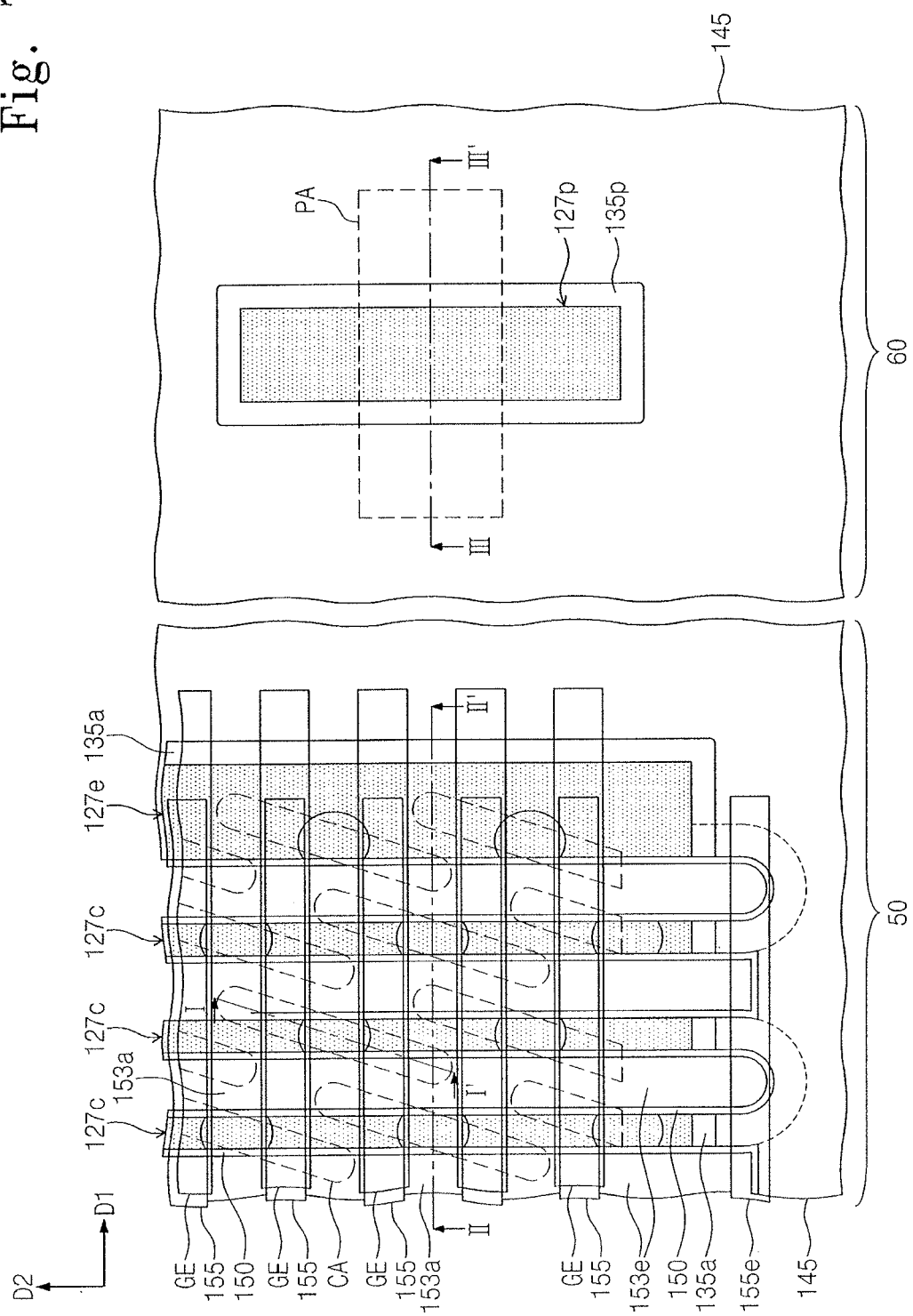
Figure 7B:
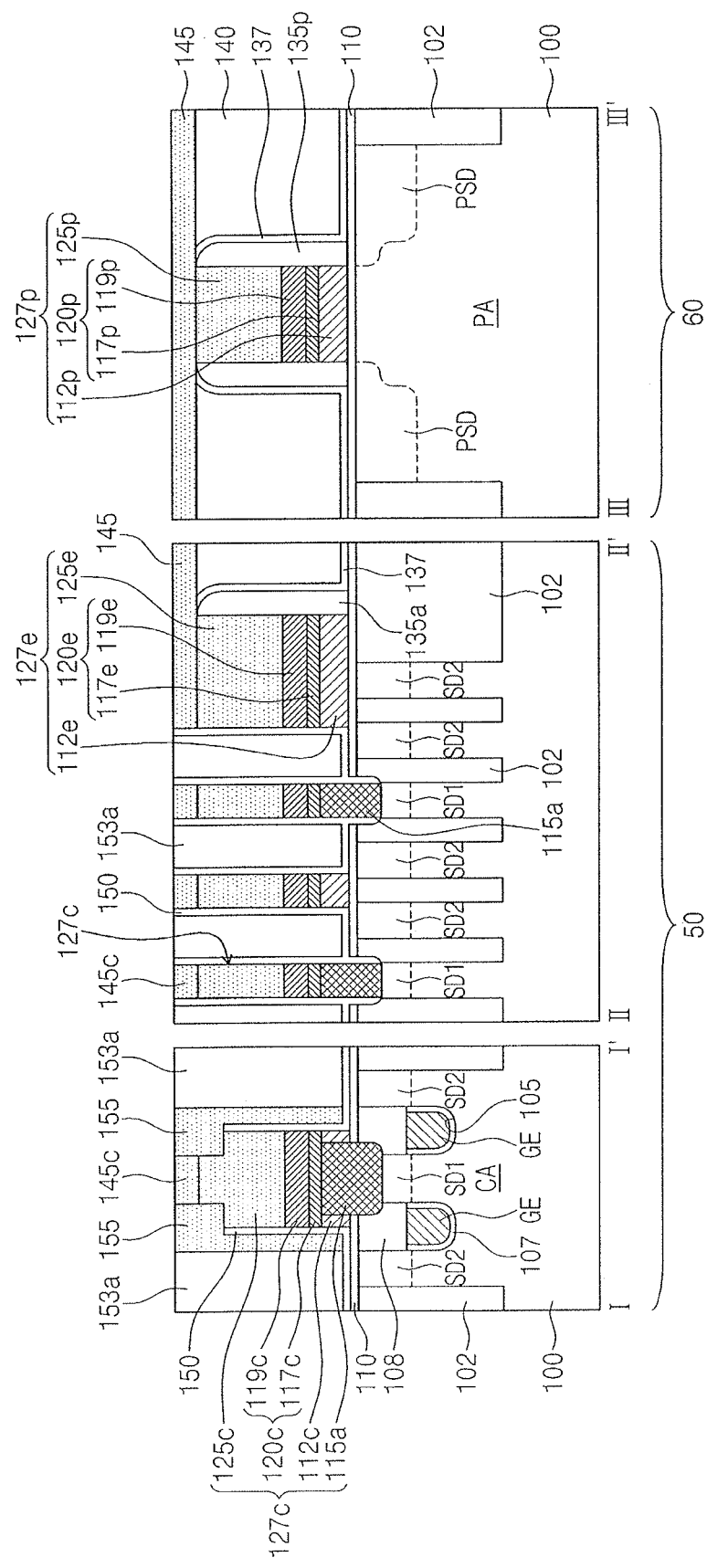

Referring to FIGS. 7A and 7B, insulating fences 155 and an outermost insulating fence 155e may be formed in the cell region 50. The insulating fences 155 and the outermost insulating fence 155e divides each of the filling insulation patterns 153 into a plurality of filling insulation pillars 153a and 153e. The filling insulation pillars 153a and 153e are completely separated from each other. The insulating fences 155 and the outermost insulating fence 155e may extend in parallel to each other in the first direction D1. The insulating fences 155 may overlap with the cell gate electrodes GE, respectively.

In more detail, a mask pattern (not shown) may be formed on the substrate. The mask pattern (not shown) has openings disposed in the cell region 50. The openings may extend in parallel to each other in the first direction D1 to cross the filling insulation patterns 153. The openings may expose portions of the filling insulation patterns 153 thereunder. The mask pattern (not shown) may cover the capping insulating layer 145 which is disposed in the peripheral region 60 and the edge region of the cell region 50. The filling insulation patterns 153 may be etched using the mask pattern (not shown) as an etch mask until the cell insulation liner 150 between the cell line patterns 127c and 127e is exposed. Thus, each of the filling insulation patterns 153 is divided into the plurality of filling insulation pillars 153a. When the filling insulation patterns 153 are etched, the capping insulating layer 145 under the openings may be recessed, or the capping insulating layer 145 and upper portions of the cell hard mask lines 125c and 125e under the openings may be recessed, as illustrated in FIG. 11C. FIG. 11C illustrates a cross-sectional view taken along a longitudinal direction of the cell line pattern 127c. As a result, a fence-groove may be formed under each of the openings. A bottom surface of the fence-groove may include a first portion defined by the recessed portion of the cell hard mask line 125c and a second portion defined by the cell insulation liner 150 between the cell line patterns 127c. The first portion of the bottom surface of the fence-groove is higher than the second portion of the bottom surface of the fence-groove.

The mask pattern (not shown) may be removed, and then an insulating fence layer may be formed on the substrate 100 to fill the fence-grooves. The insulating fence layer may be planarized until the filling insulation pillars 153a are exposed, thereby forming the insulating fences 155 and the outermost insulating fence 155e. The insulating fences 155 and the outermost insulating fence 155e may be formed of an insulating material (e.g., silicon nitride and/or silicon oxynitride) having an etch selectivity with respect to the filling insulation pillars 153a and 153e.

As illustrated in FIG. 7A, the outermost insulating fence 155e may cross end portions of the filling insulation patterns 153. In other words, the outermost insulating fence 155e may be disposed in a region where the connection parts 147r of the cell line mask patterns 147 were located. Thus, outermost filling insulation pillars 153e disposed between the end portions of the cell line patterns 127c may be completely separated from each other. If the etch recipe having the etch rate varied depending on the etch area is used in the cell patterning process, the top surface of the capping insulating layer 145 around the connection part 147r may be recessed to be lower than the top surface of the capping line pattern 145c. Thus, the outermost filling insulation pillars 153e may be connected to each other along the lower top surface of the capping insulating layer 145. However, since the outermost insulating fence 155e is formed, the outermost filling insulation pillars 153e can be completely separated from each other.

Figure 8B:
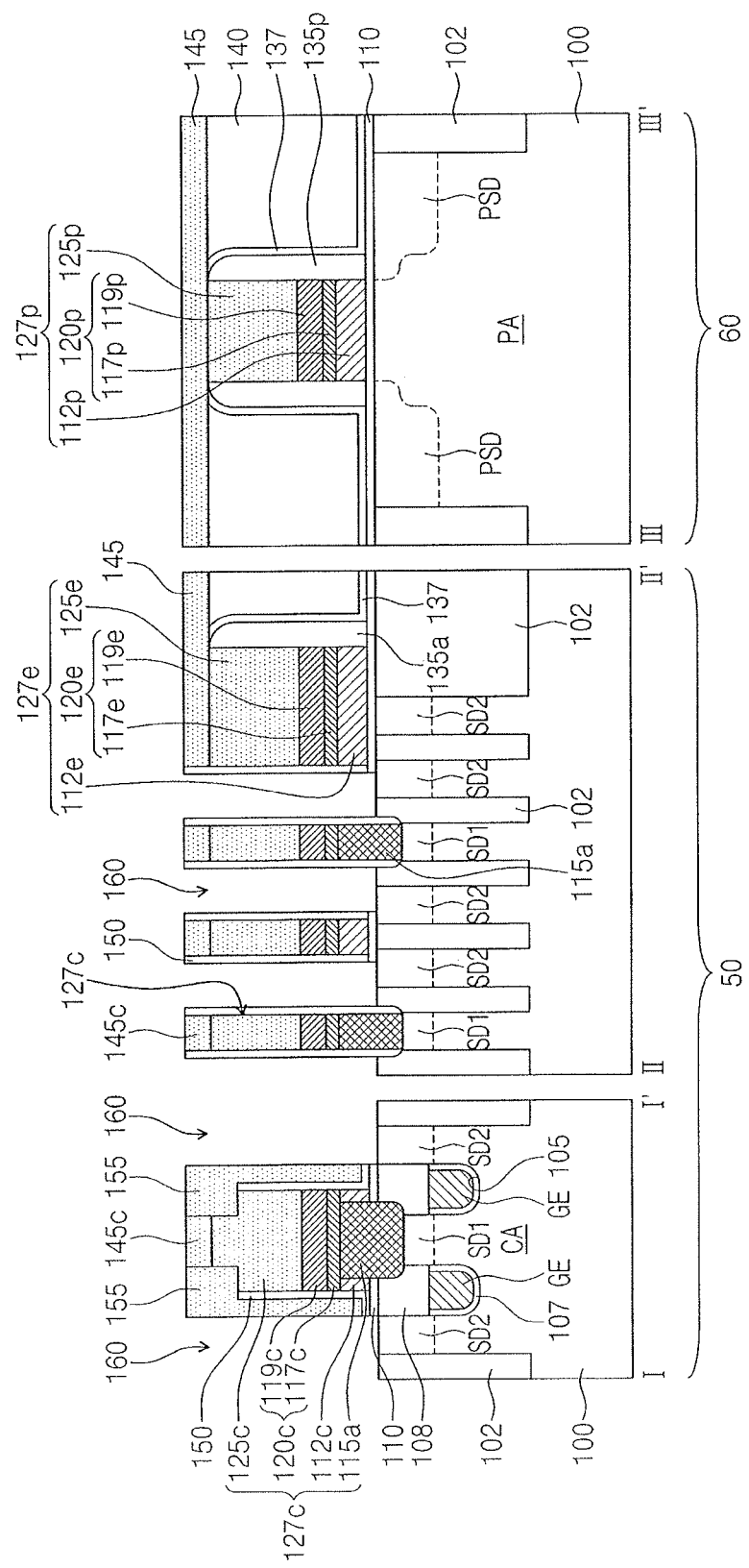

Referring to FIGS. 8A and 8B, the filling insulation pillars 153a and 153e may be removed to form holes 160 and 160e. As described above, the insulating fences 155 and 155e and the capping insulating layer 145 have the etch selectivity with respect to the filling insulation pillars 153a and 153e. Thus, the insulating fences 155 and 155e and the capping insulating layer 145 remain after the formation of the holes 160 and 106e. The cell insulation liner 150 and the insulating layer 110 under the holes 160 and 160e may be successively etched to expose the second source/drain regions SD2.

Due to the outermost insulating fence 155e, outermost holes 160e formed by the removal of the outermost filling insulation pillars 153e may be completely separated from each other.

When the filling insulation pillars 153a and 153e are removed, the planarized interlayer insulating layer 140 in the peripheral region 60 is protected by the capping insulating layer 145. Thus, a mask process for covering the peripheral region 60 is not required when the filling insulation pillars 153a and 153e are removed. As a result, manufacturing processes of the semiconductor device may be simplified to improve productivity.

Figure 9A:
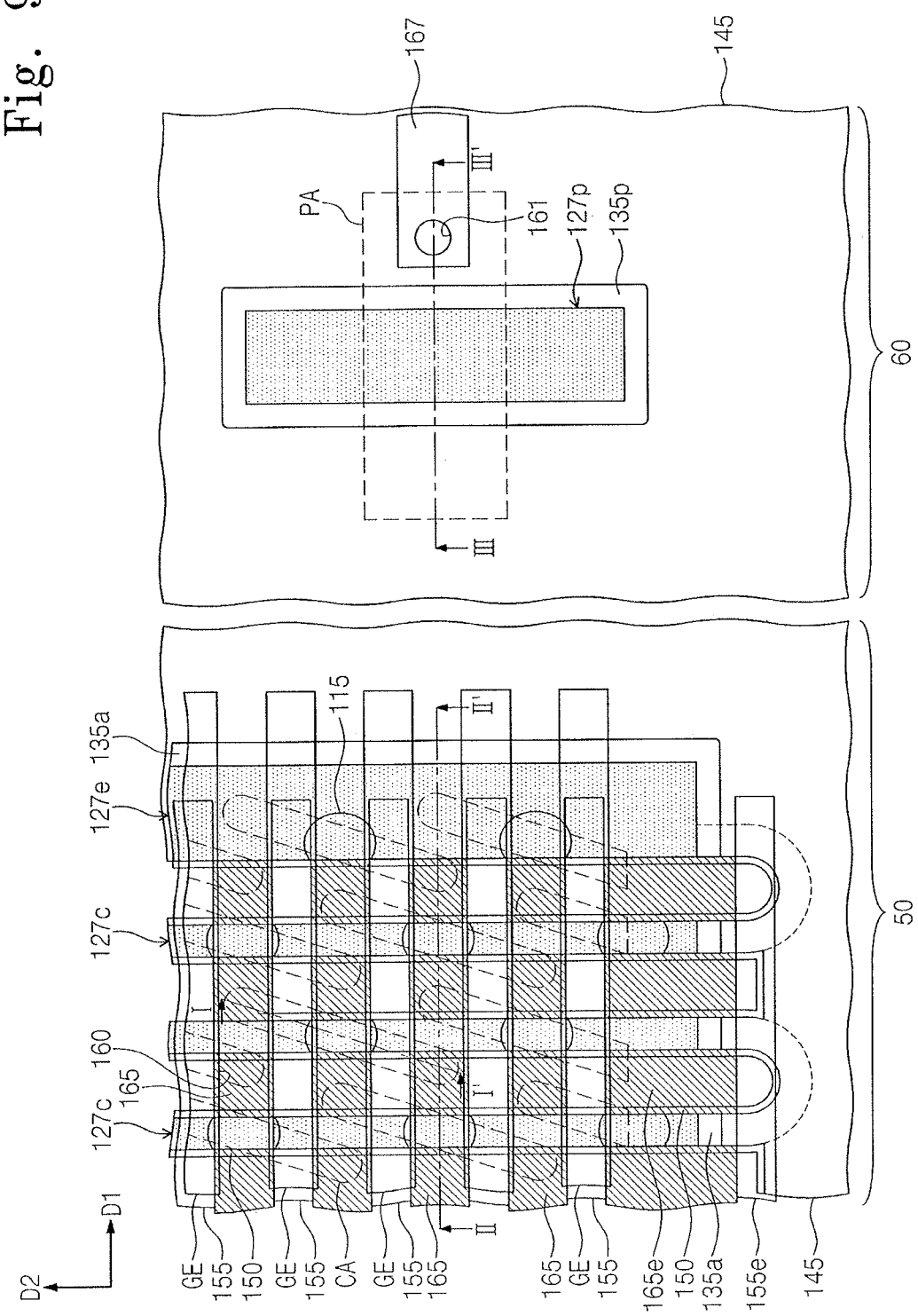
Figure 9B:
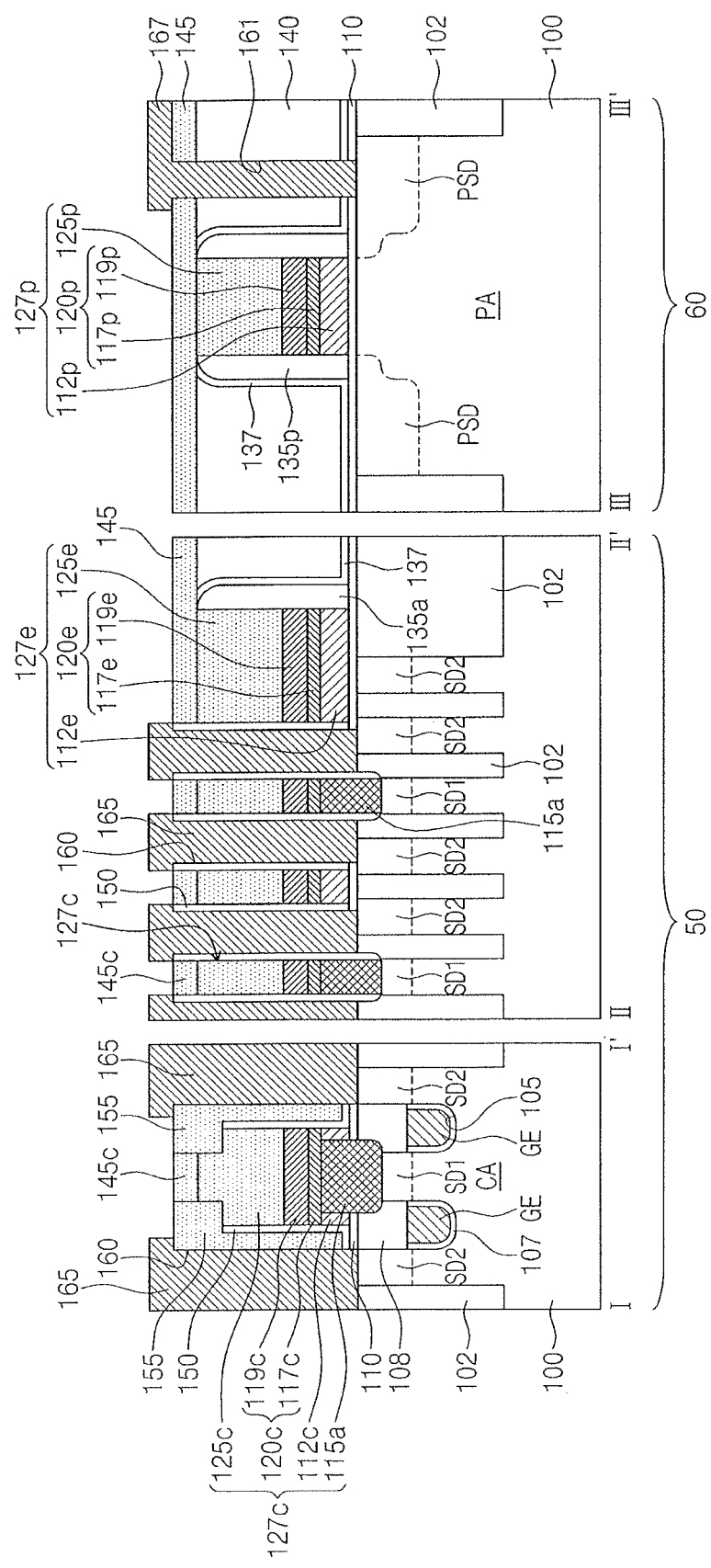

Referring to FIGS. 9A and 9B, cell contact pillars 165 may be formed in the holes 160, respectively. Additionally, outermost contact pillars 165e may be formed in the outermost holes 160e, respectively. The cell contact pillars 165 may be connected to the second source/drain regions SD2, respectively. The outermost contact pillars 165e correspond to dummy patterns. The outermost contact pillars 165e may be completely separated from each other by the outermost insulating fences 155e. In an embodiment, each of the contact pillars 165 and 165e may include a pad portion extending outside each of the holes 160 and 160e.

A peripheral hole 161 may be formed to successively penetrate the capping insulating layer 145, the planarized interlayer insulating layer 140, the peripheral insulation liner 137, and the insulating layer 110 in the peripheral region 60. The peripheral hole 161 may be formed before the contact pillars 165 and 165e are formed. A peripheral interconnection 167 may be formed on the capping insulating layer 145 in the peripheral region 60. The peripheral interconnection 167 may be connected to the peripheral source/drain region PSD through the peripheral hole 161.

In an embodiment, the peripheral interconnection 167 and the contact pillars 165 and 165e may be formed at the same time. In an embodiment, a second conductive layer may be formed to fill the holes 160 and 160e and the peripheral hole 161, and then the second conductive layer may be patterned to form the contact pillars 165 and 165e and the peripheral interconnection 167. The pad portions of the contact pillars 165 and 165e may be separated from each other by pattering the second conductive layer. Alternatively, the second conductive layer may be planarized until the capping insulating layer 145 is exposed, so that the contact plugs 165 and 165e may be confinedly formed in, e.g., to completely fill, the holes 160 and 160e and a conductive pillar may be formed to fill the peripheral hole 161. Subsequently, an additional conductive layer may be formed and then be patterned to form the peripheral interconnection 167 on the capping insulating layer 145 in the peripheral region 60.

Meanwhile, when the peripheral hole 161 is formed, a second peripheral hole 162 may be formed to expose the peripheral source/drain region PSD in the second peripheral active portion PA2 of FIG. 11C. When the peripheral interconnection 167 is formed, a peripheral contact portion 168c and a peripheral pad portion 168L may be formed, as illustrated in FIG. 11C. The peripheral contact portion 168c fills the second peripheral hole 162, and the peripheral pad portion 168L is disposed on the peripheral contact portion 168c. The peripheral contact portion 168c and the peripheral pad portion 168L may be formed of the same conductive material as the peripheral interconnection 167.

Subsequent processes after this will be described with reference to FIGS. 11A to 11C. An upper interlayer insulating layer 170 may be formed on the entire surface of the substrate 100. Storage plugs 175 may be formed to penetrate the upper interlayer insulating layer 170. The storage plugs 175 may be connected to the cell contact plugs 165, respectively. As illustrated in FIGS. 11A and 11C, an interconnection-plug 173 may be formed to successively penetrate the upper interlayer insulating layer 170, the capping line pattern 145c and the cell hard mask line 125c. The interconnection-plug 173 may be connected to an end portion of the cell conductive line that is disposed between the outermost insulating fence 155e and the insulating fence 155 adjacent to the outermost insulating fence 155e.

The interconnection-plugs 173 may be provided to correspond to the cell conductive lines, respectively. In an embodiment, each of the cell conductive lines includes a first end portion and a second end portion opposite to each other. The first end portions of the cell conductive lines may be arranged in the first direction D1, and the second end portions of the cell conductive lines may be arranged in the second direction D1. The interconnection-plugs 173 connected to even-numbered cell conductive lines may be connected to the first end portions of the even-numbered cell conductive lines, respectively. The interconnection-plugs 173 connected to odd-numbered cell conductive lines may be connected to the second end portions of the odd-numbered cell conductive lines, respectively.

In an embodiment, the interconnection-plug 173 may be connected to the outermost contact pillar 165e disposed at a side of the cell line pattern 127c by misalignment. However, as illustrated above, each of the outermost contact plugs 165e is completely separated from neighboring outermost connect plugs 165e due to the outermost insulating fence 155e. Thus, the semiconductor device may be normally operated.

As illustrated in FIG. 11C, a peripheral interconnection-plug 174 may be formed to penetrate the upper interlayer insulating layer 170 disposed over the second peripheral active portion PA2 in the peripheral region 60. The peripheral interconnection-plug 174 may be connected to the peripheral pad portion 168L. In other words, the peripheral interconnection-plug 174 may be electrically connect to the peripheral source/drain region PSD in the second peripheral active portion PA2 through the peripheral pad portion 168L and the peripheral contact portion 168c.

An interconnection 180 may be formed on the upper interlayer insulating layer 170. The interconnection 180 is connected to the interconnection-plug 173. As illustrated in FIG. 11C, the interconnection 180 may laterally extend into the peripheral region 60, so as to be connected to the peripheral interconnection-plug 174. Thus, the cell conductive line may be electrically connected to the peripheral source/drain region PSD of the second peripheral transistor PTR2 through the interconnection 180. A program voltage or a sensing voltage may be applied to the cell conductive line through the second peripheral transistor PTR2.

The storage plug 175 and the interconnection-plug 173 may be formed at the same time. Additionally, the storage plug 175 and the peripheral interconnection-plug 174 may be formed at the same time. However, embodiments are not limited thereto. For example, the interconnection-plug 173 and the interconnection 180 may be formed at a different level from the storage plug 175. Thus, the storage plug 175 and the interconnection-plug 174 may be sequentially formed regardless of the order.

Data storage parts DSP may be formed to be connected to the storage plugs 175, respectively. The data storage part DSP may be electrically connected to the second source/drain region SD2 through the storage plug 175 and the cell contact pillar 165. The data storage part DSP may store logic data. The data storage part DSP may be realized as one of various shapes. This will be mentioned in more detail later.

According to the method of manufacturing the semiconductor device described above, the peripheral patterning process performed on the hard mask layer 125 and the conductive layer 112 and 120 in the peripheral region 60 may be performed independently from the cell patterning process performed on the hard mask layer 125 and the conductive layer in the cell region 50. Thus, a condition of the etching process of the cell patterning process may be controlled to be optimized for a profile, e.g., shape, of the cell line pattern 127c. Additionally, a condition of the etching process of the peripheral patterning process may be controlled to be optimized for a profile, e.g., shape, of the peripheral gate pattern 127p. As a result, the optimized cell line pattern 127c and the optimized peripheral gate pattern 127p may be realized to improve the reliability of the semiconductor device.

For example, the contact plug 115 is etched during the cell patterning process. At this time, a height of the contact plug 115 may be greater than the thickness of the lower conductive layer 112. Thus, an etched thickness of the conductive layer in the cell region 50 during the cell patterning process may be greater than an etched thickness of the conductive layer in the peripheral region 60 during the peripheral patterning process. Thus, if the cell and peripheral patterning processes are performed at the same time, the peripheral active portion PA around the peripheral gate pattern 127c may be over-etched to deteriorate operating characteristics of the peripheral transistor. However, according to embodiments, since the peripheral patterning process is performed independently from the cell patterning process, the cell line pattern 127c and the peripheral gate pattern 127p may be optimized together.

In the present embodiment, the cell patterning process is performed after the peripheral patterning process is performed, such that the capping insulating layer 145 remains in the peripheral region 60. As described above, when the filling insulation pillars 153a and 153e are removed, the remaining capping insulating layer 145 protects the planarized interlayer insulating layer 140 in the peripheral region 60. Thus, a mask layer for protecting the peripheral region 60 is not required when the filling insulation pillars 153a and 153e are removed. As a result, the manufacture processes of the semiconductor device may be simplified to improve productivity of the semiconductor device.

Additionally, the peripheral hole 161 may penetrate the capping insulating layer 145 and the planarized interlayer insulating layer 140 in the peripheral region 60. In other words, the peripheral hole 161 may include a lower region penetrating the planarized interlayer insulating layer 140 and an upper region penetrating the capping insulating layer 145. The capping insulating layer 145 has the etch selectivity with respect to the planarized interlayer insulating layer 140. Thus, even though a bowing phenomenon may occur in the lower region of the peripheral hole 161, a width of the upper region of the peripheral hole 161 may not increase. As a result, it is possible to prevent various problems (e.g., an electrical short) caused by increase of a top end of the peripheral hole 161.

Furthermore, the plate pattern may be formed in the cell region 50 by the peripheral patterning process, and the connection parts 147r of the cell line mask patterns 147 formed by the double patterning technique may be disposed outside (or beyond) the top surface of the plate pattern in plan view. Thus, the cell line patterns 127c may be completely separated from each other by only the cell patterning process. In other words, an additional pattern process for separating end portions of the cell line patterns 127c from each other is not required. As a result, the manufacture processes of the semiconductor device may be more simplified to improve the productivity of the semiconductor device.

Next, the semiconductor device according to the present embodiment will be described with reference to FIG. 11A to 11C. Hereinafter, duplicate descriptions in the aforementioned manufacture method will be omitted or mentioned briefly for the purpose of ease and convenience in explanation.

FIG. 11A illustrates plan view illustrating a semiconductor device according to some embodiments. FIG. 11B is a cross-sectional view taken along lines I-I', II-II', and III-III' of FIG. 11A. FIG. 11C is a merged view of a cross-sectional view taken along a line IV-IV' of FIG. 11A and a cross-sectional illustrating a second peripheral transistor electrically connected to a cell conductive line.

FIGS. 11A, 11B, and 11C, a substrate 100 may include the cell region 50 and the peripheral region 60. The device isolation pattern 102 may be disposed on or in the substrate 100 to define the cell active portions CA in the cell region 50 and the peripheral active portion PA in the peripheral region 60. The shapes and the arrangement of the cell active portions CA may be the same as described with reference to FIGS. 1A and 1B.

Cell gate electrodes GE may be buried in the grooves 105, respectively. The grooves 105 may extend in parallel to each other in the first direction D1 to cross the cell active portions CA and the device isolation pattern 102. As described above, a pair of the grooves 105 may cross each of the cell active portions CA. A cell gate insulating layer 105 may be disposed between the cell gate electrode GE and the inner surface of the groove 105, and the cell gate-capping pattern 108 may be disposed on the top surface of the cell gate electrode GE. The cell gate-capping pattern 108 may have a top surface substantially coplanar with a top surface of the cell active portion CA.

The first source/drain region SD1 may be disposed in each of the cell active portions CA between the pair of grooves 105, and a pair of second source/drain regions SD2 may be disposed in both edge portions of each of the cell active portions CA, respectively.

The Cell line patterns 127c are disposed on the substrate 100 in the cell region 50. The cell line patterns 127c may extend in the second direction D2 perpendicular to the first direction D1, so as to cross over the cell gate electrodes GE. Each of the cell line patterns 127c may include a cell conductive line and a cell hard mask line 125c that are sequentially stacked.

The cell conductive line may include lower conductive patterns 112c arranged in the second direction D2 and contact portions 115a between the lower conductive patterns 112c. The lower conductive patterns 112c and the contact portions 115a of the cell conductive line may be alternately and repeatedly arranged along the second direction D2. The contact portions 115a are connected to the first source/drain regions SD1, respectively. The insulating layer 110 may be disposed between the lower conductive pattern 112c and the substrate 100. A bottom surface of the contact portion 115a may be lower than a bottom surface of the lower conductive pattern 112c. A top surface of the contact portion 115a may be substantially coplanar with a top surface of the lower conductive pattern 112c.

The cell conductive line further includes an upper conductive pattern 120c disposed on the lower conductive patterns 112c and the contact portions 115a. The upper conductive pattern 120c extends in the second direction D2. The upper conductive pattern 120c may include a conductive material having a resistivity lower than that of the lower conductive pattern 112c. For example, the upper conductive pattern 120c may include a cell metal pattern 119c. Additionally, the upper conductive pattern 120c may further include a cell barrier pattern 117c disposed between the cell metal pattern 119c and the lower conductive pattern 112c and between the cell metal pattern 119c and the contact portion 115a.

The outermost cell line pattern 127e may be disposed at a side of the cell line patterns 127c. The outermost cell line pattern 127e may include an outermost cell conductive line and an outermost cell hard mask line 125e that are sequentially stacked. The outermost cell conductive line may include the outermost lower conductive pattern 112e and the outermost upper conductive pattern 120e that are sequentially stacked. Additionally, the outermost conductive line may further include portions of the contact plugs 115 described with reference to FIGS. 2A and 2B. In an embodiment, a width of the outermost cell line pattern 127e may be greater than a width of the cell line pattern 127c.

The peripheral gate pattern 127p crosses over the peripheral active portion PA. The insulating layer 110 in the peripheral region 60 may be disposed between the peripheral gate pattern 127p and the top surface of the peripheral active portion PA. The peripheral gate pattern 127p may include a peripheral gate electrode and a peripheral hard mask pattern 125p that are sequentially stacked. The peripheral gate electrode may include a lower gate 112p and an upper gate 120p that are sequentially stacked. The upper gate 120p may include the peripheral barrier pattern 117p and the peripheral metal pattern 119p that are sequentially stacked.

A top surface of the peripheral gate electrode (i.e., a top surface of the upper gate 120p) may be disposed at substantially the same level (or the same height) as a top surface of the cell conductive line (i.e., a top surface of the upper conductive pattern 120c).

In an embodiment, a top surface of the peripheral hard mask pattern 125p may be disposed at substantially the same level (or the same height) as a top surface of the cell hard mask line 125c. However, embodiments are not limited thereto.

The peripheral gate spacer 135p may be disposed on a sidewall of the peripheral gate pattern 127p. Peripheral source/drain regions PSD may be disposed in the peripheral active portion PA at both sides of the peripheral gate pattern 127p, respectively.

As illustrated in FIG. 11C, the second peripheral transistor PTR2 may be formed on a second peripheral active portion PA2 in the peripheral region 60. A stack structure of a peripheral gate pattern 127p of the second peripheral transistor PTR2 may be the same as the stack structure of the peripheral gate pattern 127p on the peripheral active portion PA. Peripheral source/drain regions PSD of the second peripheral transistor PTR2 may be disposed in the second peripheral active portion PA2 at both sides of the peripheral gate pattern 127p of the second peripheral transistor PTR2, respectively. The peripheral gate spacer 135p may also be disposed on a sidewall of the peripheral gate pattern 127p of the second transistor PTR2.

Referring to FIGS. 11A, 11B, and 11C, the interlayer insulating layer 140 may be disposed on the substrate 100 around the peripheral gate pattern 127p in the peripheral region 60. The interlayer insulating layer 140 has a planarized top surface. Thus, the interlayer insulating layer 140 does not cover the top surface of the peripheral gate pattern 127p. In an embodiment, the top surface of the interlayer insulating layer 140 may be substantially coplanar with the top surface of the peripheral gate pattern 127p. The peripheral insulation liner 137 may be disposed between the interlayer insulating layer 140 and the peripheral gate spacer 135p and between the interlayer insulating layer 140 and the substrate 100.

The capping insulating layer 145 may be disposed on the interlayer insulating layer 140 and the peripheral gate pattern 127p in the peripheral region 60. In an embodiment, the capping insulating layer 145 may be in contact with the top surface of the interlayer insulating layer 145.

The outermost cell line pattern 127e may include an inner sidewall and an outer sidewall that extend in parallel to each other in the second direction D2 and are opposite to each other. The inner sidewall of the outermost cell line pattern 127e may be adjacent to the cell line pattern 127c. The spacer 135a may be disposed on the outer sidewall of the outermost cell line pattern 127e. The spacer 135a is formed of the same material as the peripheral gate spacer 135p. The interlayer insulating layer 140 in the peripheral region 60 may laterally extend into an edge region of the cell region 50. The peripheral insulation liner 137 may also extend to be disposed between the spacer 135a and the extending portion of the interlayer insulating layer 140.

The capping insulating layer 145 in the peripheral region 60 may laterally extend to cover the top surface of the outermost cell line pattern 127e. The extending portion of the capping insulating layer 145, which covers the top surface of the outermost cell line pattern 127e, may have a sidewall aligned with the inner sidewall of the outermost cell line pattern 127e.

The capping line pattern 145c is disposed on the top surface of each of the cell line patterns 127c. The capping line pattern 145c is formed of the same material as the capping insulating layer 145. A bottom surface of the capping line pattern 145c has a width substantially equal to a width of the top surface of the cell line pattern 127c. The capping line pattern 145c has sidewalls aligned with sidewalls of the cell line pattern 127c, respectively. In an embodiment, a bottom surface of the capping line pattern 145c may be disposed at substantially the same level (or the same height) as a bottom surface of the capping insulating layer 145 in the peripheral region 60. However, embodiments are not limited thereto.

The cell insulation liner 150 covers both sidewalls of each of the cell line patterns 127c, which extend in parallel to each other in the second direction D2. At this time, the cell insulation liner 150 does not cover an end-sidewall of the cell line pattern 127c. The end-sidewall of the cell line pattern 127c corresponds to the sidewall of an end portion of the cell line pattern 127c. The end-sidewall of the cell line pattern 127c extends in a direction different from the second direction D2. For example, the end-sidewall of the cell line pattern 127c may extend in the first direction D1. The spacer 135a may also be disposed on the end-sidewall of the cell line pattern 127c.

Insulating fences 155 may cross the cell line patterns 127c and the capping line patterns 145c. The insulating fences 155 may extend in parallel to each other in the first direction D1 and may overlap with the cell gate electrodes GE, respectively. Each of the insulating fences 155 may include a first portion disposed on the cell line pattern 127c and a second portion between the cell line patterns 127c. The first portion of the insulating fence 155 may fill a recess region formed in the capping line pattern 145c and the cell hard mask line 125c. A bottom end of the second portion of the insulating fence 155 may extend downward to the cell insulation liner 150 disposed between the cell line patterns 127c. Thus, a bottom surface of the second portion of the insulating fence 155 is lower than a bottom surface of the first portion of the insulating fence 155. A top surface of the insulating fence 155 may be substantially coplanar with the top surface of the capping line pattern 145c.

An outermost insulating fence 155e may be disposed at a side of the insulating fences 155 and at a side of the end portions of the cell line patterns 127c. The outermost insulating fence 155e may extend in parallel to the insulating fences 155.

A hole 160 may be defined by a pair of the cell line patterns 127c adjacent to each other and a pair of the insulating fences 155 adjacent to each other. The hole 160 exposes the second source/drain region SD2. A cell contact pillar 165 is disposed in the hole 160 and is connected to the second source/drain region SD2. A plurality of the cell contact pillars 165 may be two-dimensionally arranged along rows and columns on the substrate 100 in the cell region 50. The cell insulation liner 150 is disposed between the cell contact pillar 165 and the cell line pattern 127c, so as to insulate the cell contact pillar 165 from the cell conductive line.

Outermost contact pillars 165e may be disposed between the outermost insulating fence 155e and the insulating fence 155 adjacent to the outermost insulating fence 155e. The outermost contact pillars 165e may be disposed between the end portions of the cell line patterns 127c, respectively.

A peripheral interconnection 167 may be connected to the peripheral source/drain region PSD through a peripheral hole 161 successively penetrating the capping insulating layer 145 and the interlayer insulating layer 140 in the peripheral region 60. An upper interlayer insulating layer 170 may cover an entire surface of the substrate 100, and data storage parts DSP may be disposed on the upper interlayer insulating layer 170 in the cell region 50. The data storage parts DSP may be electrically connected to the cell contact pillars 165 through storage plugs 175 penetrating the upper interlayer insulating layer 170, respectively.

As illustrated in FIG. 11C, an interconnection-plug 173 may successively penetrate the upper interlayer insulating layer 170, the capping line pattern 145c, and the cell hard mask pattern 125c which are disposed between the outermost insulating fence 155e and the insulating fence 155 adjacent to the outermost insulating fence 155e. The interconnection plug 173 may be connected to the cell conductive line. A peripheral contact portion 168c may disposed in a second peripheral hole 162 successively penetrating the capping insulating layer 145, the interlayer insulating layer 140, the peripheral insulation liner 137, and the insulating layer 110 in the peripheral region 60. The peripheral contact portion 168c may be connected to the peripheral source/drain region PSD of the second peripheral transistor PTR2. A peripheral pad portion 168L may be disposed on the capping insulating layer 140 and may be connected to the peripheral contact portion 168c. In an embodiment, the peripheral pad portion 168L may be connected to the peripheral contact portion 168c without an interface therebetween. Alternatively, the interface may exist between the peripheral pad portion 168L and the peripheral contact portion 168c. A peripheral interconnection-plug 174 may penetrate the upper interlayer insulating layer 170 in the peripheral region 60 and may be connected to the peripheral pad portion 168L. An interconnection 180 may be disposed upper interlayer insulating layer 170. The interconnection 180 may be connected to the interconnection-plug 173 connected to the cell conductive line. The interconnection 180 may laterally extend into the peripheral region 60, so as to be connected to the peripheral interconnection-plug 174. As a result, the cell conductive line 120c, 112c and 115c of the cell line pattern 127c may be electrically connected to the peripheral source/drain region PSD of the second peripheral transistor PTR2 through the interconnection 180.

In another embodiment, the interconnection 180 may be disposed at a level different from the level illustrated in FIG. 11C. For example, the interconnection 180 may be disposed at substantially the same level as the peripheral interconnection 167 of FIG. 11B and the peripheral pad portion 168L of FIG. 11C. However, embodiments are not limited thereto.

In still another embodiment, the peripheral interconnection 167 and the peripheral pad portion 168L disposed on the capping insulating layer 145 of FIGS. 11B and 11C may extend upward. Top surfaces of the upward extended peripheral interconnection 167 and peripheral pad portion 168L may be disposed at substantially the same level as the top surface of the upper interlayer insulating layer 170. In other words, the top surfaces of the upward extended peripheral interconnection 167 and peripheral pad portion 168L may be disposed at substantially the same level as top surfaces of the storage plugs 175 of FIG. 11B. In this case, the peripheral interconnection-plug 174 may be omitted, and the interconnection 180 may be connected to the extended peripheral pad portion 168L.

Figure 12:
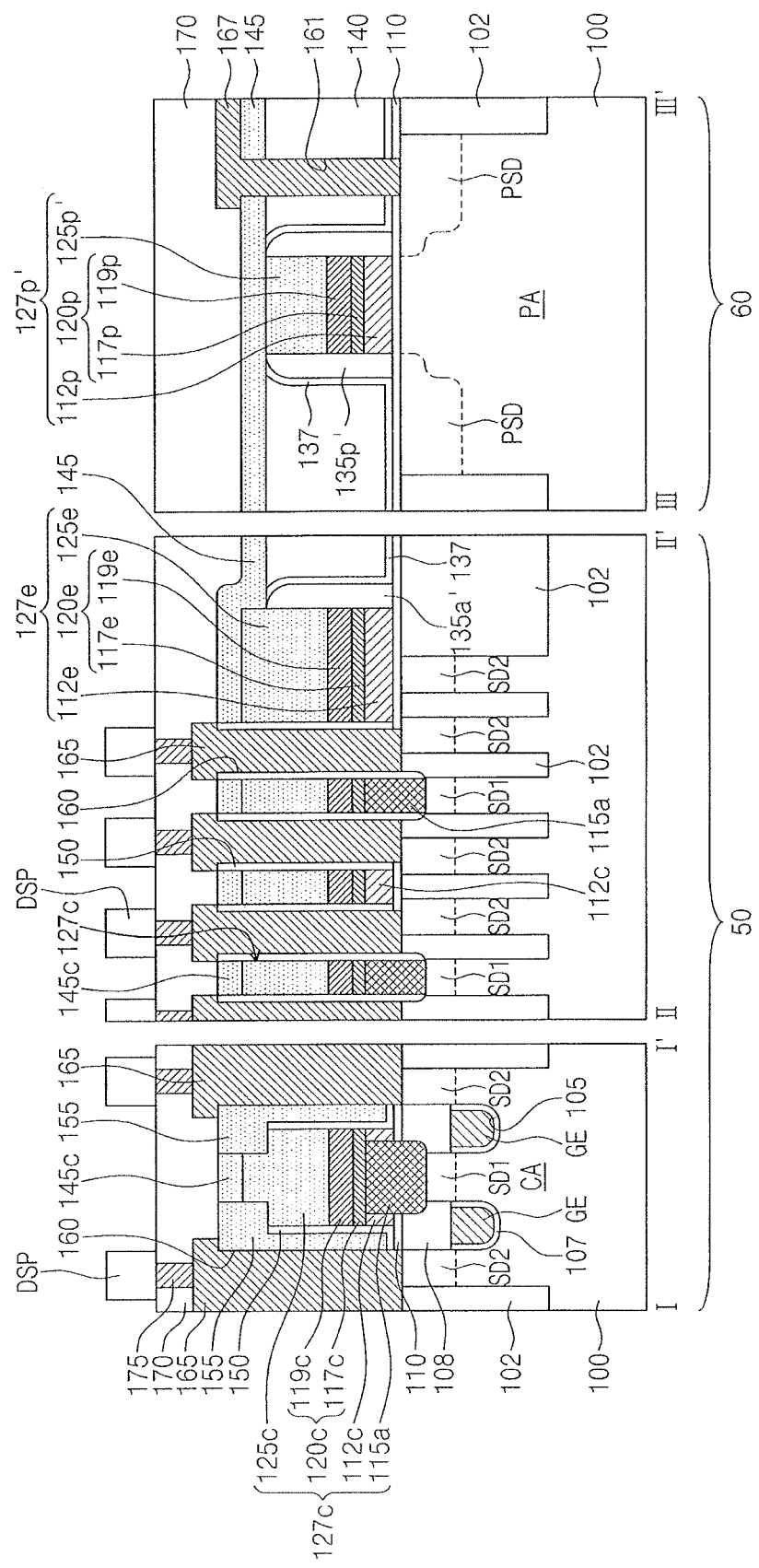
FIG. 12 illustrates a cross-sectional view of a modified example of a semiconductor device according to some embodiments.

FIG. 12 illustrates a cross-sectional view illustrating a modified example of a semiconductor device according to some embodiments.

Referring to FIG. 12, according to the present modified example, a peripheral hard mask pattern 125p' of a peripheral gate pattern 127p' may have a top surface lower than the top surface of the cell hard mask line 145c. Thus, a top end of a peripheral gate spacer 135p' may also be lower than the top surface of the cell hard mask line 145c. Additionally, a planarized top surface of the interlayer insulating layer 140 may also be lower than the top surface of the cell hard mask line 145c. As a result, a bottom surface of the capping insulating layer 145 in the peripheral region 60 may be lower than the bottom surface of the capping line pattern 145c of the cell region 50. Furthermore, a top end of a spacer 135a' disposed on the outer sidewall of the outermost cell line pattern 127e may also be lower than the top surface of the cell hard mask line 145c.

In the present modified example, the top surface of the cell conductive line of the cell line pattern 127c (i.e., the top surface of the upper conductive pattern 120c) may be substantially coplanar with the top surface of the peripheral gate electrode of the peripheral gate pattern 127p' (i.e., the top surface of the upper gate 120p).

In the processes described with reference to FIGS. 3A and 3B, a width of the peripheral hard mask pattern 125p may be very smaller than a width of the hard mask plate pattern 125a. Thus, when the conductive layer 120 and 112 is etched using the hard mask plate pattern 125a and the peripheral hard mask pattern 125p as the etch masks, the peripheral hard mask pattern 125p may be more recessed than the hard mask plate pattern 125a. As a result, the semiconductor device according to the present modified example may be realized.

Next, examples of the data storage part DSP will be described in more detail with reference to drawings.

Figure 13A:
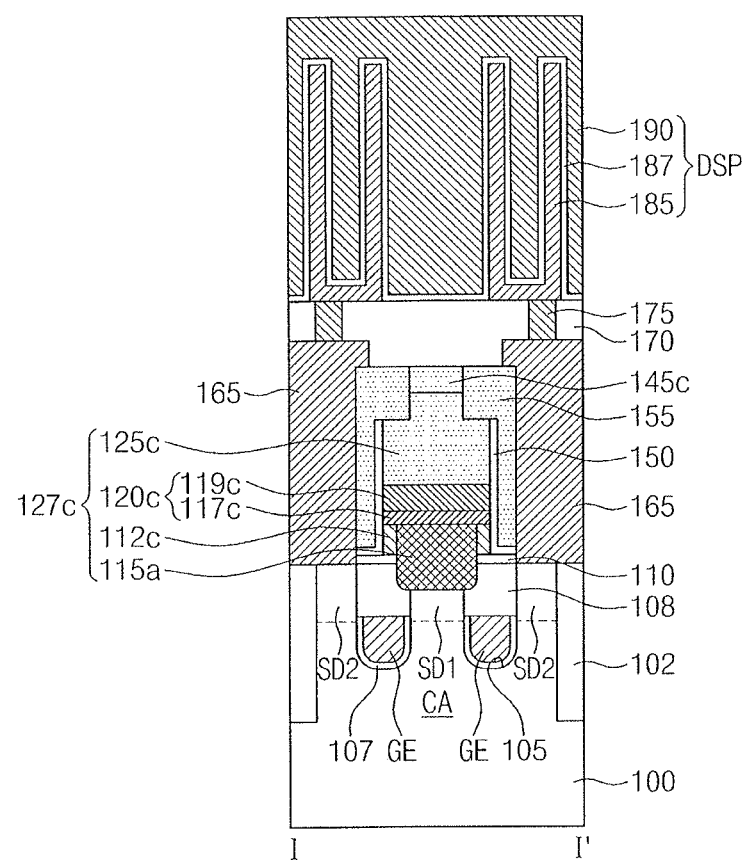
FIG. 13A illustrates a cross-sectional view of an example of a data storage part included in a semiconductor device according to embodiments.

FIG. 13A illustrates a cross-sectional view illustrating an example of a data storage part included in a semiconductor device according to embodiments.

Referring to FIG. 13A, a data storage part DSP according to the present example may be realized as a capacitor. In other words, the data storage part DSP may include a storage electrode 185, an upper electrode 190, and a capacitor dielectric layer 187 disposed between the storage electrode 185 and the upper electrode 190. The storage electrode 185 may be connected to the storage plug 175. In an embodiment, the storage electrode 185 may have a hollow cylinder shape.

In the present example, the cell conductive line of the cell line pattern 127c may correspond to a bit line.

Figure 13B:
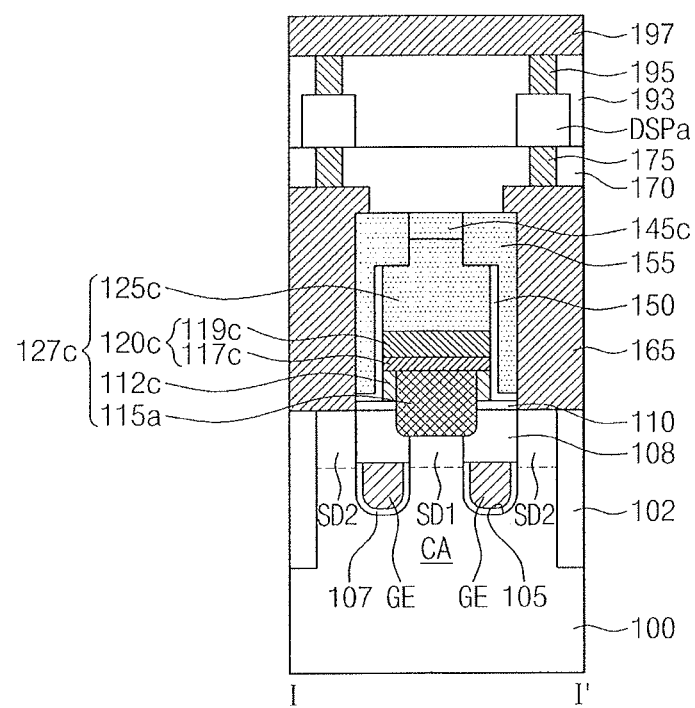
FIG. 13B illustrates a cross-sectional view of another example of a data storage part included in a semiconductor device according to embodiments.

FIG. 13B illustrates a cross-sectional view illustrating another example of a data storage part included in a semiconductor device according to embodiments.

Referring to FIG. 13B, a data storage part DSPa according to the present example may include a variable resistor. A resistance state of the variable resistor may be capable of being changed into one of a plurality of resistance states having resistance values different from each other by a programming operation.

In an embodiment, the variable resistor may be a magnetic tunnel junction (MTJ) pattern using magnetization directions. The MTJ pattern may include a reference magnetic pattern having a magnetization direction fixed in one direction, a free magnetic pattern having a magnetization direction capable of being changed to a direction parallel or anti-parallel to the magnetization direction of the reference magnetic pattern, and a tunnel barrier layer disposed between the reference and free magnetic patterns. The magnetization directions of the reference and free magnetic patterns may be perpendicular or parallel to one surface of the free magnetic pattern that is in contact with the tunnel barrier layer.

In another embodiment, the variable resistor may include a phase change material. A phase of the phase change material may be capable of being changed to an amorphous state or a crystalline state according to a temperature of heat supplied by a programming operation and/or a supplying time of the heat. The phase change material of the amorphous state may have a resistivity higher than that of the phase change material of the crystalline state. For example, the phase change material may be a compound including at least one of chalcogenide elements (e.g., tellurium (Te) and selenium (Se)).

In still another embodiment, the variable resistor may include a transition metal oxide. Due to a programming operation, an electrical path may be generated in the transition metal oxide or the electrical path in the transition metal oxide may be cut or disappear. If the electrical path is generated in the transition metal oxide, the transition metal oxide has a low resistance value. If the electrical path is cut or disappears, the transition metal oxide has a high resistance value.

A second upper interlayer insulating layer 193 may cover the data storage part DSPa including the variable resistor. An upper interconnection 197 may be disposed on the second upper interlayer insulating layer 193. The upper interconnection 197 may be electrically connected to the data storage part DSPa through an upper plug 195 penetrating the second upper interlayer insulating layer 193. The upper interconnection 197 may cross over the cell gate electrodes GE. The upper interconnection 197 may correspond to a bit line. In the present example, the cell conductive line of the cell line pattern 127c may correspond to a source line.

Second Embodiment

In the present embodiment, the same elements as described in the first embodiment will be indicated by the same reference numerals or the same reference designators. For the purpose of ease and convenience in explanation, the descriptions to the same elements as described in the first embodiment may be omitted or mentioned briefly.

FIGS. 14A to 19A illustrate plan views illustrating a method of manufacturing a semiconductor device according to other embodiments. FIGS. 14B to 19B are cross-sectional views taken along lines V-V' of FIGS. 14A to 19A, respectively.

Figure 14A:
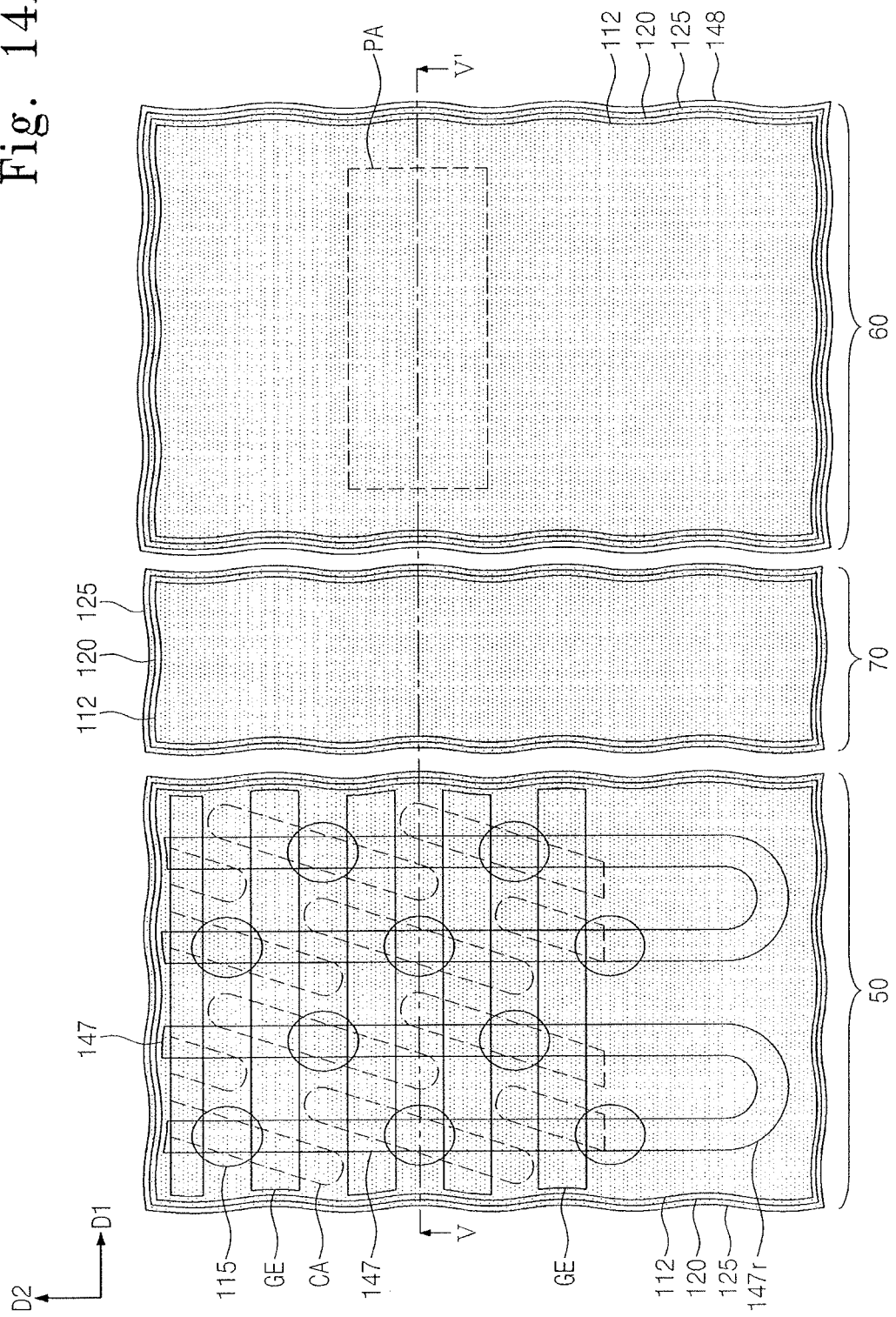
Figure 14B:
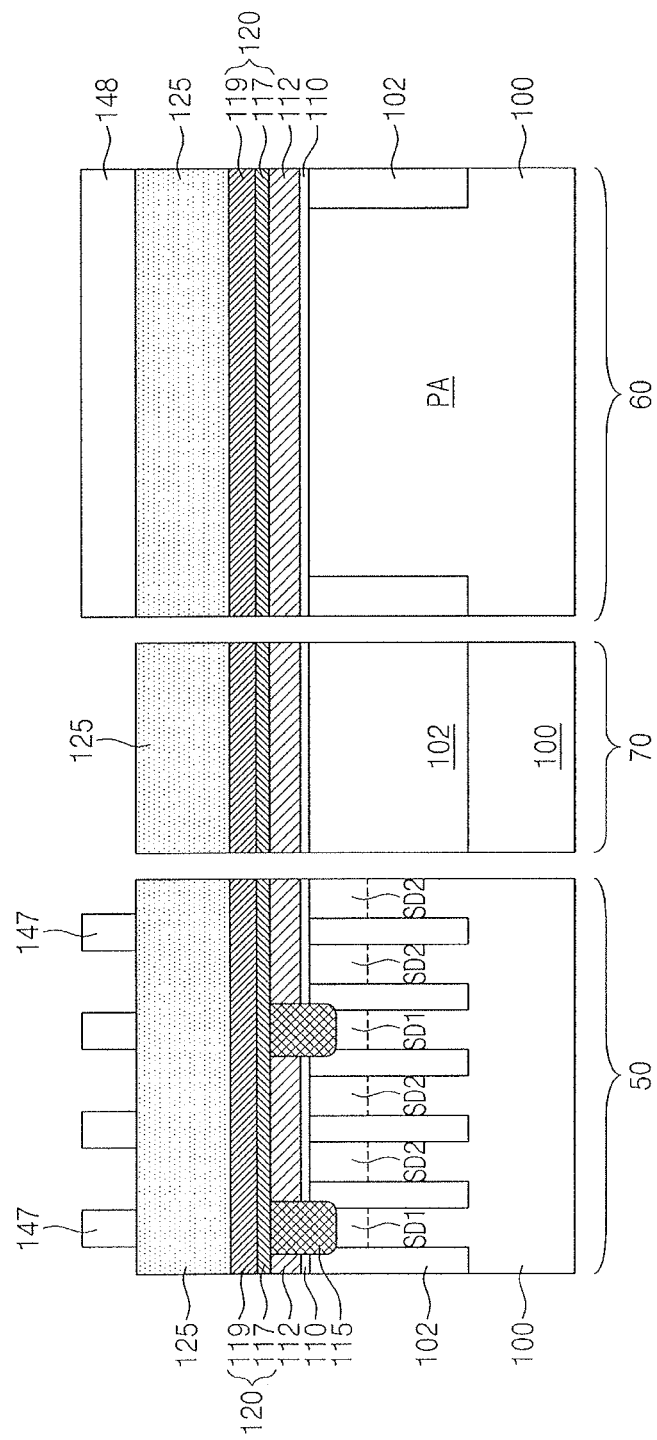

Referring to FIGS. 14A and 14B, a substrate 100 may include a cell region 50, a peripheral region 60, and a boundary region 70 disposed between the cell and peripheral regions 50 and 60. A device isolation pattern 102 may be formed on or in the substrate 100 to define cell active portions CA in the cell region 50 and a peripheral active portion PA in the peripheral region 60. At this time, the device isolation pattern 102 may be formed throughout the substrate 100 in the boundary region 70.

As described with reference to FIGS. 1A and 1B, the grooves 105, the cell gate insulating layer 107, the cell gate electrodes GE, the cell gate-capping patterns 108, and source/drain regions SD1 and SD2 may be formed in the cell region 50. Subsequently, as mentioned with reference to FIGS. 2A and 2B, the insulating layer 110, the lower conductive layer 112, the contact plugs 115, the upper conductive layer 120, and the hard mask layer 125 may be formed on the substrate 100.

Next, cell line mask patterns 147 may be formed on the hard mask layer 125 in the cell region 50. The cell line mask patterns 147 may be formed using the double patterning technique described with reference to FIGS. 4A and 4B. Thus, the cell line mask patterns 147 may be classified into a plurality of pairs, and end portions of the cell line mask patterns 147 constituting one pair may be connected to each other by a connection part 147r.

A mask pattern 148 may be formed to cover the hard mask layer 125 disposed in the peripheral region 60. At this time, the hard mask layer 125 in the boundary region 70 may be exposed. In an embodiment, the mask pattern 148 may be formed after the cell line mask patterns 147 are formed.

Figure 15A:
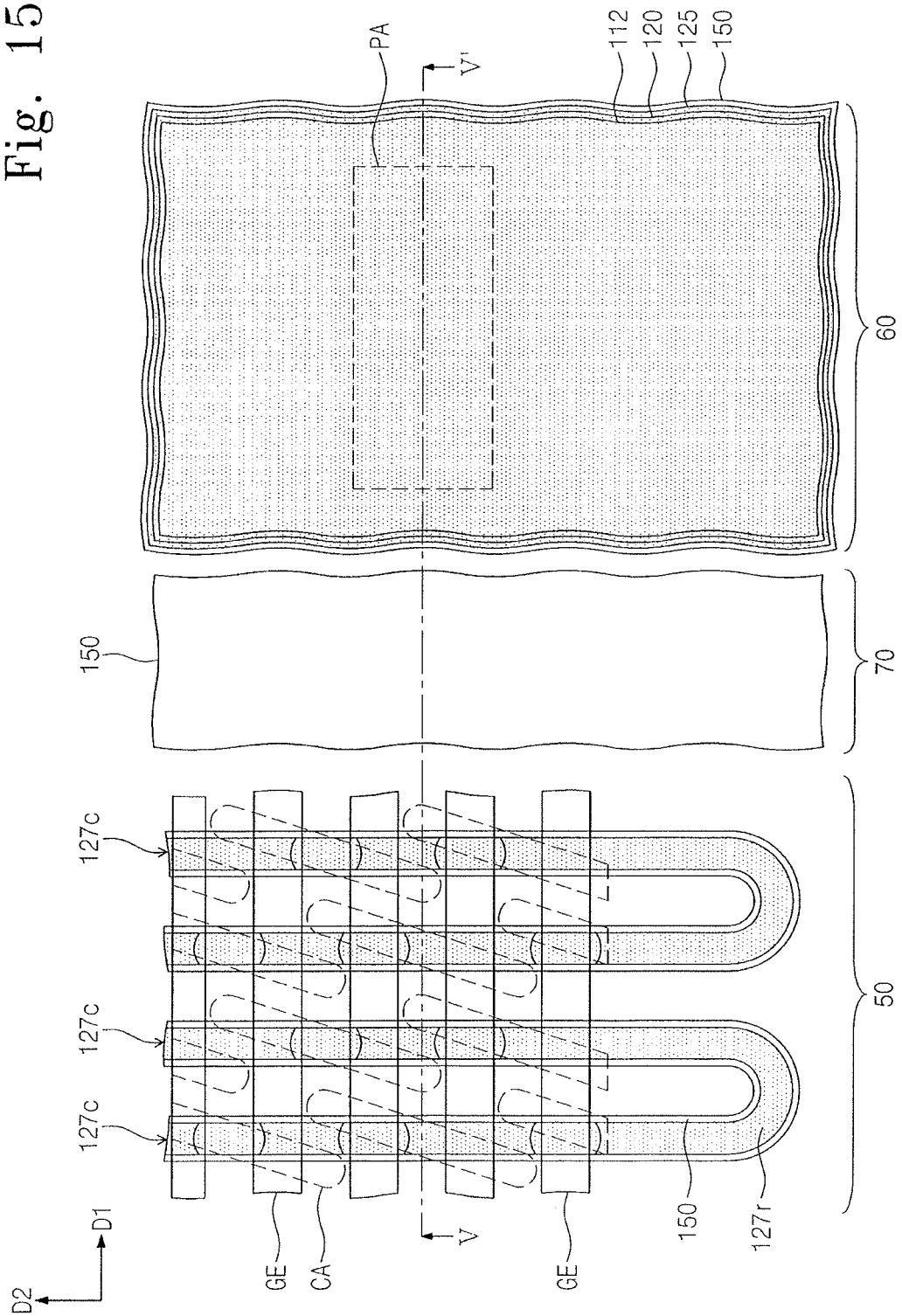
Figure 15B:
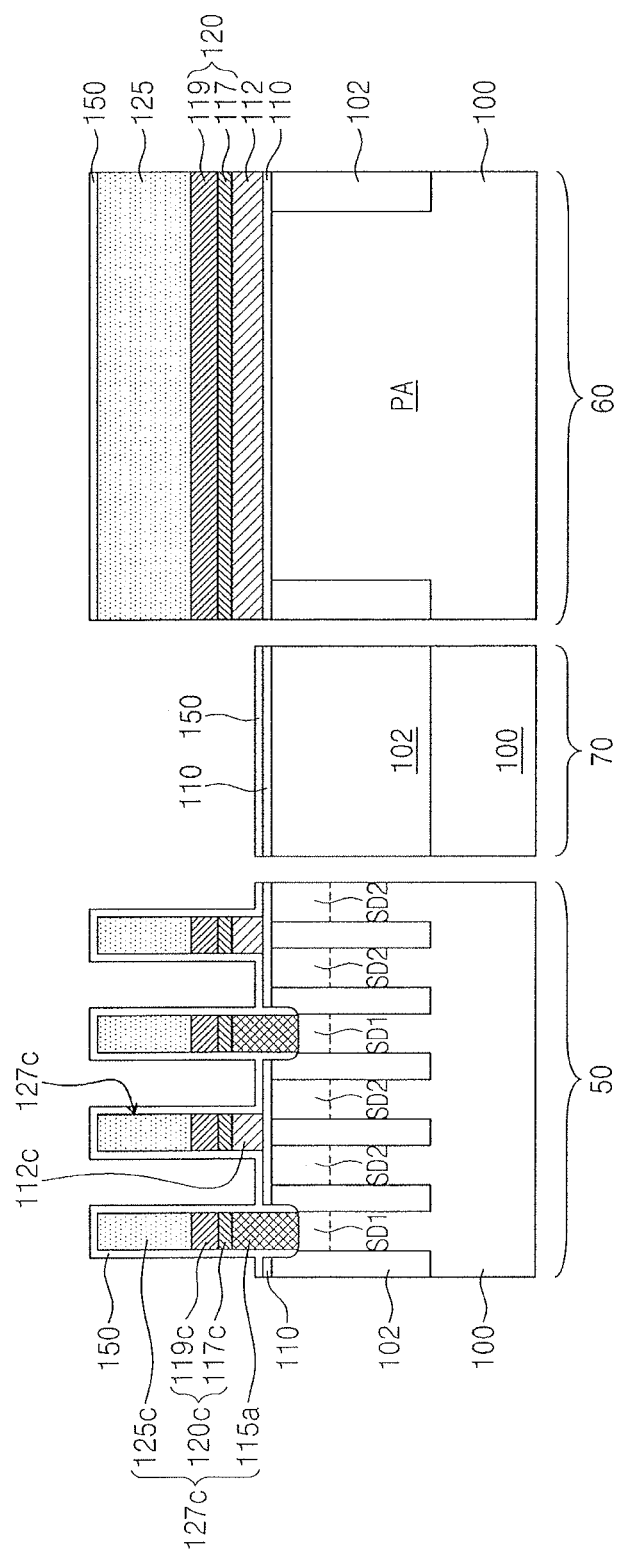

Referring to FIGS. 15A and 15B, a cell patterning process using the cell line mask patterns 147 may be performed on the hard mask layer 125, the conductive layers 120 and 112, and the contact plugs 115 in the cell region 50. At this time, the hard mask layer 125 in the peripheral region 60 may be protected by the mask pattern 148. On the contrary, the hard mask layer 125 and the conductive layers 112 and 120 in the boundary region 70 may be etched.

In more detail, the hard mask layer 125 may be etched using the cell line mask patterns 147 and the mask pattern 148 as etch masks, thereby forming cell hard mask lines 125c. At this time, the hard mask layer 125 in the peripheral region 60 may remain due to the mask pattern 148 but the exposed hard mask layer 125 in the boundary region 70 may be removed.

The upper conductive layer 120, the lower conductive layer 112, and the contact plugs 115 may be etched using the cell hard mask lines 125c and the hard mask layer 125 of the peripheral region 60 as etch masks, thereby forming cell line patterns 127c in the cell region 50. At this time, the upper conductive layer 120 and the lower conductive layer 112 in the boundary region 70 may be etched and then be removed. The stack structure of the cell line pattern 127c may be the same as described with reference to FIGS. 5A and 5B.

A line-connection part 127r may be formed under the connection part 147r of the cell line mask pattern 147, and both ends of the line-connection part 127r may be connected to end portions of the cell line patterns 127c constituting one pair, respectively.

Subsequently, a cell insulation liner 150 may be conformally formed on an entire surface of the substrate 100. The cell insulation liner 150 may conformally cover surfaces of the cell line patterns 127c and the line-connection parts 127r. Additionally, the cell insulation liner 150 may also be formed on the insulating layer 110 in the boundary region 70 and the hard mask layer 125 in the peripheral region 60.

Figure 16A:
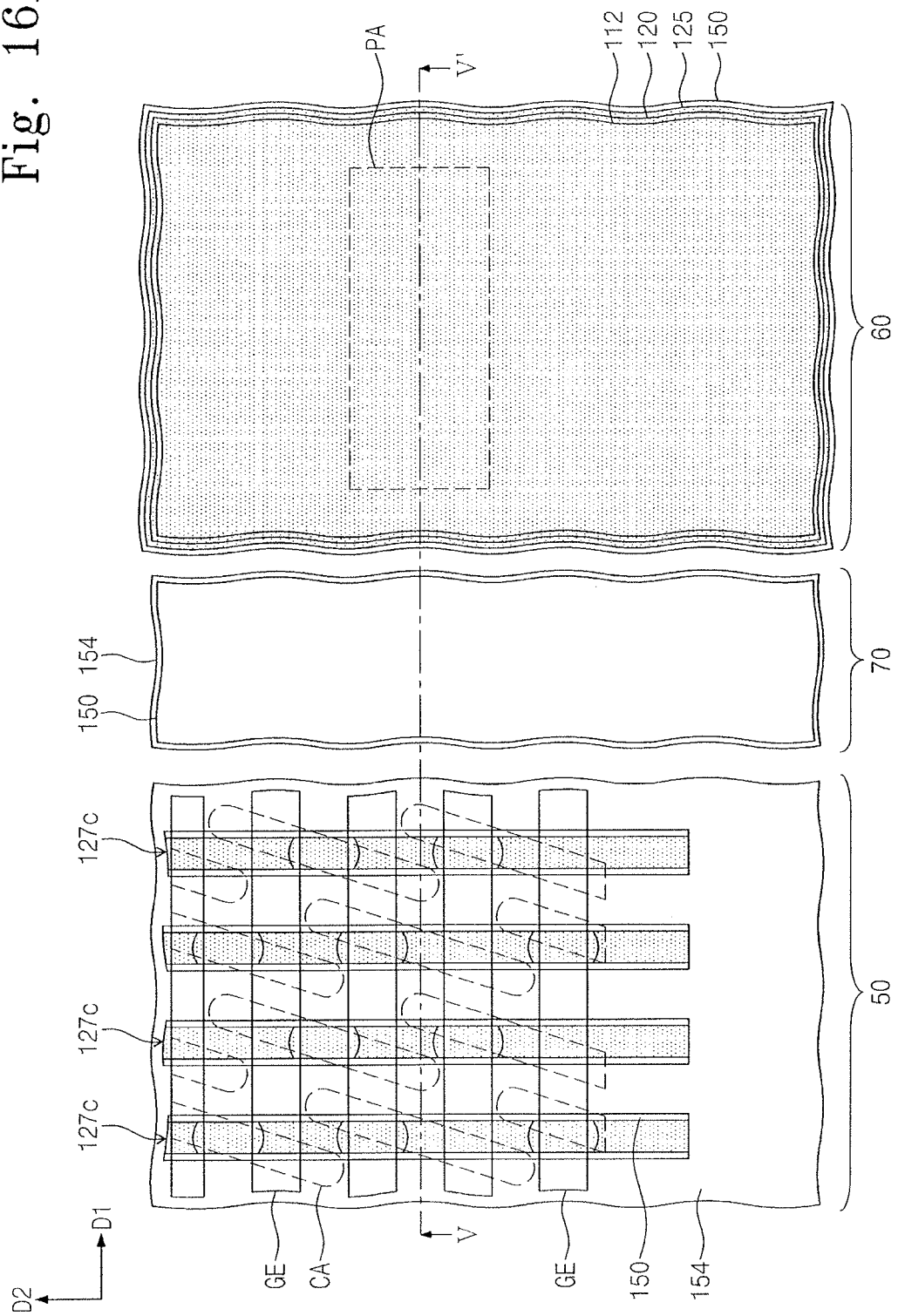
Figure 16B:
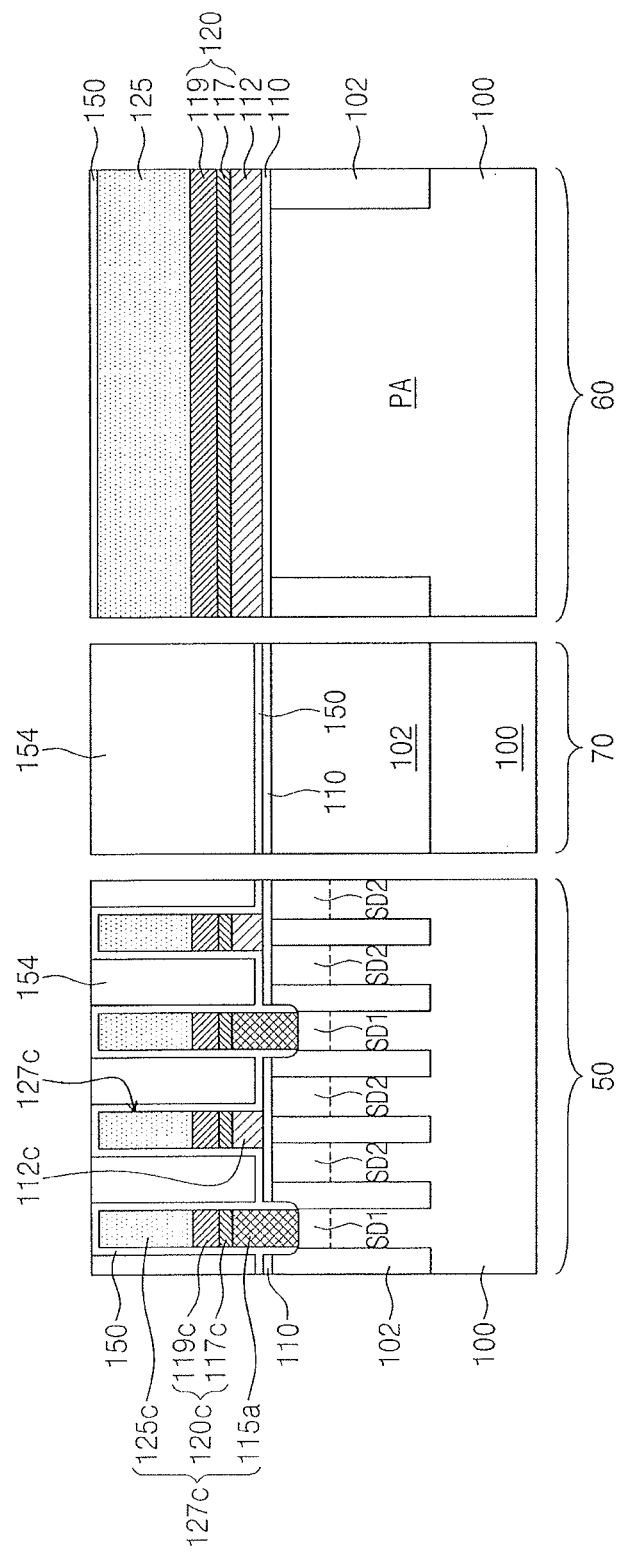

Referring to FIGS. 16A and 16B, next, the line-connection parts 127r are removed to separate the cell line patterns 127c from each other. At this time, the cell insulation liner 150 disposed on the surfaces of the line-connection parts 127r may also be removed. As a result, the cell insulation liner 150 is not disposed on an end-sidewall of the cell line pattern 127c, which is formed by the removal of the line-connection part 127r.

Next, a filling insulation layer may be formed on the substrate to fill spaces between the cell line patterns 127c. The filling insulation layer may be planarized to remove the filling insulation layer disposed on top surfaces of the cell line patterns 127c and on a top surface of the hard mask layer 125 in the peripheral region 60. At this time, the planarized filling insulation layer 154 in the cell region 50 may fill the spaces between the cell line patterns 127c and may be disposed on the substrate 100 in an edge region of the cell region 50. The planarized filling insulation layer 154 may also be formed on the cell insulation liner 150 in the boundary region 70. As illustrated in FIG. 16B, the filling insulation layer may be planarized until the cell insulation liner 150 disposed on the top surfaces of the cell line patterns 127c and the hard mask layer 125 of the peripheral region 60 is exposed. Alternatively, the filling insulation layer may be planarized until the top surfaces of the cell line patterns 127c and the hard mask layer 125 of the peripheral region 60 are exposed.

The planarized filling insulation layer 154 may be formed of an insulating material having an etch selectivity with respect to the cell insulation liner 150. For example, the cell insulation liner 150 may be formed of silicon nitride and/or silicon oxynitride, and the filling insulation layer 154 may be formed of silicon oxide.

Figure 17B:
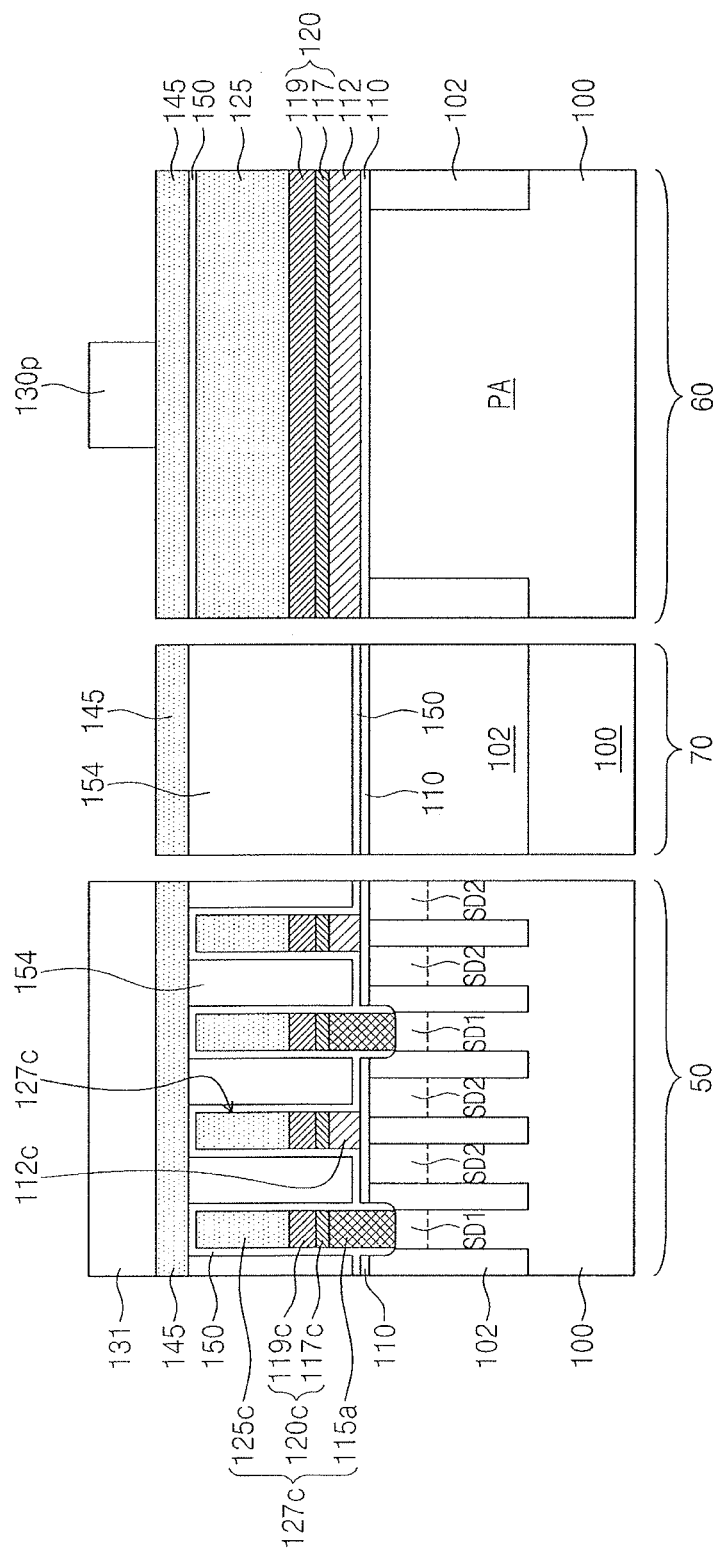

Referring to FIGS. 17A and 17B, a capping insulating layer 145 may be formed on the entire surface of the substrate 100. A peripheral gate mask pattern 130p may be formed on the capping insulating layer 145 in the peripheral region 60. The peripheral gate mask pattern 130p may cross over the peripheral active portion PA. At this time, a mask pattern 131 may be formed to cover the capping insulating layer 145 in the cell region 50. On the contrary, the capping insulating layer 145 in the boundary region 70 may be exposed. The capping insulating layer 145 may be formed of an insulating material having an etch selectivity with respect to the filling insulation layer 154. For example, the capping insulating layer 145 may be formed of silicon nitride and/or silicon oxynitride.

Figure 18A:
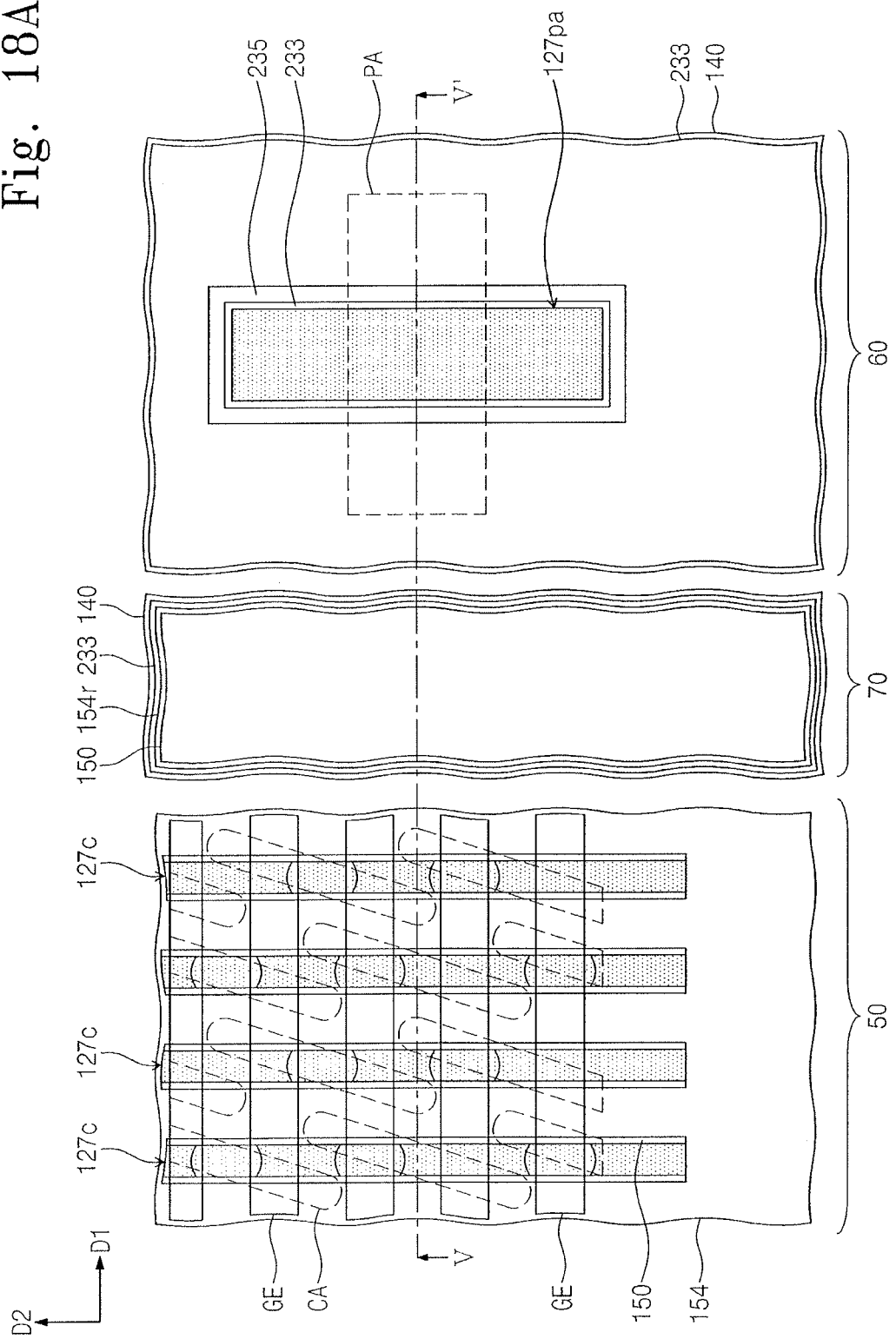
Figure 18B:
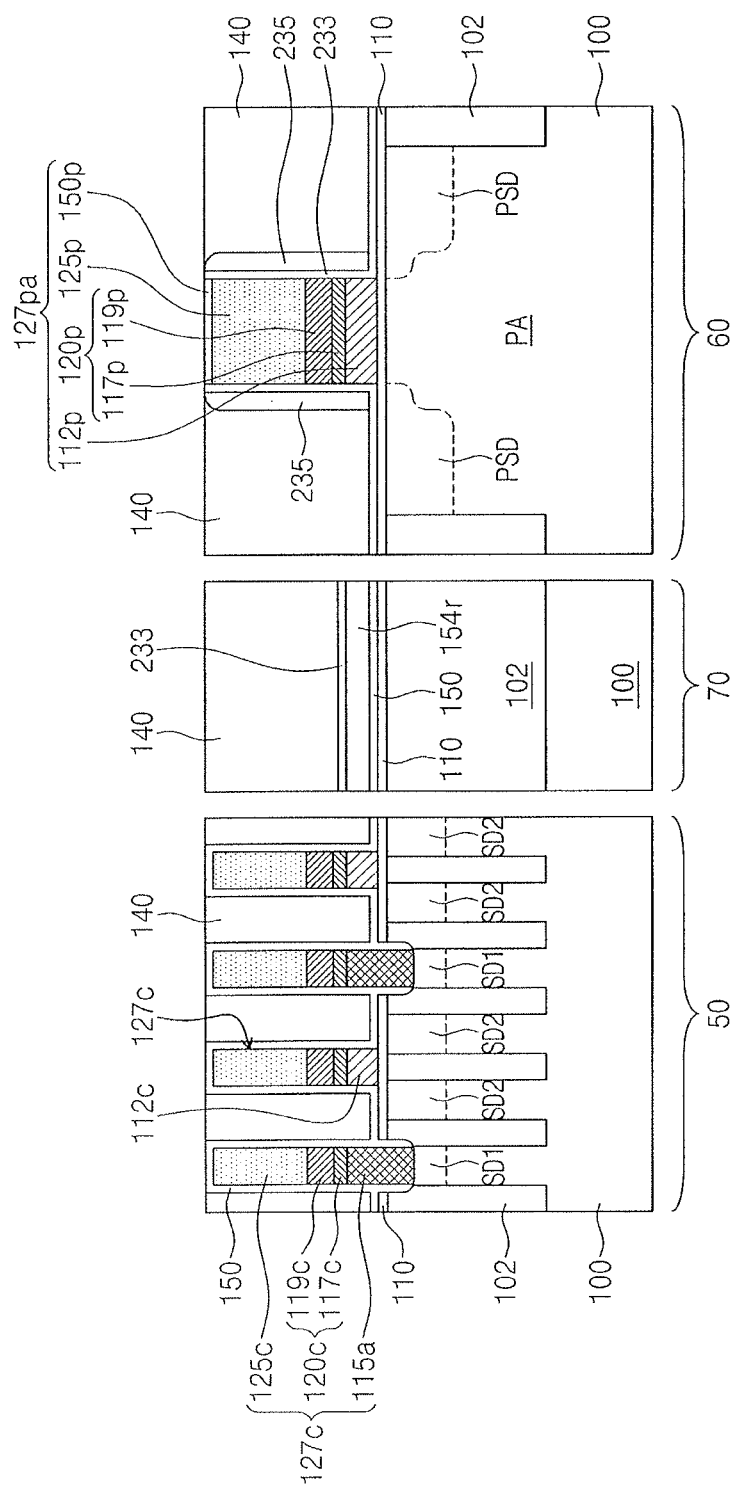

Referring to FIGS. 18A and 18B, a peripheral patterning process using the peripheral gate mask pattern 130p may be performed on the capping insulating layer 145, the cell insulation liner 150, the hard mask layer 125, and the conductive layer 120 and 112 in the peripheral region 60, so that a peripheral gate pattern 127pa is formed.

In more detail, the capping insulating layer 145, the cell insulation liner 150, and the hard mask layer 125 in the peripheral region 60 may be successively etched using the peripheral gate mask pattern 130p as an etch mask to form a peripheral hard mask pattern 125p, a liner pattern 150p, and a capping insulating pattern that are sequentially stacked. At this time, the capping insulating layer 145 in the cell region 50 may remain by the mask pattern 131. On the contrary, the capping insulating layer 145 in the boundary region 70 may be removed. Additionally, an upper portion of the planarized filling insulation layer 154 in the boundary region 70 may be recessed. Subsequently, the peripheral gate mask pattern 130p and the mask pattern 131 may be removed.

The conductive layer 120 and 112 may be etched using the capping insulating pattern, the liner pattern 150p, and the peripheral hard mask pattern 125p in the peripheral region 60 as etch masks, thereby forming a peripheral gate electrode. As described above in the first embodiment, the peripheral gate electrode may include a lower gate 112p and an upper gate 120p that are sequentially stacked. When the conductive layer 120 and 112 of the peripheral region 60 are etched, the filling insulation layer 154 in the boundary region 70 may be more recessed. Finally, after the peripheral gate electrode is formed, a portion 154r of the planarized filling insulation layer may remain in the boundary region 70. The remaining portion 154r of the filling insulation layer in the boundary region 70 is defined as a residual insulating layer 154r.

In an embodiment, when the conductive layer 120 and 112 in the peripheral region 60 is etched, the capping insulating pattern of the peripheral region 60 may be removed. At this time, the capping insulating layer 145 in the cell region 50 may also be removed. Thus, the planarized filling insulation layer 154 in the cell region 50 may be exposed. As illustrated in FIG. 18B, the liner pattern 150p may remain on the peripheral hard mask pattern 125p after the capping insulating pattern of the peripheral region 60 and the capping insulating layer 145 of the cell region 50 are removed. Thus, peripheral gate pattern 127pa may include the peripheral gate electrode, the peripheral hard mask pattern 125p, and the liner pattern 150p that are sequentially stacked. Alternatively, when the capping insulating pattern and the capping insulating layer are removed, the liner pattern 150p and the cell insulation liner 150p on the top surfaces of the cell line patterns 127c may also be removed.

Peripheral source/drain regions PSD may be formed in the peripheral active portion PA at both sides of the peripheral gate pattern 127pa, respectively.

Subsequently, a peripheral insulation liner 233 may be conformally formed on the entire surface of the substrate 100. The peripheral insulation liner 233 may be conformally formed along a profile in the peripheral region 60. Additionally, the peripheral insulation liner 233 may cover the residual insulating layer 154r in the boundary region 70 and the cell line patterns 127c and the planarized filling insulation layer 154 in the cell region 50. The peripheral insulation liner 233 is formed of an insulating material having an etch selectivity with respect to the residual insulating layer 154r. For example, the peripheral insulation liner 233 may be formed of silicon nitride and/or silicon oxynitride.

A peripheral gate spacer 235 may be formed on a sidewall of the peripheral gate pattern 127c. In an embodiment, the peripheral gate spacer 235 may be formed of an insulating material having an etch selectivity with respect to the peripheral insulation liner 233. For example, the peripheral gate spacer 235 may be formed of silicon oxide.

In another embodiment, the peripheral insulation liner 233 may be formed after the peripheral gate spacer 235 is formed.

Subsequently, an interlayer insulating layer may be formed on the substrate 100. The interlayer insulating layer may be planarized until the peripheral insulation liner 233 in the cell region 50 and the peripheral insulation liner 234 on the top surface of the peripheral gate pattern 127pa are exposed. Thus, the planarized interlayer insulating layer 140 may be formed on the substrate 100 around the peripheral gate pattern 127pa in the peripheral region 60. Additionally, the planarized interlayer insulating layer 140 may also be formed on the peripheral insulation liner 233 in the boundary region 70. The planarized interlayer insulating layer 140 may be formed of an insulating material having an etch selectivity with respect to the peripheral insulation liner 233. For example, the planarized interlayer insulating layer 140 may be formed of silicon oxide.

Next, the peripheral insulation liner 233 in the cell region 50 may be removed to expose the planarized filling insulation layer 154 in the cell region 50. At this time, the peripheral insulation liner 233 on the top surface of the peripheral gate pattern 127pa may also be removed.

In another embodiment, after the peripheral gate pattern 127pa is formed, the capping insulating pattern may remain on the peripheral gate pattern 127pa and the capping insulating layer 145 may remain in the cell region 50. In this case, after the planarized interlayer insulating layer 140 is formed, the peripheral insulation liner 233 and the capping insulating layer 145 in the cell region 50 may be removed to expose the planarized filling insulation layer 154 disposed in the cell region 50. At this time, the peripheral insulation liner 233 and the capping insulating pattern on the top surface of the peripheral gate pattern 127pa may also be removed.

Figure 19A:
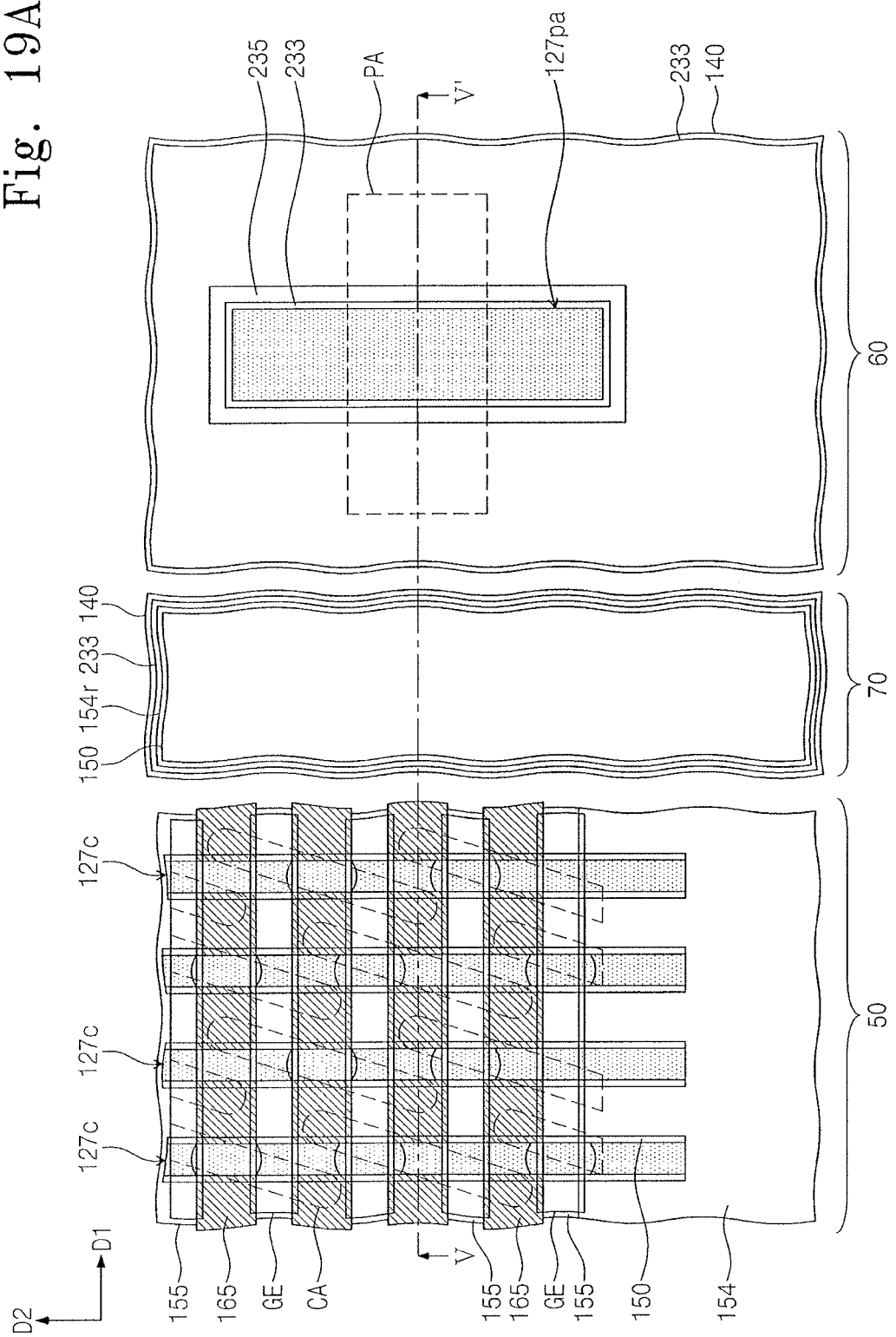
Figure 19B:
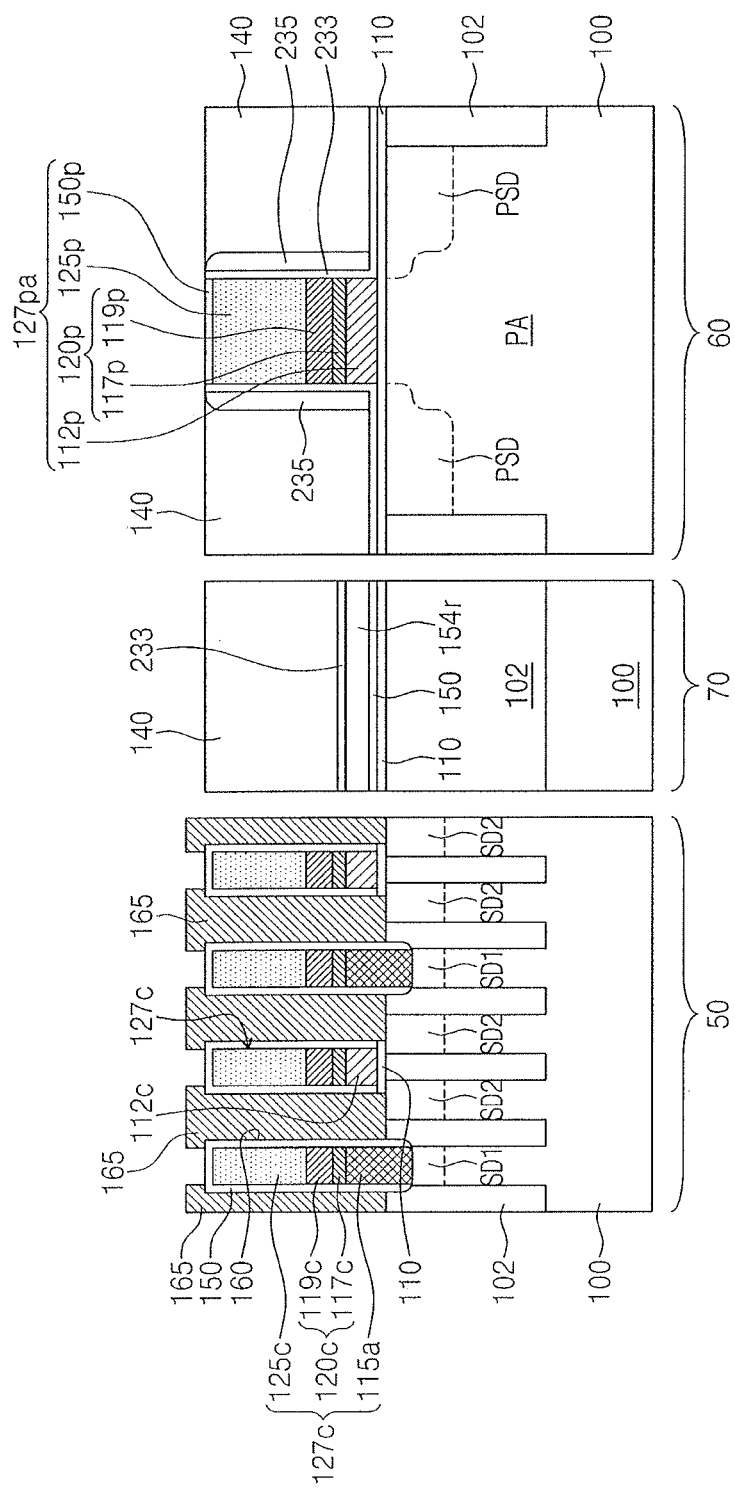

Referring to FIGS. 19A and 19B, insulating fences 155 may be formed to cross the cell line patterns 127c. The insulating fences 155 may extend in parallel to each other along the first direction D1. The planarized filling insulation layer 154 between the cell line patterns 127c may be divided into a plurality of filling insulation pillars by the insulating fences 155. The insulating fences 155 may overlap with the cell gate electrodes GE, respectively. The insulating fences 155 may be formed by the same method as the first embodiment described above. However, the outermost insulating fence of the first embodiment may not be required in the present embodiment.

The filling insulation pillars may be removed by a selective etching process to form holes 160. At this time, the planarized filling insulation layer 154 in the edge region of the cell region 50 and the planarized interlayer insulating layer 140 in the boundary and peripheral regions 70 and 60 may be protected by a mask pattern (not shown) used in the selective etching process. The cell insulation liner 150 and the insulating layer 110 under the holes 160 may be removed to expose the second source/drain regions SD2, and then cell contact pillars 165 may be formed in the holes 160, respectively.

Subsequent processes after this will be described with reference to FIGS. 20A and 20B. A first upper interlayer insulating layer 270 may be formed on the substrate 100. A first interconnection-plug 275 may be formed to penetrate the first upper interlayer insulating layer 270, the peripheral insulation liner 233, and the insulating layer 110 in the peripheral region 60. The first interconnection-plug 275 may be connected to the peripheral source/drain region PSD. A second interconnection-plug 276 may be formed to penetrate the first upper interlayer insulating layer 270 and the cell hard mask line 125c in the cell region 50. The second interconnection-plug 276 may be connected to the cell conductive line of the end portion of the cell line pattern 127c. A peripheral interconnection 280 may be formed on the first upper interlayer insulating layer 270 in the peripheral region 60, so as to be connected to the first interconnection-plug 275. A cell interconnection 281 may be formed on the first upper interlayer insulating layer 270, so as to be connected to the second interconnection-plug 276.

A second upper interlayer insulating layer 285 may be formed on the entire surface of the substrate 100. Storage plugs 290 may be formed to successively penetrate the second and first upper interlayer insulating layers 285 and 270 in the cell region 50. The storage plugs 290 may be connected to the cell contact pillars 165, respectively. Data storage parts DSP may be formed on the second upper interlayer insulating layer 285 in the cell region 50. The data storage parts DSP may be connected to the storage plugs 290, respectively. The data storage part DSP may be realized as the data storage part DSP of FIG. 13A or the data storage part DSPa of FIG. 13B.

According to the method of manufacturing the semiconductor device described above, after the cell patterning process is performed, the peripheral patterning process is performed. Thus, the cell patterning process is performed independently from the peripheral patterning process. As a result, optimized cell line patterns 127c and an optimized peripheral gate pattern 127pa may be realized to improve reliability of the semiconductor device.

Next, the semiconductor device according to the present embodiment will be described. Hereinafter, duplicate descriptions in the aforementioned manufacture method and first embodiment will be omitted or mentioned briefly for the purpose of ease and convenience in explanation.

Figure 20B:
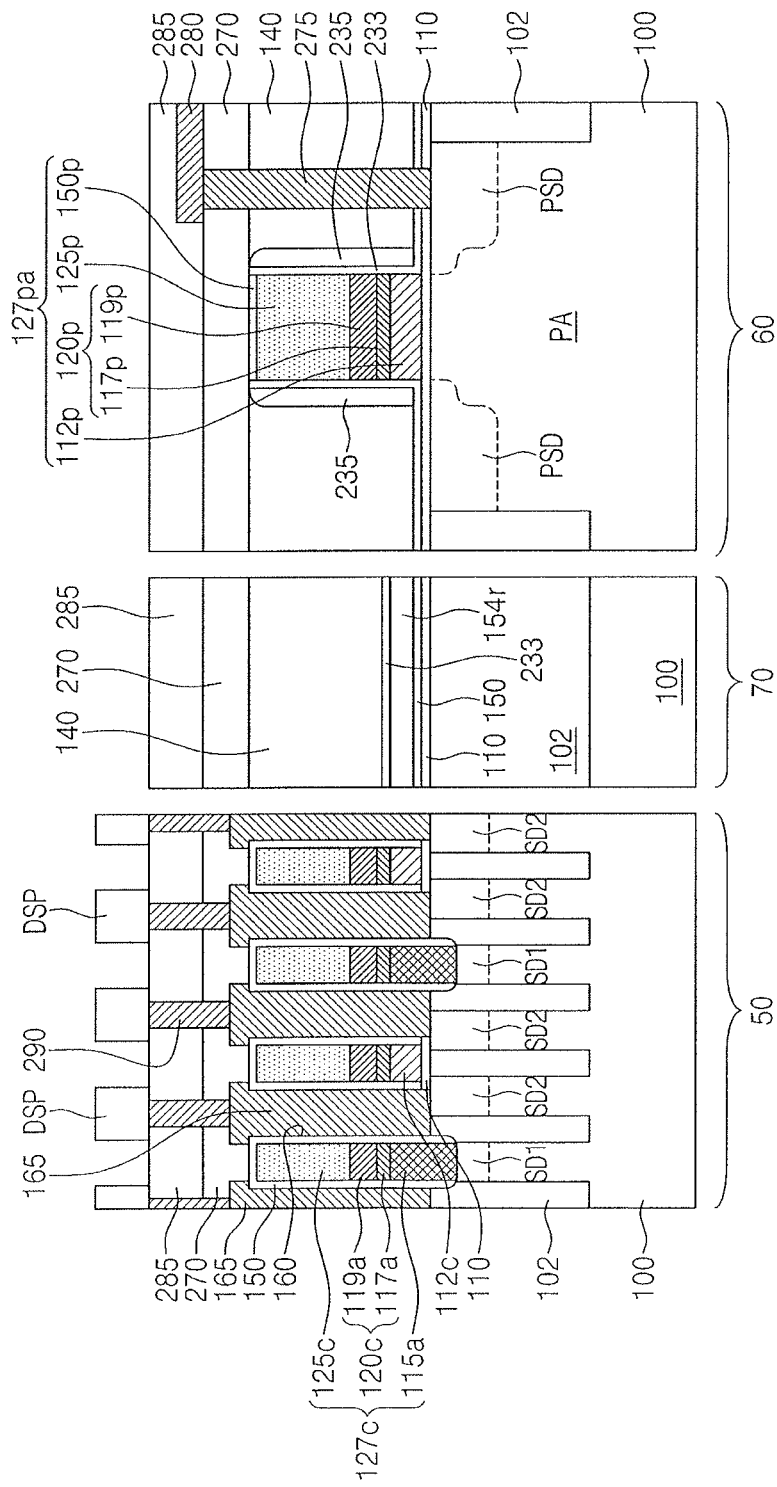
FIG. 20B a cross-sectional view taken along line V-V' of FIG. 20A.

FIG. 20A illustrates plan view illustrating a semiconductor device according to other embodiments. FIG. 20B a cross-sectional view taken along a line V-V' of FIG. 20A.

Referring to FIGS. 20A and 20B, the cell region 60 of the substrate 100 may include the cell gate electrodes GE buried in the grooves and the cell line patterns 127c disposed on the substrate 100. The peripheral region 60 of the substrate 100 may include the peripheral gate pattern 127pa crossing over the peripheral active portion PA.

The cell insulation liner 150 may be disposed on both sidewalls of the cell line pattern 127c that extend in a longitudinal direction of the cell line pattern 127c. The cell insulation liner 150 may extend onto the substrate 100 of the boundary region 70. The peripheral insulation liner 233 may be disposed on the sidewall of the peripheral gate pattern 127pa. The peripheral insulation liner 233 may extend onto the extending portion of the cell insulation liner 150 in the boundary region 70. The residual insulating layer 154r may be disposed between the extending portion of the cell insulation liner 150 and the extending portion of the peripheral insulation liner 233 in the boundary region 70. Each of the cell and peripheral insulation liners 150 and 233 has the etch selectivity with respect to the residual insulating layer 154r.

As described above, the cell insulation liner 150 in the cell region 50 covers the both sidewalls of the cell line pattern 127c that extend in the second direction D2. On the contrary, the cell insulation liner 150 in the cell region 50 does not cover the end-sidewall of the cell line pattern 127c that extends in a direction different from the second direction D2.

The top surface of the cell conductive line of the cell line pattern 127c (i.e., the top surface of the upper conductive pattern 120c) may be disposed at substantially the same level (or the same height) as the top surface of the peripheral gate electrode of the peripheral gate pattern 127pa (i.e., the top surface of the upper gate 120p).

The semiconductor devices in the aforementioned embodiments may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 21:
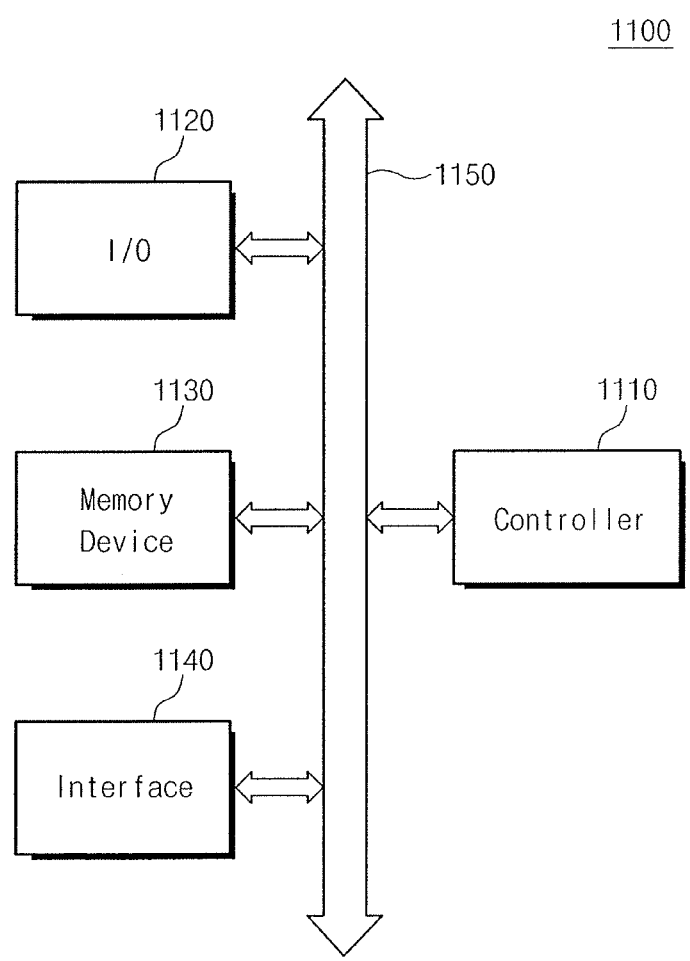
FIG. 21 illustrates a schematic block diagram of an example of electronic systems including semiconductor devices according to embodiments.

FIG. 21 illustrates a schematic block diagram illustrating an example of electronic systems including semiconductor devices according to embodiments.

Referring to FIG. 21, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or one of other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices according to the embodiments described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 22:
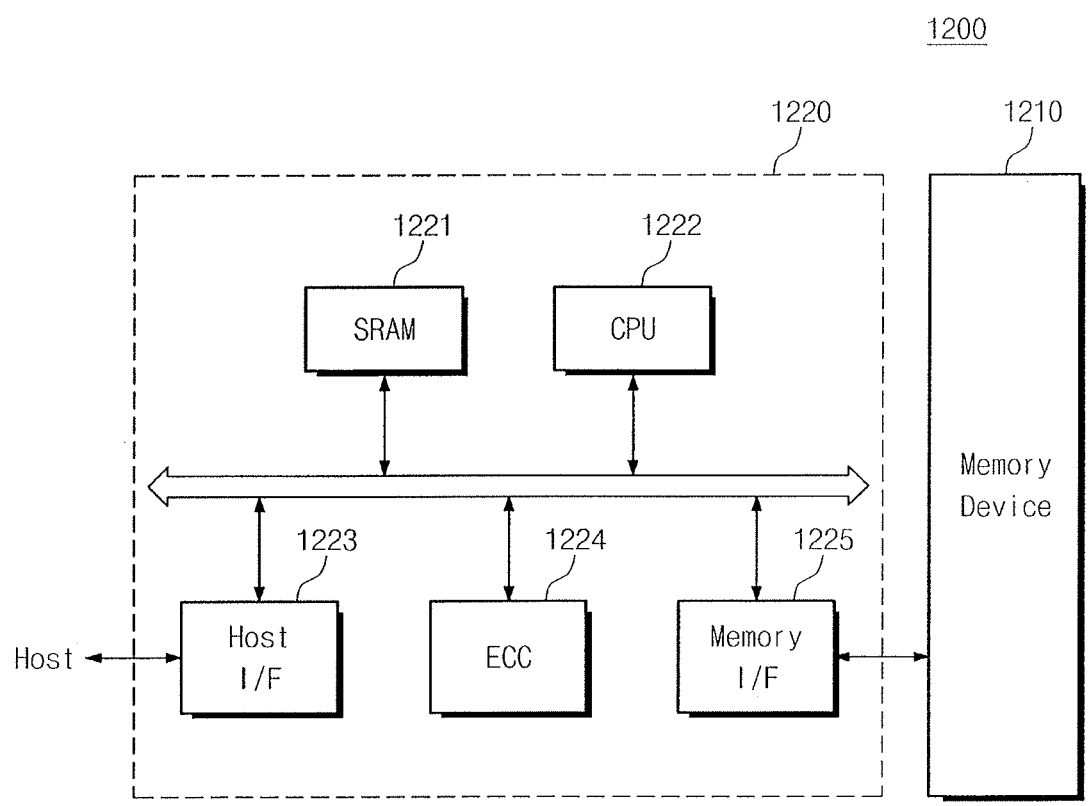
FIG. 22 illustrates a schematic block diagram of an example memory card including semiconductor devices according to embodiments.

FIG. 22 illustrates a schematic block diagram illustrating an example of memory cards including semiconductor devices according to embodiments.

Referring to FIG. 22, a memory card 1200 according to an embodiment may include a memory device 1210. The memory device 1210 may include at least one of the semiconductor devices according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

As described above, the peripheral patterning process performed on the hard mask layer and the conductive layer in the peripheral region is performed independently from the cell patterning process performed on the hard mask layer and the conductive layer in the cell region. Thus, the condition of the etching process of the cell patterning process may be controlled to optimize the profile of the cell line pattern, and the condition of the etching process of the peripheral patterning process may be controlled to optimize the profile of the peripheral gate pattern. As a result, the optimized cell line pattern and the optimized peripheral gate pattern may be realized to improve the reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a cell region and a peripheral region;
a cell gate electrode buried in a groove crossing a cell active portion of the cell region;
a cell line pattern crossing over the cell gate electrode, the cell line pattern connected to a first source/drain region in the cell active portion at a side of the cell gate electrode;
a capping line pattern on a top surface of the cell line pattern, a width of a bottom surface of the capping line pattern being substantially equal to a width of the top surface of the cell line pattern;
an outermost cell line pattern on the substrate at a side of the cell line pattern, the outermost cell line pattern having a first sidewall adjacent to the cell line pattern and a second sidewall opposite to the first sidewall;
first cell insulation liners on opposite sidewalls of the cell line pattern;
a second cell insulation liner having a first thickness on the first sidewall of the outermost cell line pattern;
a spacer having a second thickness on the second sidewall of the outermost cell line pattern, the second thickness being greater than the first thickness;
a peripheral gate pattern crossing over a peripheral active portion of the peripheral region;
a peripheral gate spacer on a sidewall of the peripheral gate pattern, the peripheral gate spacer including a same material as the spacer;
a capping insulating layer on a top surface of the outermost cell line pattern and a top surface of the peripheral gate pattern, the capping insulating layer having a lateral sidewall aligned with the first sidewall of the outermost cell line pattern; and
a planarized interlayer insulating layer under the capping insulating layer and between the peripheral gate pattern and the outermost cell line pattern,
wherein the cell line pattern includes a cell conductive line and a cell hard mask line which are sequentially stacked, the width of the bottom surface of the capping line pattern being substantially equal to a width of a top surface of the cell hard mask line,
wherein the peripheral gate spacer has a third thickness on a sidewall of the peripheral gate pattern, and the third thickness is substantially equal to the second thickness of the second spacer, and
wherein the capping insulating layer has a top surface at a same level as the top surface of the second cell insulation liner.

2. The semiconductor device as claimed in claim 1, wherein the first cell insulation liners include a same material as the second cell insulation liner, and each of the first cell insulation liners has a fourth thickness that is substantially equal to the first thickness of the second cell insulation liner.

3. The semiconductor device as claimed in claim 1, wherein each of the spacer and the peripheral gate spacer includes at least two spacer layers.

4. The semiconductor device as claimed in claim 1, wherein a width of the outermost cell line pattern is greater than a width of the cell line pattern.

5. The semiconductor device as claimed in claim 1,
wherein the capping insulating layer includes a same material as the capping line pattern, a width of a bottom surface of the capping insulating layer being greater than a width of the top surface of the outermost cell line pattern.

6. The semiconductor device as claimed in claim 5, wherein the second cell insulation liner extends above the top surface of the outermost cell line pattern along a lateral sidewall of the capping insulating layer.

7. The semiconductor device as claimed in claim 1, further comprising:
a cell contact pillar connected to a second source/drain region in the cell active portion at a side of the cell gate electrode; and
a data storage pattern electrically connected to the cell contact pillar.

8. The semiconductor device as claimed in claim 1, wherein the second cell insulation liner extends above the spacer relative to the substrate, and contacts with a sidewall of the capping insulating layer.

9. The semiconductor device as claimed in claim 1, wherein the planarized interlayer insulating layer has a top surface at a same level as the top surface of the spacer and the top surface of the peripheral gate spacer.

10. The semiconductor device as claimed in claim 1, wherein the top surface of the capping insulating layer is at a substantially same level or a higher level than a top surface of the spacer and a top surface of the peripheral gate spacer.

11. The semiconductor device as claimed in claim 1, further comprising:
an interconnection-plug electrically connected to an end portion of the cell line pattern; and
an interconnection connected to the interconnection-plug.

12. The semiconductor device as claimed in claim 1, wherein the first cell insulation liners and the second cell insulation liner include at least two spacer layers, the at least two spacer layers including different materials.

13. A semiconductor device, comprising:
a substrate including a cell region and a peripheral region;
a cell gate electrode buried in a groove crossing a cell active portion of the cell region;
a cell line pattern crossing over the cell gate electrode;
an outermost cell line pattern on the substrate at a side of the cell line pattern, the outermost cell line pattern having a first sidewall adjacent to the cell line pattern and a second sidewall opposite to the first sidewall;
a cell insulation liner having a first thickness on the first sidewall of the outermost cell line pattern;
a spacer having a second thickness on the second sidewall of the outermost cell line pattern;
a peripheral gate pattern crossing over a peripheral active portion of the peripheral region;
a peripheral gate spacer on a sidewall of the peripheral gate pattern; and
a capping insulating layer on a top surface of the outermost cell line pattern and a top surface of the peripheral gate pattern, a top surface of the capping insulating layer being at a substantially same level with a top surface of the cell insulation liner,
wherein the peripheral gate spacer includes a same material as the spacer,
wherein the peripheral gate spacer has a third thickness on a sidewall of the peripheral gate pattern, and the third thickness is substantially equal to the second thickness of the second spacer,
wherein the top surface of the capping insulating layer is at a higher level than a top surface of the spacer, and
wherein the top surface of the cell insulation liner is at a higher level than the top surface of the spacer.

14. The semiconductor device as claimed in claim 13, further comprising a planarized interlayer insulating layer on the substrate between the outermost cell line pattern and the peripheral gate pattern,
wherein a top surface of the planarized interlayer insulating layer is located at substantially the same level as a top surface of the cell line pattern.

15. The semiconductor device as claimed in claim 14, wherein the capping insulating layer covers the top surface of the planarized interlayer insulating layer, the top surface of the spacer, and a top surface of the peripheral gate spacer.

16. The semiconductor device as claimed in claim 14, wherein the capping insulating layer includes an insulating material having an etch selectivity with respect to the planarized interlayer insulating layer.

17. The semiconductor device as claimed in claim 13, further comprising a capping line pattern on a top surface of the cell line pattern,
wherein the capping line pattern includes a same material as the capping insulating layer.

18. The semiconductor device as claimed in claim 13, wherein the cell insulation liner extends above the top surface of the outermost cell line pattern and contacts with a lateral sidewall of the capping insulating layer.

19. The semiconductor device as claimed in claim 13, wherein the cell insulation liner includes at least two spacer layers, the at least two spacer layers including different materials.

20. A semiconductor device, comprising:
a substrate including a cell region and a peripheral region;
a cell gate electrode buried in a groove crossing a cell active portion of the cell region;
a cell line pattern crossing over the cell gate electrode, the cell line pattern connected to a first source/drain region in the cell active portion at a side of the cell gate electrode;
a capping line pattern on a top surface of the cell line pattern;
an outermost cell line pattern on the substrate at a side of the cell line pattern, the outermost cell line pattern having a width greater than that of the cell line pattern, and the outermost cell line pattern having a first sidewall adjacent to the cell line pattern and a second sidewall opposite to the first sidewall;
a peripheral gate pattern crossing over a peripheral active portion of the peripheral region;
first cell insulation liners on opposite sidewalls of the cell line pattern;
a second cell insulation liner on the first sidewall of the outermost cell line pattern;
a spacer on the second sidewall of the outermost cell line pattern;
a peripheral gate spacer on a sidewall of the peripheral gate pattern;
a planarized interlayer insulating layer extending from the spacer to the peripheral gate spacer between the outermost cell line pattern and the peripheral gate pattern on the substrate;

a capping insulating layer on a top surface of the outermost cell line pattern, a top surface of the peripheral gate pattern, and a top surface of the planarized interlayer insulating layer;

a cell contact pillar connected to a second source/drain region in the cell active portion at a side of the cell gate electrode and at a side of the cell line pattern; and a data storage pattern electrically connected to the cell contact pillar, wherein the capping insulating layer is at a higher level than the spacer and the peripheral gate spacer, wherein the second cell insulation liner extends to between the capping insulating layer and the capping line pattern, wherein a top surface of the second cell insulation liner is at a higher level than a top surface of the spacer, and wherein the capping insulating layer has a lateral sidewall aligned with the first sidewall of the outermost cell line pattern.

21. The semiconductor device as claimed in claim 20, wherein the second cell insulation liner includes a same material as the first cell insulation liners, and wherein the spacer includes a same material as the peripheral gate spacer.

22. The semiconductor device as claimed in claim 20, wherein the second cell insulation liner extends above the outermost cell line pattern along the lateral sidewall of the capping insulating layer, and the capping insulating layer covers the top of the spacer.

23. The semiconductor device as claimed in claim 20, wherein the cell line pattern includes a cell conductive line and a cell hard mask line which are sequentially stacked, wherein the peripheral gate pattern includes a peripheral gate electrode and a peripheral hard mask pattern which are sequentially stacked, and wherein a top surface of the cell conductive line is at a substantially same level as a top surface of the peripheral gate electrode.

24. The semiconductor device as claimed in claim 23, wherein the peripheral gate pattern includes a peripheral gate electrode and a peripheral hard mask pattern which are sequentially stacked, wherein the cell conductive line includes a same conductive material as the peripheral gate electrode, wherein the cell hard mask line includes a same insulating material as the peripheral hard mask pattern.

25. The semiconductor device as claimed in claim 20, wherein the lateral sidewall of the capping insulating layer is aligned with the first sidewall of the outermost cell line pattern.

26. The semiconductor device as claimed in claim 20, wherein:

the second cell insulation liner has a first thickness, the spacer having a second thickness greater than the first thickness, and the peripheral gate spacer having a third thickness, wherein the second thickness is greater than the first thickness, and wherein the third thickness is substantially equal to the second thickness.

* * * * *

UNITED STATES PATENT AND TRADEMARK OFFICE
CERTIFICATE OF CORRECTION

PATENT NO. : 10,714,478 B2
APPLICATION NO. : 16/532857
DATED : July 14, 2020
INVENTOR(S) : Ho-In Ryu et al.

It is certified that error appears in the above-identified patent and that said Letters Patent is hereby corrected as shown below:

In the Claims

Claim 21 should read:
21. A semiconductor device, comprising:
    a substrate including a cell region and a peripheral region;
    a cell gate electrode buried in a groove crossing a cell active portion of the cell region;
    a cell line pattern crossing over the cell gate electrode, the cell line pattern connected to a first source/drain region in the cell active portion at a side of the cell gate electrode;
    a capping line pattern on a top surface of the cell line pattern, a width of a bottom surface of the capping line pattern being substantially equal to a width of the top surface of the cell line pattern;
    an outermost cell line pattern on the substrate at a side of the cell line pattern, the outermost cell line pattern having a first sidewall adjacent to the cell line pattern and a second sidewall opposite to the first sidewall;
    first cell insulation liners on opposite sidewalls of the cell line pattern;
    a second cell insulation liner having a first thickness on the first sidewall of the outermost cell line pattern;
    a spacer having a second thickness on the second sidewall of the outermost cell line pattern, the second thickness being greater than the first thickness;
    a peripheral gate pattern crossing over a peripheral active portion of the peripheral region;
    a peripheral gate spacer on a sidewall of the peripheral gate pattern, the peripheral gate spacer including a same material as the spacer;
    a capping insulating layer on a top surface of the outermost cell line pattern and a top surface of the peripheral gate pattern, the capping insulating layer having a lateral sidewall aligned with the first sidewall of the outermost cell line pattern; and
    a planarized interlayer insulating layer under the capping insulating layer and between the peripheral gate pattern and the outermost cell line pattern,
    wherein the cell line pattern includes a cell conductive line and a cell hard mask line which are sequentially stacked, the width of the bottom surface of the capping line pattern being substantially equal to a width of a top surface of the cell hard mask line, Signed and Sealed this
Eighth Day of September, 2020

Andrei Iancu
*Director of the United States Patent and Trademark Office*

CERTIFICATE OF CORRECTION (continued)
U.S. Pat. No. 10,714,478 B2 wherein the peripheral gate spacer has a third thickness on a sidewall of the peripheral gate pattern, and the third thickness is substantially equal to the second thickness of the spacer, and wherein the capping insulating layer has a top surface at a same level as the top surface of the second cell insulation liner.

Claim 29 should read:

29. A semiconductor device, comprising:

a substrate including a cell region and a peripheral region;

a cell gate electrode buried in a groove crossing a cell active portion of the cell region;

a cell line pattern crossing over the cell gate electrode;

an outermost cell line pattern on the substrate at a side of the cell line pattern, the outermost cell line pattern having a first sidewall adjacent to the cell line pattern and a second sidewall opposite to the first sidewall;

a cell insulation liner having a first thickness on the first sidewall of the outermost cell line pattern;

a spacer having a second thickness on the second sidewall of the outermost cell line pattern;

a peripheral gate pattern crossing over a peripheral active portion of the peripheral region;

a peripheral gate spacer on a sidewall of the peripheral gate pattern; and a capping insulating layer on a top surface of the outermost cell line pattern and a top surface of the peripheral gate pattern, a top surface of the capping insulating layer being at a substantially same level with a top surface of the cell insulation liner, wherein the peripheral gate spacer includes a same material as the spacer, wherein the peripheral gate spacer has a third thickness on a sidewall of the peripheral gate pattern, and the third thickness is substantially equal to the second thickness of the spacer, wherein the top surface of the capping insulating layer is at a higher level than a top surface of the spacer, and wherein the top surface of the cell insulation liner is at a higher level than the top surface of the spacer.